(12) United States Patent
Goda et al.

(10) Patent No.: US 6,844,590 B2
(45) Date of Patent: Jan. 18, 2005

(54) SEMICONDUCTOR DEVICE WITH TRENCH ISOLATION BETWEEN TWO REGIONS HAVING DIFFERENT GATE INSULATING FILMS

(75) Inventors: Akira Goda, Yokohama (JP); Mitsuhiro Noguchi, Yokohama (JP); Yuji Takeuchi, Yokohama (JP); Michiharu Matsui, Fujisawa (JP); Hiroaki Hazama, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 10/180,328

(22) Filed: Jun. 27, 2002

(65) Prior Publication Data

US 2003/0001225 A1 Jan. 2, 2003

(30) Foreign Application Priority Data

Jun. 28, 2001 (JP) ........................................ 2001-195673

(51) Int. Cl.[7] ............................................ H01L 29/792
(52) U.S. Cl. ........................ 257/326; 257/314; 257/288
(58) Field of Search ................................ 257/314, 326, 257/321, 374, 288; 438/287

(56) References Cited

U.S. PATENT DOCUMENTS 6,020,229 A * 2/2000 Yamane et al. ............ 438/201
6,411,548 B1   6/2002 Sakui et al.

FOREIGN PATENT DOCUMENTS

| JP | 8-330436 | 12/1996 |
|---|---|---|
| JP | 10-163337 | 6/1998 |
| JP | 2001-15505 | 1/2001 |
| JP | 2001-203285 | 7/2001 |

OTHER PUBLICATIONS

U.S. patent application Ser. No. 10/058,946, Gode et al., filed Jan. 30, 2002.
Y. Takeuchi, et al., "A Self–Aligned STI Process Integration for Low Cost and Highly Reliable 1Gbit Flash Memories", VLSI Technology Digest of Technical Papers, 1998, pp. 102–103.

* cited by examiner

Primary Examiner—Richard Elms
Assistant Examiner—Brad Smith
(74) Attorney, Agent, or Firm—Oblon, Spivak, McClelland, Maier & Neustadt, P.C.

(57) ABSTRACT

The major surface of a semiconductor substrate of a semiconductor device includes first and second regions and a boundary area therebetween. A first gate insulating film and a first gate electrode are formed in the first region. A second gate insulating film different from the first gate insulating film and a second gate electrode are formed in the second region. A device isolation region is formed in the boundary area. This device isolation region includes a trench formed in the major surface, and an insulating layer having a portion buried in the trench and a portion projecting upward from the major surface. The bottom of the trench has depths different with portions.

16 Claims, 55 Drawing Sheets

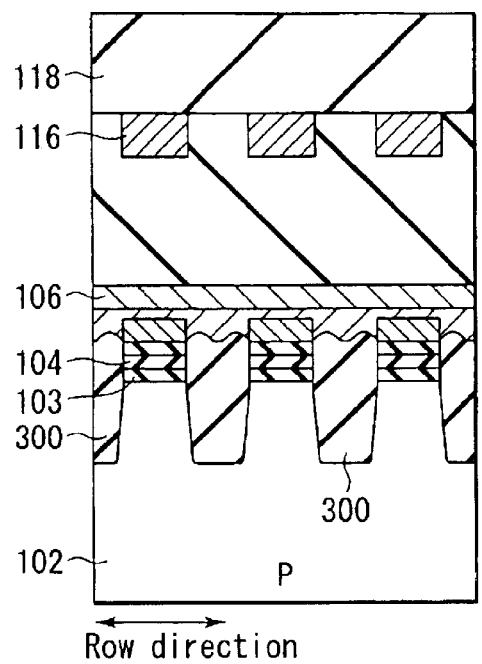
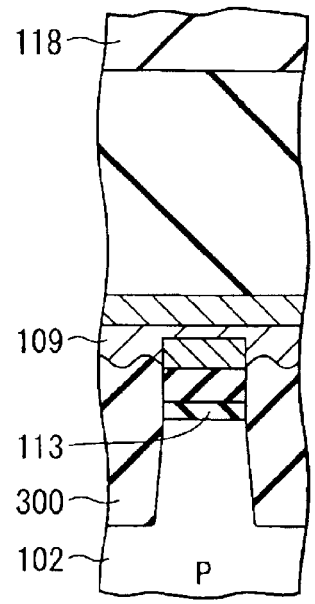
FIG. 41A FIG. 41B
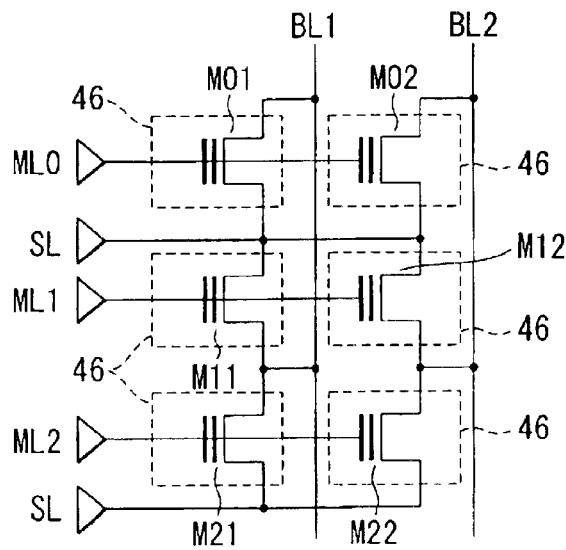
FIG. 42

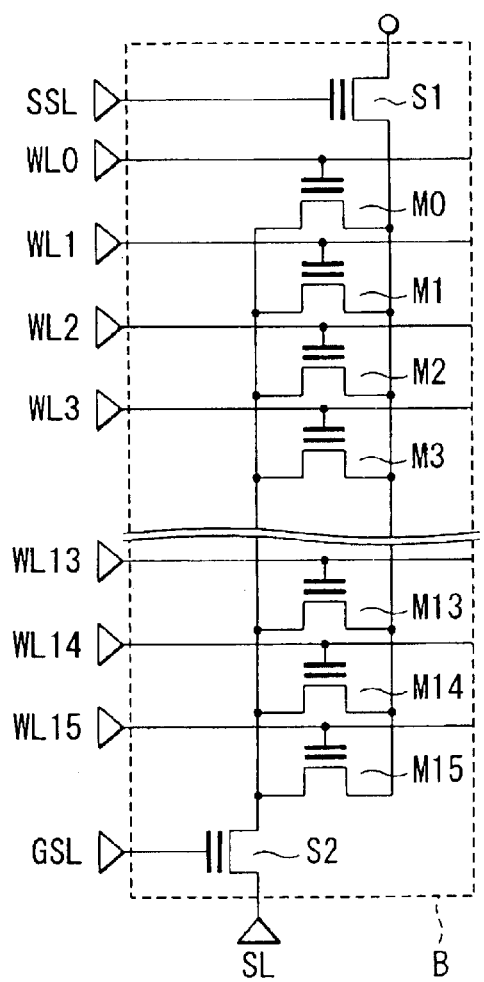 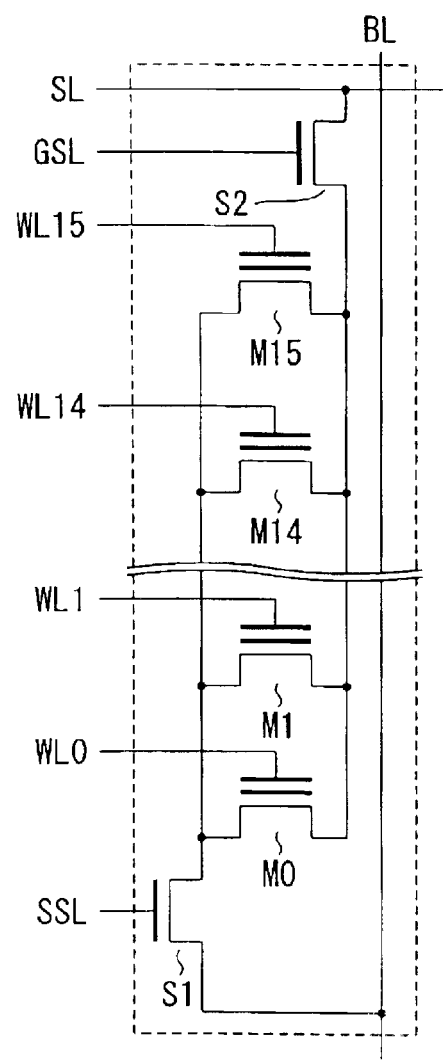
FIG. 43
FIG. 44

Row direction ic # SEMICONDUCTOR DEVICE WITH TRENCH ISOLATION BETWEEN TWO REGIONS HAVING DIFFERENT GATE INSULATING FILMS

CROSS-REFERENCE TO RELATED APPLICATIONS

This application is based upon and claims the benefit of priority from the prior Japanese Patent Application No. 2001-195673, filed Jun. 28, 2001, the entire contents of which are incorporated herein by reference.

BACKGROUND OF THE INVENTION

1. Field of the Invention

The present invention relates to a semiconductor device having a plurality of gate insulating films different in the film material or film thickness and a method of fabricating the same and, more particularly, to a semiconductor device in which gate insulating films are separately formed and a method of fabricating the same.

2. Description of the Related Art

As an electrically erasable and programmable nonvolatile semiconductor memory (EEPROM), a MONOS EEPROM which stores electric charge into a silicon nitride film is known. MONOS represents Metal-Oxide-Nitride-Oxide-Semiconductor, and typically represents metal-silicon oxide film-silicon nitride film-silicon oxide film-semiconductor. In this MONOS EEPROM, a gate insulating film of a memory cell is an ONO stacked film, whereas a transistor forming a peripheral circuit has a MOS structure in which a silicon oxide film is a gate insulating film. Therefore, these two components must be separately formed in the fabrication of a MONOS EEPROM.

In a method of separately forming transistors having different gate insulating films, it is important to satisfy three points: the reliability of the gate insulating films, high performance of a memory cell, and a sufficient process margin.

A method described in Jpn. Pat. Appln. KOKAI Publication No. 8-330436 is a method of separately forming transistors having different gate insulating films. In this prior art, after a device isolation region is formed by LOCOS, two gate oxide films different in film thickness and gate electrodes are formed. Recently, trench device isolation is beginning to be used instead of LOCOS. Compared to LOCOS, trench device isolation can realize a high device isolation breakdown voltage with a very small device isolation width.

A method of separately forming a MONOS memory cell and a MOS peripheral transistor by using trench device isolation shown in FIGS. 60A to 60E will be described below. In this method, gate insulating films and gate electrodes are formed after the formation of device isolation regions, as in the technique described in Jpn. Pat. Appln. KOKAI Publication No. 8-330436 as the prior art described above. Referring to FIGS. 60A to 60E, MC indicates a memory cell region, and PTR indicates a peripheral transistor region.

First, as shown in FIG. 60A, device isolation regions 201 are formed in a semiconductor substrate 200. Next, as shown in FIG. 60B, a sacrificial oxide film is removed by wet etching, and a gate insulating film 202 and a gate electrode 203 of a peripheral circuit transistor are formed. In addition, a peripheral circuit region is covered with a resist layer 204.

As shown in FIG. 60C, the gate electrode and the gate oxide film in a memory cell region are removed. After an ONO film 205 as a gate insulating film of a memory cell is deposited on the entire surface of the semiconductor substrate 200, a memory cell gate electrode 206 is deposited. Subsequently, the memory cell region is covered with a resist layer 207, and the memory cell gate electrode 206 and the ONO film 205 in the peripheral circuit region are removed. Finally, as shown in FIG. 60D, the resist layer 207 is removed. As a consequence, the peripheral MOS transistor and the MONOS memory cell can be separately formed.

Unfortunately, this method has the following problems. The first problem is related to the nonuniformity of the ONO film. That is, since the edges of the device isolation regions are not flat but have steps, it is difficult to deposit the ONO film with a uniform film thickness and uniform film quality. This causes variations in the program characteristic and data holding characteristic of the memory cell.

The second problem is related to a parasitic transistor as shown in FIG. 60E which is an enlarged view of a region TP in FIG. 60D. During wet etching before the formation of the gate insulating film, a buried oxide film in a device isolation trench is partially etched on the edge of the device isolation region. The gate electrode enters this etched portion to form a parasitic transistor. This causes characteristic variations in both the memory cell and the peripheral transistor.

In this prior art, the peripheral transistor is formed first and then the memory cell transistor is formed. However, the above problems are not solved even if the formation order is changed; the problems arise because the gate insulating films are separately formed after the formation of the device isolation regions. A prior art to be explained below solves the above problems by separately forming gate insulating films before device isolation regions are formed.

As a method of solving the above problems, "1998 Symposium on VLSI Technology Digest of Technical Papers, pp. 102–103, "A Self-Aligned STI Process Integration for Low Cost and Highly Reliable 1 Gbit Flash Memories", Y. Takeuchi et al." describes a self-aligned trench device isolation method which forms trench device isolation regions after gate insulating films and gate electrodes are formed. The steps of this fabrication method of separately forming a MONOS cell and a MOS peripheral transistor will be described with reference to FIGS. 61A to 61D.

First, as shown in FIG. 61A, impurity implantation for wells and channels is performed to form a memory cell well 205 and a peripheral circuit well 206. Next, an ONO film 207 and a silicon oxide film 208 are separately formed. A polysilicon gate electrode 209 and a silicon nitride film 210 as a mask are deposited. As shown in FIG. 61B, device isolation trenches 211 are formed in a semiconductor substrate 200. A silicon oxide film 212 is deposited on the exposed surface to fill the device isolation trenches 211.

As shown in FIG. 61C, the silicon oxide film 212 is removed by CMP (Chemical Mechanical Polishing) until the surface of the silicon nitride film 210 as a mask is exposed, thereby planarizing the surface. Subsequently, as shown in FIG. 61D, the silicon nitride film 210 as a mask is removed, and a tungsten silicide layer 213 is deposited. A memory cell isolation region 214, a boundary area device isolation region 215, and a peripheral circuit device isolation region 216 are formed, and the individual gate electrodes are processed. This method solves the problems such as the nonuniformity of the ONO film and the etching of the device isolation oxide film as shown in FIG. 60E.

BRIEF SUMMARY OF THE INVENTION

According to an aspect of the present invention, there is provided a semiconductor device which comprises a semiconductor substrate having a major surface including first and second regions and a boundary area formed between the first and second regions in contact with them, a first gate insulating film formed on the major surface in the first region, a first gate electrode formed on the first gate insulating film, a pair of first diffusion layers formed in the major surface to sandwich the first gate electrode, a second gate insulating film formed on the major surface in the second region, the second gate insulating film having a film material or a film thickness different from that of the first gate insulating film, a second gate electrode formed on the second gate insulating film, a pair of second diffusion layers formed in the major surface to sandwich the second gate electrode, and a device isolation region formed in the boundary area, the device isolation region including a trench formed in the major surface and an insulating layer having a portion buried in the trench and a portion projecting upward from the major surface, and the bottom of the trench having depths different with portions.

BRIEF DESCRIPTION OF THE SEVERAL VIEWS OF THE DRAWING

FIGS. 41A and 41B are sectional views showing a memory cell region and a peripheral transistor region, respectively, of a NAND MONOS semiconductor device of the fourth embodiment;

FIG. 42 is an equivalent circuit diagram showing a NOR MONOS memory cell of the semiconductor device according to the fourth embodiment;

FIGS. 43 and 44 are different equivalent circuit diagrams showing AND MONOS memory cells of the semiconductor device according to the fourth embodiment;

DETAILED DESCRIPTION OF THE INVENTION

In the course of developing the present invention, the present inventors studied the problems of the semiconductor device and its fabrication method as described with reference to FIGS. 61A to 61D. As a consequence, the present inventors obtained the following findings.

Figure 61A:
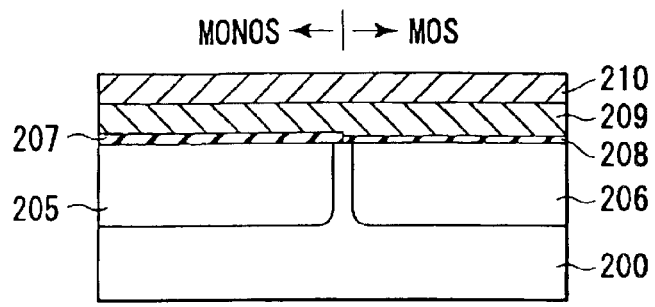
FIGS. 61A to 61D are sectional views showing a conventional self-aligned trench device isolation method.
Figure 61B:
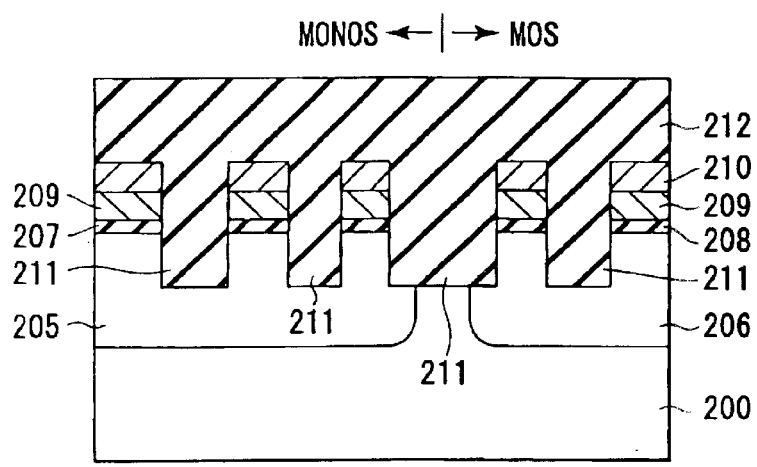
Figure 61C:
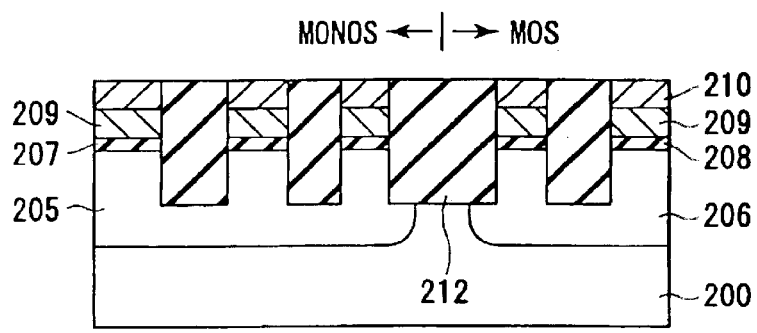
Figure 61D:
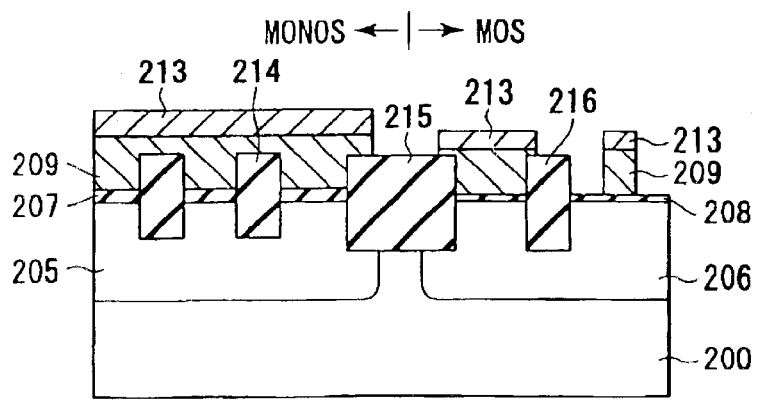

In the semiconductor device shown in FIG. 61D, the trench device isolation depth of the boundary area device isolation region 215 between the MONOS transistor and the MOS transistor is the same as the trench depth of the MONOS region device isolation region 214 and that of the MOS region device isolation region 216. On the other hand, the trench width of the boundary area device isolation region 215 is larger than that of the device isolation regions 214 and 216 in the other transistor regions.

Figure 62A:
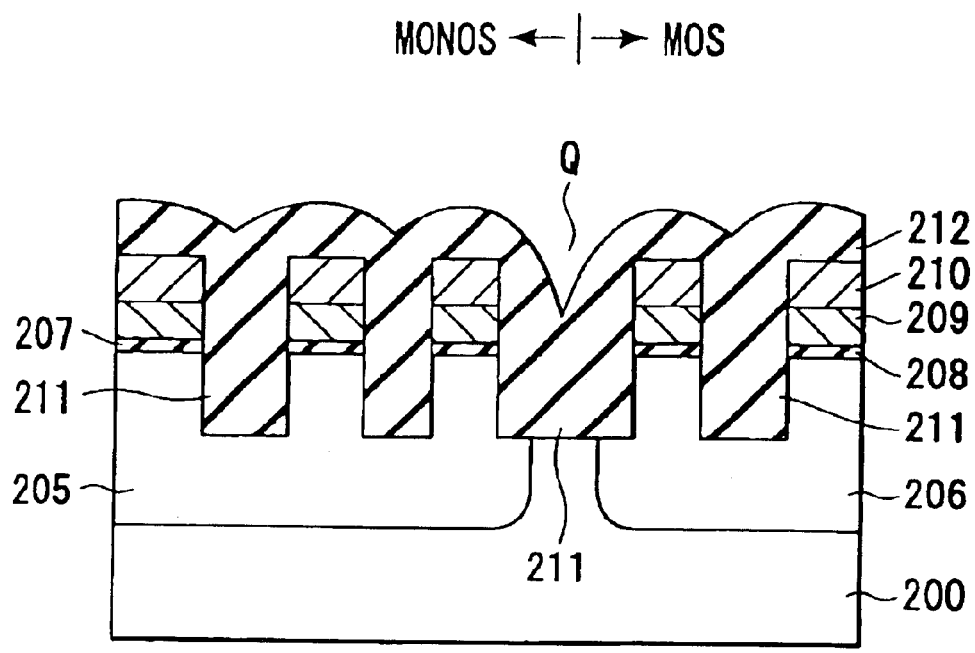
FIGS. 62A and 62B are sectional views for explaining the problems of the method shown in FIGS. 61A to 61D.
Figure 62B:
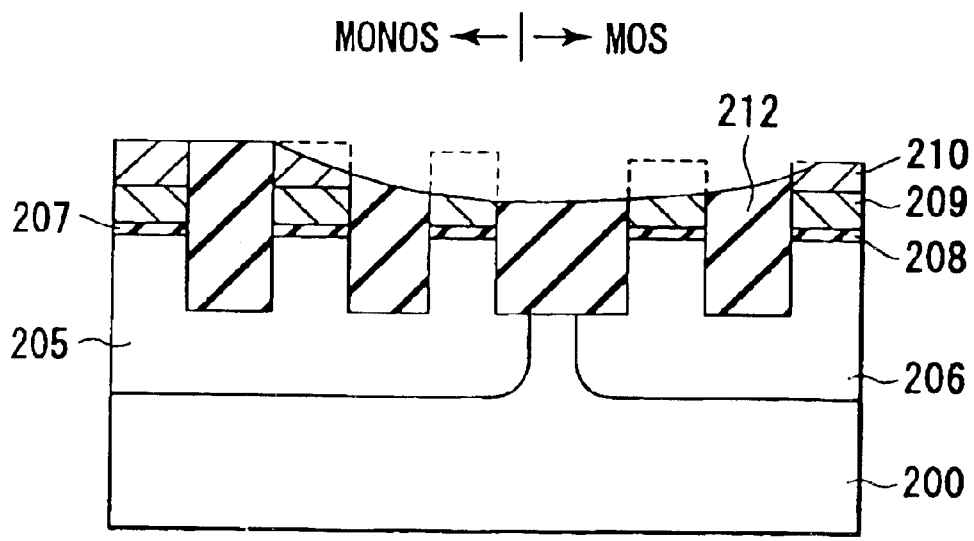

In the trench device isolation regions, after the trenches are filled with an oxide film as shown in FIG. 61B, the buried oxide film is planarized by CMP as shown in FIG. 61C. However, a large trench width in the boundary area poses problems as shown in FIGS. 62A and 62B.

The first problem is the filling properties of the trench. This trench in the boundary area has a large width. If the buried oxide film is thin, therefore, as shown in FIG. 62A, an insufficiently filled region Q is formed in the center of the trench in the boundary area. When wet etching is used in the subsequent step, this insufficiently filled region is largely etched to cause poor filling properties. To solve this problem, a thick buried oxide film must be deposited. However, this increases not only the deposition amount of the oxide film but also the polish amount in the CMP step. Consequently, the process cost increases.

The second problem is the uniformity of CMP. One characteristic feature of CMP is dishing by which a wide space is polished. This dishing easily occurs because the trench in the boundary area is wide. If this is the case, as shown in FIG. 62B, the influence of dishing reaches the transistor regions to deform the gate electrode shapes, thereby lowering the process margin and yield.

Both the above problems arise because the trench in the boundary area is wide although its depth is the same as in the transistor regions. If the width of this trench in the boundary area is decreased to solve the above problems, the device isolation breakdown voltage lowers. Since in this case the breakdown voltage between the wells becomes insufficient, it is difficult to solve the problems by this method. Accordingly, a semiconductor device having two or more different gate insulating films requires a highly reliable device structure and fabrication method by which both a sufficient process margin and satisfactory device performance are achieved.

Embodiments of the present invention constituted on the basis of the above findings will be explained below with reference to the accompanying drawing. In the following explanation, the same reference numerals denote parts having substantially the same functions and arrangements, and a repetitive explanation thereof will be made only where necessary.

(First Embodiment)

Figure 1A:
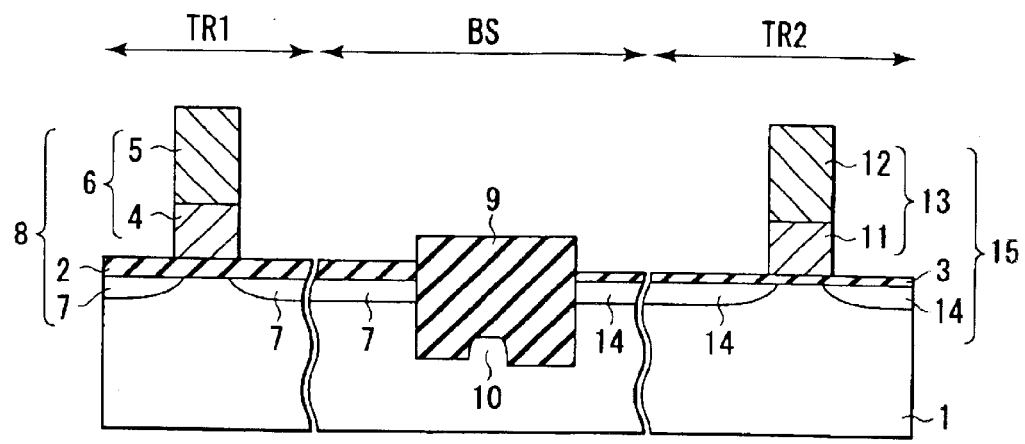
FIG. 1A is a sectional view showing a boundary area and its vicinity of a semiconductor device according to the first embodiment of the present invention.
Figure 1B:
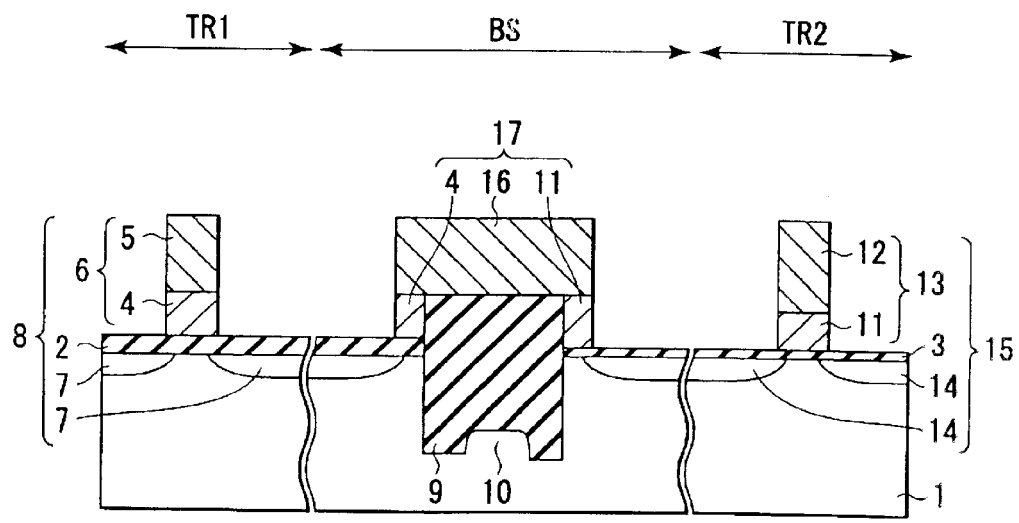
FIGS. 1B, 2A, and 2B are sectional views showing boundary areas and their vicinities of semiconductor devices according to modifications of the first embodiment.
Figure 2A:
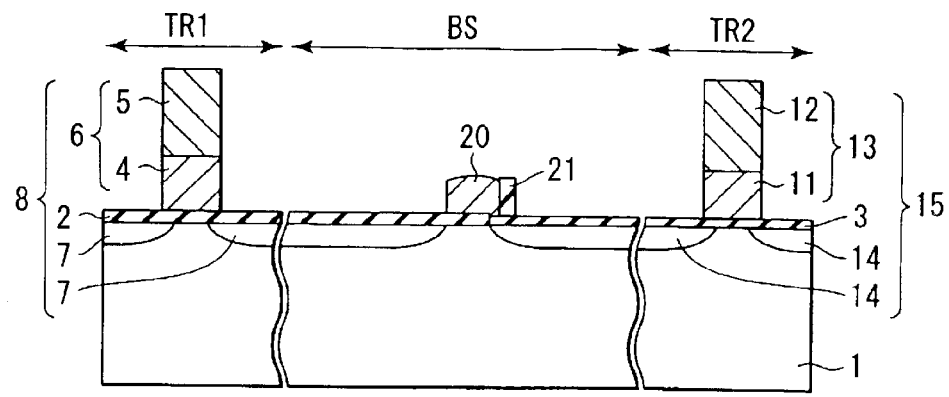
Figure 2B:
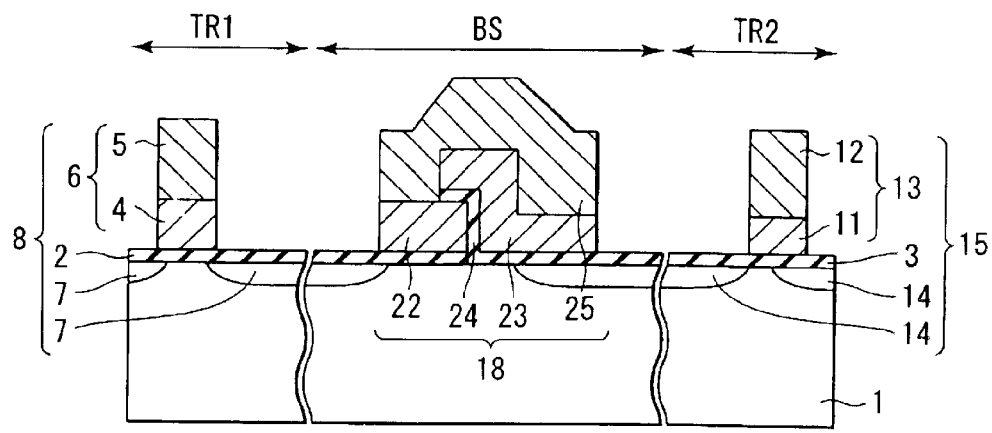

FIG. 1A is a sectional view showing a boundary area and its vicinity of a semiconductor device according to the first embodiment. FIGS. 1B, 2A, and 2B are sectional views showing boundary areas and their vicinities of semiconductor devices according to modifications of the first embodiment. The characteristic feature of this embodiment is that two types of transistors (e.g., first and second transistor regions TR1 and TR2) different in the type of the gate insulating films such as a film material and a film thickness are present on the same semiconductor substrate, and that a boundary area BS between these transistors has a device isolation region shape or electrode structure different from those of these transistors (i.e., the device isolation region shapes or electrode structures in the first and second transistor regions TR1 and TR2). More specifically, the boundary area BS is provided with a trench-type device isolation region having depths different with portions, or an electrode structure having thicknesses different with portions.

The semiconductor memory shown in FIG. 1A has the first and second transistor regions TR1 and TR2 formed on a semiconductor substrate 1, and the boundary area BS formed between these first and second transistor regions TR1 and TR2 in contact with them. When the first transistor region TR1 is a high-voltage transistor region, a gate insulating film 2 formed on the semiconductor substrate 1 is a silicon oxide film about 10 to 40 nm thick. When the second transistor region TR2 is a low-voltage transistor region, a gate insulating film 3 formed on the semiconductor substrate 1 is a silicon oxide film about 1 to 10 nm thick. When the second transistor region TR2 is a memory cell region, this gate insulating film 3 is a silicon oxide film about 1 to 10 nm thick or an ONO film about 10 to 50 nm thick.

In the device shown in FIG. 1A, at least two of the three transistor regions described above are formed adjacent to each other such that the types or film thicknesses of their gate insulating films are different. Note that a well having a conductivity type opposite to that of the semiconductor substrate 1 may be formed near the surface of this semiconductor substrate 1. Furthermore, another well having the same conductivity type as the semiconductor substrate 1 may be formed on the well having the opposite conductivity type (this similarly applies to the rest of the specification).

In the first transistor region TR1, a lower electrode layer 4 is formed on the gate insulating film 2, and an upper electrode layer 5 is formed on this lower electrode layer 4, thereby forming a first gate electrode 6. In the semiconductor substrate 1, a pair of source/drain diffusion layers 7 are formed by implantation using the first gate electrode 6 as a mask. This first gate electrode 6 and the source/drain diffusion layers 7 form a first transistor 8. Both the lower and upper electrode layers 4 and 5 are polysilicon layers or the like.

A trench type device isolation region 9 is formed in the boundary area BS shown in FIG. 1A. On the bottom of the trench of this device isolation region 9, a step having a projection 10 which projects upward is formed. This changes the depth of this trench from one portion to another. The width of the projection 10 in a direction in which the first and second transistor regions TR1 and TR2 are connected is about 100 to 10,000 nm, and desirably, about 100 to 1,000 nm. The height of the projection 10 from the deep portion of the bottom of the trench is about 10 to 300 nm, and desirably, about 30 to 100 nm. This height changes in accordance with the film thicknesses of the gate electrode materials in the adjacent first and second transistor regions TR1 and TR2. Also, the width of the projection 10 which projects upward on the bottom of the device isolation region 9 is determined by taking account of misalignment of lithography in the fabrication process. For example, this width is about 100 to 10,000 nm.

In the second transistor region TR2 adjacent to the boundary area BS, a lower electrode layer 11 is formed on the gate insulating film 3, and an upper electrode layer 12 is formed on this lower electrode layer 11, thereby forming a second gate electrode 13. In the semiconductor substrate 1, a pair of source/drain diffusion layers 14 are formed by implantation using the second gate electrode 13 as a mask. This second gate electrode 13 and the source/drain diffusion layers 14 form a second transistor 15. Both the lower and upper electrode layers 11 and 12 are polysilicon layers or the like. Another device isolation region can also be formed between the device isolation region 9 and each of the left and right transistors 8 and 15.

In the semiconductor memory shown in FIG. 1B, the structures of first and second transistor regions TR1 and TR2 are the same as in FIG. 1A, and the structure of a boundary area BS is different from that shown in FIG. 1A. Around a device isolation region 9, a lower electrode layer 4 is formed on a first gate insulating film 2, and a lower electrode layer 11 is formed on a second gate insulating film 3. In addition, an upper electrode layer 16 is formed on the device isolation region 9 and on the lower electrode layers 4 and 11 around this device isolation region 9, thereby forming a gate structure 17.

In this configuration, the gate structure 17 is desirably electrically insulated from gate electrodes 6 and 13 in the first and second transistor regions TR1 and TR2, respectively. Another device isolation region can also be formed between the device isolation region 9 and each of left and right transistors 8 and 15.

The structures shown in FIGS. 1A and 1B are characterized in that the bottom of the trench in the device isolation region 9 in the boundary area BS has a step, particularly, the projection 10 which projects upward. Additionally, the depth of the trench in this device isolation region 9 on the side of the first transistor region TR1 differs from that on the side of the second transistor region TR2.

In these structures shown in FIGS. 1A and 1B, the device isolation depth decreases in the center of the device isolation region 9. Accordingly, good filling properties are obtained, and the fabrication yield improves. One reason is that in the step of filling the device isolation trench formed in the semiconductor substrate with an insulator, the filling aspect ratio decreases, and this improves the filling properties. Another reason is that in the step of filling the device isolation trench with an insulator, a degree to which a recess is formed in the upper surface in the center of the device isolation region decreases, and this prevents dishing when the upper surface of the insulator is planarized to a predetermined depth and removed.

Furthermore, the gate structure 17 on the device isolation region 9 shown in FIG. 1B is easily processed, because this gate structure 17 is the same as the gate structures in the first and second transistor regions TR1 and TR2.

In the semiconductor memory shown in FIG. 2A, the structures of first and second transistor regions TR1 and TR2 are the same as in FIGS. 1A and 1B, and the structure of a boundary area BS is different from those shown in FIGS. 1A and 1B. In this boundary area BS, a first gate insulating film 2 is formed from the first transistor region TR1 to the center, and a second gate insulating film 3 is formed from the second transistor region TR2 to the center. Also, in the boundary area BS, an electrode layer 20 made of the same material as a lower electrode layer 4 is formed on the upper surface of a portion of the first gate insulating film 2 and on the upper surface of a portion of the second gate insulating film 3. On that side surface of this electrode layer 20 which faces the second transistor region TR2, a side-wall insulating film 21 made of the same material as the second gate insulating film 3 is formed. The height of the electrode layer 20 in the boundary area BS is smaller than that of the lower electrode layer 4 in the first transistor region TR1 and that of a lower electrode layer 11 in the second transistor region TR2.

If necessary for well isolation or the like, a device isolation region is formed between the boundary area BS and each of the first and second transistor regions TR1 and TR2.

In this shape, the gate electrode layers in the transistor regions are partially left behind in the boundary area BS. This improves the gate processing margins in the transistor regions. This gate processing margin improving effect is particularly notable when fine memory cell transistors are to be formed in these transistor regions. This shape is also readily processed since no device isolation region having a special shape as shown in FIGS. 1A and 1B is formed.

Furthermore, the semiconductor substrate is not etched in the boundary area BS, and the electrode layer in the boundary area BS is not removed. Therefore, the film thickness of the electrode layer to be etched is the same as the gate electrode film thickness of the transistor. This eliminates a lowering of the yield caused by processing of the boundary area BS.

In the semiconductor memory shown in FIG. 2B, the structures of first and second transistor regions TR1 and TR2 are the same as in FIGS. 1A and 1B, and the structure of a boundary area BS is different from those shown in FIGS. 1A and 1B. As in the structure of FIG. 2A, in this boundary area BS, a first gate insulating film 2 formed from the first transistor region TR1 to the center, and a second gate insulating film 3 is formed from the second transistor region TR2 to the center. Also, in the boundary area BS, a first electrode layer 22 made of the same material as a lower electrode layer 4 is formed on the first gate insulating film 2. Additionally, in the boundary area BS, a horizontal portion of a second electrode layer 23 is formed on the second gate insulating film 3 so as to be adjacent to the first electrode layer 22 via an insulating film 24. This second electrode layer 23 is made of the same material and has the same film thickness as a lower electrode layer 11.

The film thickness of the insulating film 24 is the same as the second gate insulating film 3. In the boundary area BS, the second electrode layer 23 has a vertical portion stacked on its horizontal portion, and has a stacked portion extending from this vertical portion toward the first transistor region TR1. That is, the second electrode layer 23 is stacked on a portion of the first electrode layer 22 via the insulating film 24. Furthermore, a stacked electrode layer 25 is formed on the first and second electrode layers 22 and 23. A gate structure 18 is formed by the first electrode layer 22, the second electrode layer 23, the insulating film 24, and the stacked electrode layer 25. In the boundary area BS, therefore, the gate structure 18 is formed to be higher than the transistors formed in the first and second transistor regions TR1 and TR2.

This semiconductor memory shown in FIG. 2B is characterized in that the gate structure has a stacked structure in the boundary area BS as described above. In this portion, the first gate insulating film 2 and the first electrode layer 22 having the same film thickness and composition as the lower electrode layer 4 are stacked on a semiconductor substrate 1. On top of this stacked structure, the second electrode layer 23 having the same film thickness and composition as the lower electrode layer 11 is stacked via the insulating film 24 having the same film thickness and composition as the second gate insulating film. Also, both the first and second gate insulating films 2 and 3 are present below the first and second electrode layers 22 and 23 electrically connected to each other.

In this structure shown in FIG. 2B, the width of the gate structure 18 is, e.g., about 100 to 10,000 nm, and desirably, about 500 to 1,000 nm. In the boundary area BS, the height of the highest portion of the gate structure 18 is the sum of the height of a second transistor 15 in the second transistor region TR2, the height of the lower electrode layer 4, and the height of the first gate insulating film 2.

If necessary for well isolation or the like, a device isolation region is formed between the boundary area BS and each of the first and second transistor regions TR1 and TR2.

By the use of this structure, a plurality of transistors can be formed on the same semiconductor substrate with a few fabrication steps.

In addition, the semiconductor substrate is not etched in the boundary area BS, and the stacked gate in the boundary area BS is not processed. Therefore, the film thickness of the electrode layer to be etched is the same as the gate electrode film thickness of the transistor. This eliminates a lowering of the yield caused by processing of the boundary area BS. In particular, the structure shown in FIG. 2B improves the yield since the gate electrode having the stacked structure in the boundary area BS need not be etched.

Figure 3A:
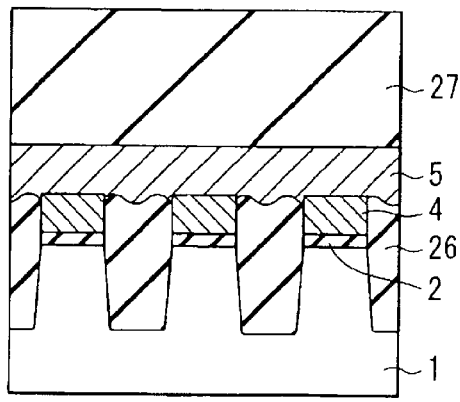
FIGS. 3A and 3B are sectional views showing, in the extending direction, the gate electrodes of first and second transistor regions, respectively, in the first embodiment.
Figure 3B:
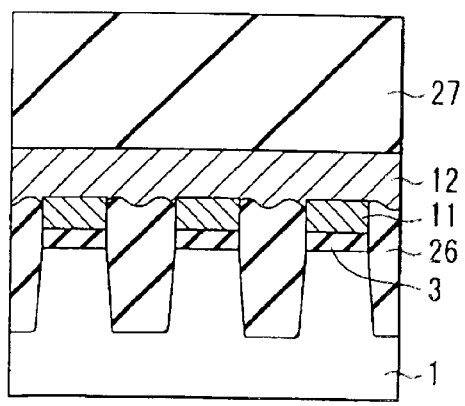

FIGS. 3A and 3B are sectional views showing, in the gate electrode extending direction, first and second transistor regions TR1 and TR2, respectively, according to this embodiment.

As shown in FIG. 3A, in the first transistor region TR1 a plurality of device isolation regions 26 are formed in a semiconductor substrate 1. A lower electrode layer 4 is formed between the device isolation regions 26. An upper electrode layer 5 is formed on the lower electrode layer 4. On this upper electrode layer 5, an interlayer dielectric film 27 not shown in FIGS. 1A, 1B, 2A, and 2B is formed.

As shown in FIG. 3B, in the second transistor region TR2 a plurality of device isolation regions 26 are formed in a semiconductor substrate 1. A lower electrode layer 11 is formed between the device isolation regions 26. An upper electrode layer 12 is formed on the lower electrode layer 11. On this upper electrode layer 12, an interlayer dielectric film 27 not shown in FIGS. 1A, 1B, 2A, and 2B is formed.

In this embodiment as shown in FIGS. 3A and 3B, the device isolation regions are formed to be self-aligned with the gate electrodes. Therefore, on the edge of each device isolation region, the gate electrode does not fall to the side surface of the gate insulating film, unlike in the prior art explained previously. This prevents the formation of a parasitic transistor on the edges of the device isolation regions, and improves the performance of the transistors.

Also, this embodiment uses a process (to be referred to as a self-aligned STI process hereinafter) which forms gate insulating films before the formation of device isolation trenches, and forms device isolation trenches to be self-aligned with the gate electrodes and gate insulating films. This reduces the number of fabrication steps because the process has no steps of depositing and removing dummy insulating films and dummy gates for forming device isolation regions. Also, the fabrication process of this embodiment has no step of directly coating the gate insulating films with a photoresist. This can improve the reliability of these gate insulating films.

Examples of a semiconductor device fabrication method according to this embodiment will be described below. First, a method of fabricating the structure shown in FIG. 1A will be explained with reference to FIGS. 4A to 8.

Figure 4A:
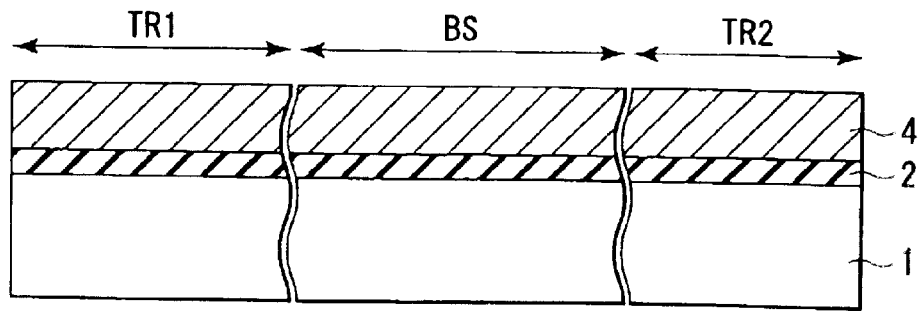
FIGS. 4A to 4C, 5A to 5C, 6A to 6C, 7A to 7C, and 8 are sectional views showing a method of fabricating the structure shown in FIG. 1A.

As shown in FIG. 4A, a sacrificial oxide film (not shown) is formed on the upper surface of a semiconductor substrate 1. Next, a well impurity and a channel impurity are implanted as needed, and the sacrificial oxide film is removed. Subsequently, a first gate insulating film 2 such as a silicon oxide film or silicon nitride film and a lower electrode layer 4 made of, e.g., polysilicon are formed on the semiconductor substrate 1.

Figure 4B:
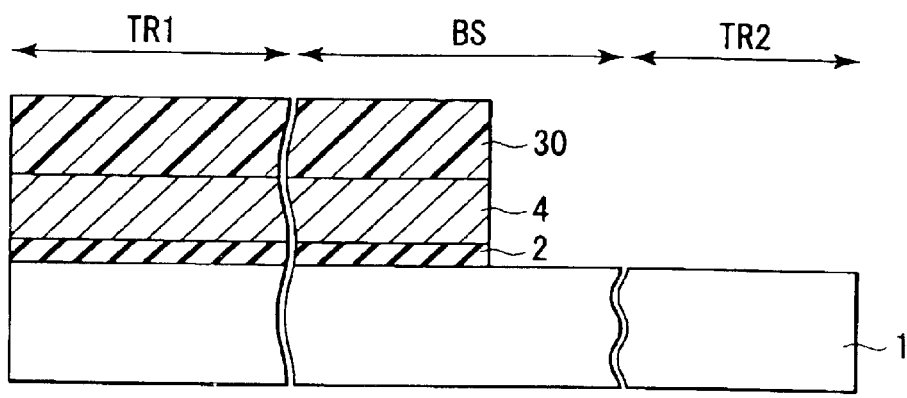

As shown in FIG. 4B, a first transistor region TR1 and a region from this first transistor region TR1 to the center of a boundary area BS are covered with a photoresist layer 30, and the gate electrode layer and the gate insulating film in other regions are removed. The method of removal can be either isotropic etching such as wet etching or anisotropic etching such as RIE.

Figure 4C:
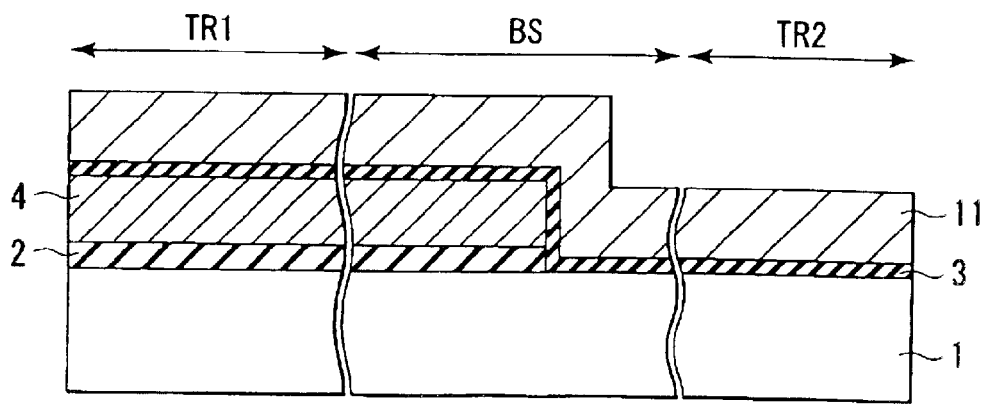

As shown in FIG. 4C, after the photoresist layer 30 is removed, a second gate insulating film 3 such as a silicon oxide film or silicon nitride film and a lower electrode layer 11 made of, e.g., polysilicon are formed on the entire surface of the semiconductor substrate 1. Consequently, a stacked structure in which the second gate insulating film 3 and the lower electrode layer 11 are formed on the lower electrode layer 4 is obtained in the first transistor region TR1. The material and film thickness of the lower electrode layer 4 in the first transistor region TR1 can be different from those of the lower electrode layer 11 in a second transistor region TR2. However, if the materials and film thicknesses of these layers are the same, gate electrodes are readily etched at the same time in the subsequent step.

Figure 5A:
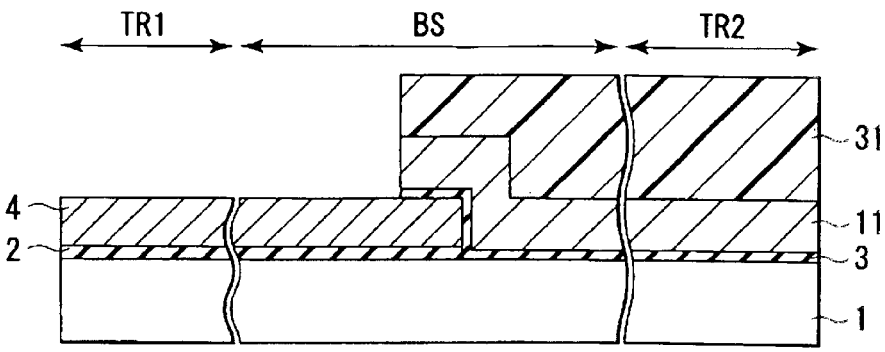

Next, as shown in FIG. 5A, the second transistor region TR2 and a region from this second transistor region TR2 to the center of the boundary area BS are covered with a photoresist layer 31, and the gate electrode layer and the gate insulating film in other regions are removed. The method of removal can be either isotropic etching such as wet etching or anisotropic etching such as RIE. Etching is so performed that a portion of the photoresist layer 31 overlaps the edge of the remaining lower electrode layer 4. The edges of the photoresist layers 30 and 31 overlap or do not overlap depending on misalignment. In this embodiment, however, assume that the edges of these layers overlap. That is, the gate electrode stacked structure remains in the boundary area BS of separate formation between the first and second transistor regions TR1 and TR2.

Figure 5B:
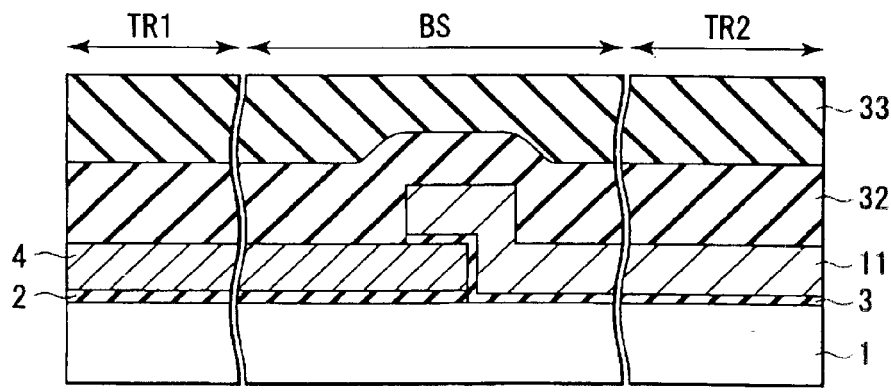
Figure 5C:
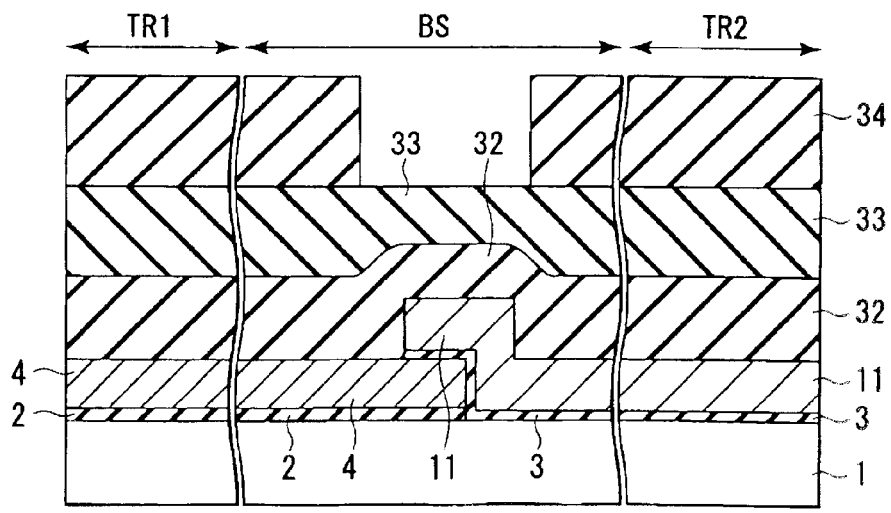

As shown in FIG. 5B, the photoresist layer 31 is removed, and first and second mask layers 32 and 33 are deposited. The first mask layer 32 is, e.g., a silicon nitride film, and the second mask layer 33 is, e.g., a silicon oxide film. Subsequently, as shown in FIG. 5C, a photoresist layer 34 for forming a device isolation region is deposited on the second mask layer 33, and a device isolation pattern is formed. This photoresist layer 34 is positioned above portions where no device isolation region is formed.

Figure 6A:
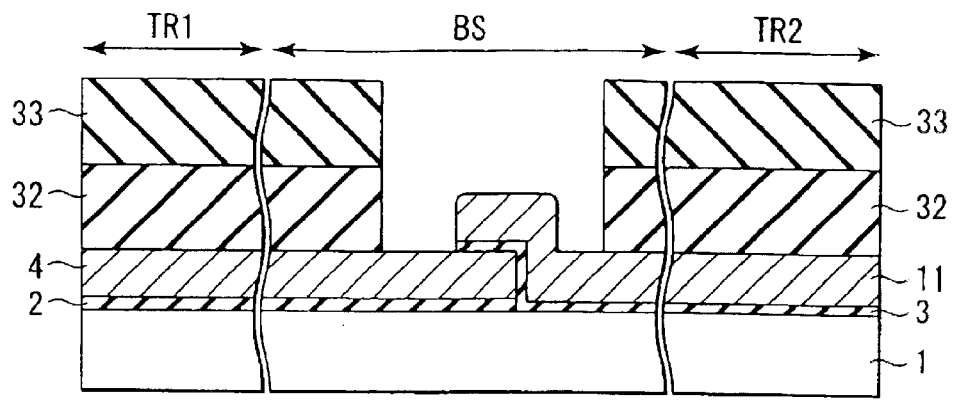
Figure 6B:
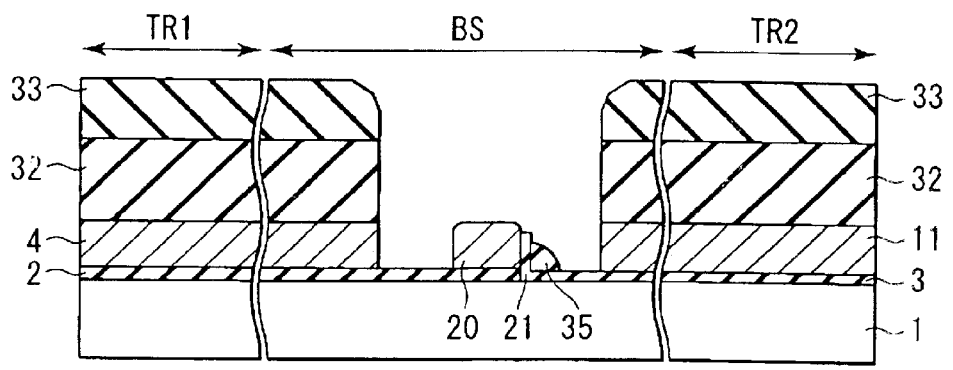

As shown in FIG. 6A, the first and second mask layers 32 and 33 are removed by anisotropic etching to expose those portions of the lower electrode layers 4 and 11, which correspond to a device isolation region in the boundary area BS. As shown in FIG. 6B, the lower electrode layers 4 and 11 exposed from the second mask layer 33 are removed by anisotropic etching.

In that portion of the boundary area BS of separate formation, which corresponds to a device isolation region, the two lower electrode layers are stacked before etching. Therefore, only the lower electrode layer 11 is etched. The lower electrode layer 4 remains as an electrode layer 20 on the semiconductor substrate 1. Also, in the boundary area BS the second gate insulating film 3 remains as a side-wall insulating film 21. In addition, from this side-wall insulating film 21 toward the second transistor region TR2, the lower electrode layer 11 remains as a residual film 35 such that the film thickness reduces in the direction away from the boundary area BS.

Figure 6C:
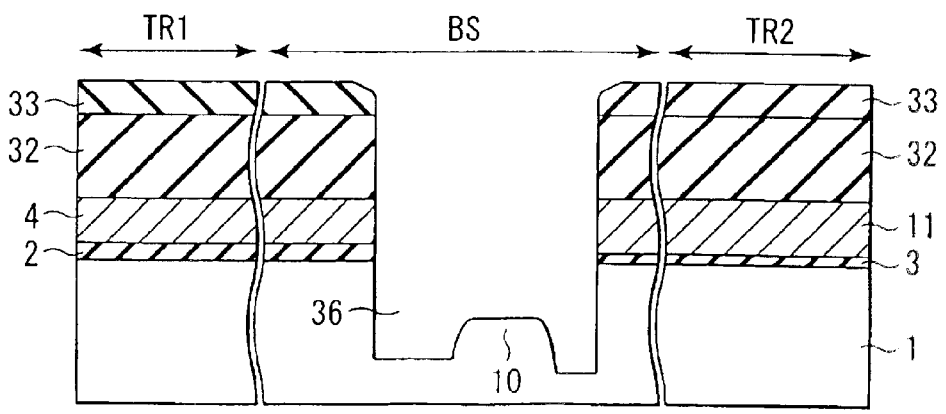

As shown in FIG. 6C, the semiconductor substrate 1 is etched to form a device isolation region. The depth of a trench 36 formed as a device isolation region in the semiconductor substrate 1 is about 50 to 300 nm, and desirably, about 150 to 250 nm. In the boundary area BS of separate formation, a step made up of the electrode layer 20, the insulating film 21, and the residual film 35 forms a projection 10 on the bottom of the trench 36. The step amount of this projection 10 depends upon the film thickness of the electrode layer 20 remaining in FIG. 6B and the etching conditions. For example, this step amount is about 10 to 300 nm, and desirably, about 30 to 100 nm.

Also, the depth of the bottom of the trench 36 on the side of the first transistor region TR1 differs from that on the side of the second transistor region TR2. This depth reflects the difference between the film thicknesses of the first and second gate insulating films 2 and 3; the thinner the gate insulating film, the deeper the trench. In this embodiment, the depth of the bottom of the trench 36 on the side of the first transistor region TR1 is smaller than that on the side of the second transistor region TR2 by about 5 to 50 nm, and desirably, about 10 to 30 nm. This is so because the thickness of the first gate insulating film 2 is larger than that of the second gate insulating film 3 by about 5 to 50 nm, and desirably, about 10 to 30 nm. At this time, trenches for the device isolation regions 26 (see FIGS. 3A and 3B) are formed together in the first and second transistor regions TR1 and TR2, by etching the substrate 1 in the first and second transistor regions TR1 and TR2 to be self-aligned with the first and second lower electrode layers 4 and 11, respectively.

Figure 7A:
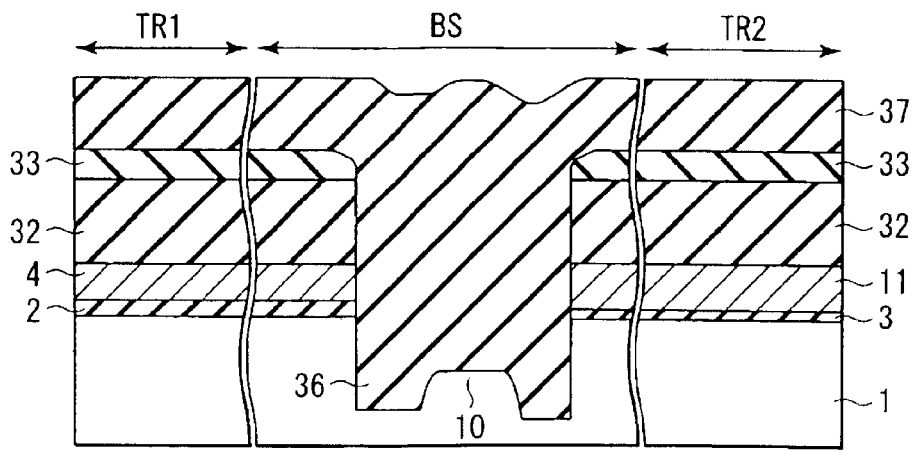
Figure 7B:
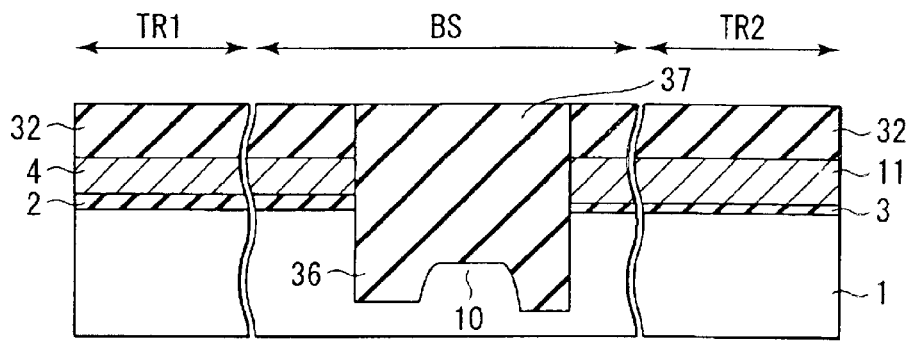

As shown in FIG. 7A, an insulator 37 such as a silicon oxide film is buried in the trench 36 in the boundary area BS and the trenches in the first and second transistor regions TR1 and TR2, and deposited on the second mask layer 33. In the boundary area BS, the filling properties are good because the device isolation depth is small. Subsequently, as shown in FIG. 7B, the first mask layer 32 is used as a stopper to etch back the insulator 37 by a method such as CMP. After this etch back, the upper portion of the insulator 37 is almost flat.

Figure 7C:
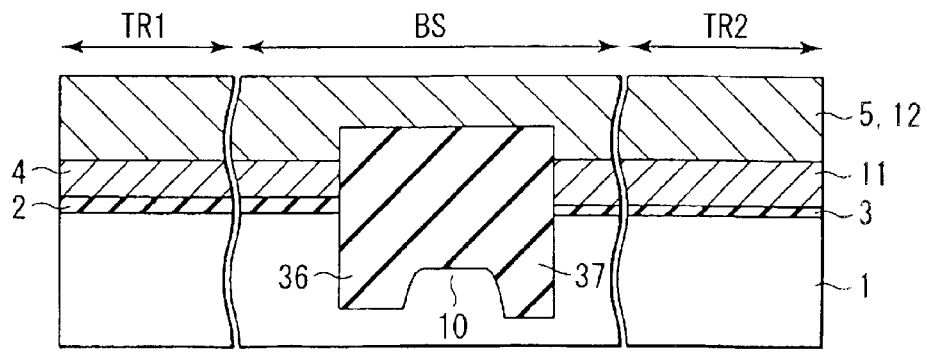
Figure 8:
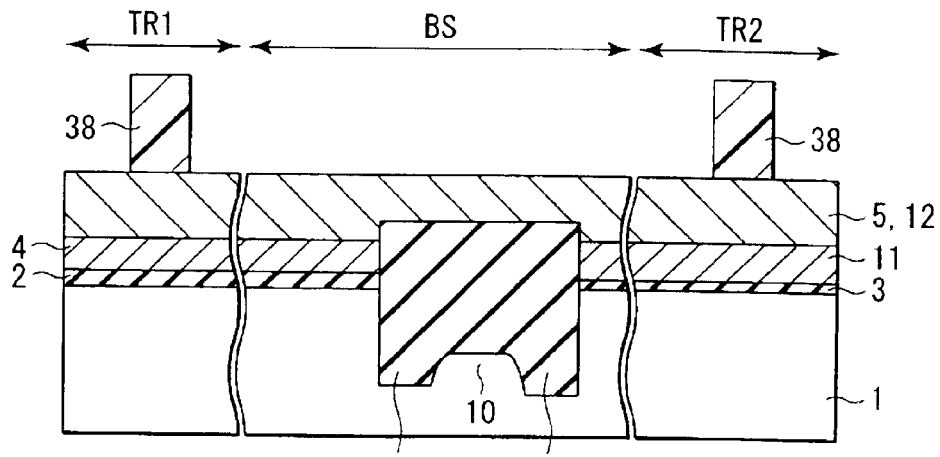

As shown in FIG. 7C, the first mask layer 32 is removed, and an upper electrode layer 5 (12) is deposited on the entire exposed surface of the semiconductor substrate 1. This upper electrode layer 5 (12) is a polysilicon film, a multi-layered film of polysilicon and a metal or a silicon and metal compound, or a single-layered film of a metal or a silicon and metal compound. Next, as shown in FIG. 8, a photoresist 38 for processing the gate electrode layers is deposited and patterned so as not to remain in the boundary area BS. Therefore, the gate electrode layers in this boundary area BS are removed in the later step.

Subsequently, as shown in FIG. 1A, the photoresist layer 38 is used as a mask to anisotropically etch the gate electrode layers, thereby forming first and second gate electrodes 6 and 13 and a device isolation region 9. After that, damage by the processing is recovered by post-oxidation or the like. The first and second gate electrodes 6 and 13 are then used as masks to implant a diffusion layer impurity into the semiconductor substrate 1, thereby forming source/drain diffusion layers 7 and 14. Note that it is also possible to deposit a mask layer such as a silicon nitride film or silicon oxide film on the gate electrode layers and process the gate electrode layers by using this mask layer.

After that, although not shown, interlayer dielectric films, contact plugs, interconnections, and the like are formed to complete the semiconductor device. When a device isolation region is formed in the boundary area BS as described above, a step remains on the bottom of this device isolation region as shown in FIG. 1A.

A method of fabricating the structure shown in FIG. 1B will be described below. Until the step shown in FIG. 7C, this fabrication method is the same as the fabrication method of the structure shown in FIG. 1A.

Figure 9:
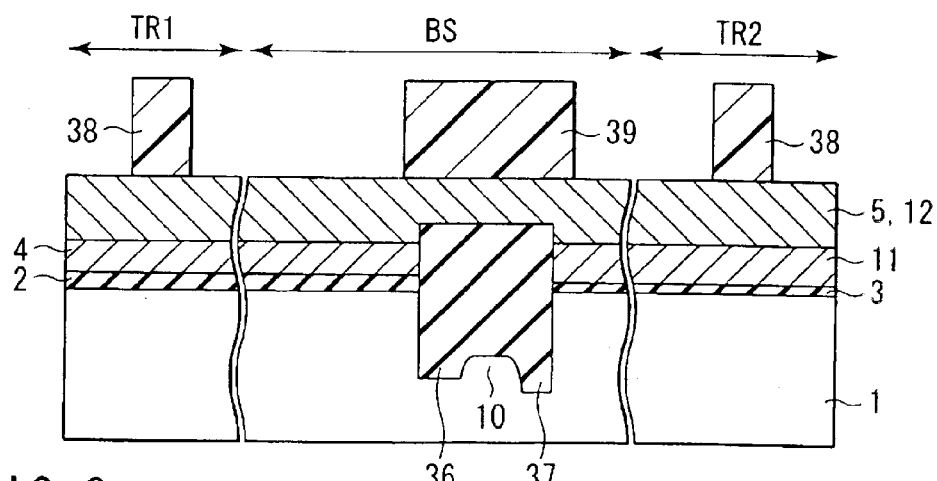
FIG. 9 is a sectional view showing a method of fabricating the structure shown in FIG. 1B.

Next, as shown in FIG. 9, a photoresist layer 38 for processing gate electrode layers and a photoresist layer 39 for forming electrode layers on a device isolation region are deposited and patterned. The photoresist layer 39 is so formed as to have a width larger than the width of an insulator 37 in the horizontal direction in FIG. 9, i.e., to have a width enough to allow gate electrode layers to remain on the side surfaces of the insulator 37 after etching.

As shown in FIG. 1B, these photoresist layers 38 and 39 are used as masks to anisotropically etch the gate electrode layers, thereby forming first and second gate electrodes 6 and 13, a gate structure 17, and a device isolation region 9. After that, damage by the processing is recovered by post-oxidation or the like. The first and second gate electrodes 6 and 13 are then used as masks to implant a diffusion layer impurity into the semiconductor substrate 1, thereby forming source/drain diffusion layers 7 and 14. Note that it is also possible to deposit a mask layer such as a silicon nitride film or silicon oxide film on the gate electrode layers and process the gate electrode layers by using this mask layer.

After that, although not shown, interlayer dielectric films, contact plugs, interconnections, and the like are formed to complete the semiconductor device. When the boundary area BS has a device isolation region as described above, a step remains on the bottom of this device isolation region as shown in FIG. 1B.

A method of fabricating the structure shown in FIG. 2A will be described below. Until the step shown in FIG. 5B, this fabrication method is the same as the fabrication method of the structure shown in FIG. 1A.

Figure 10A:
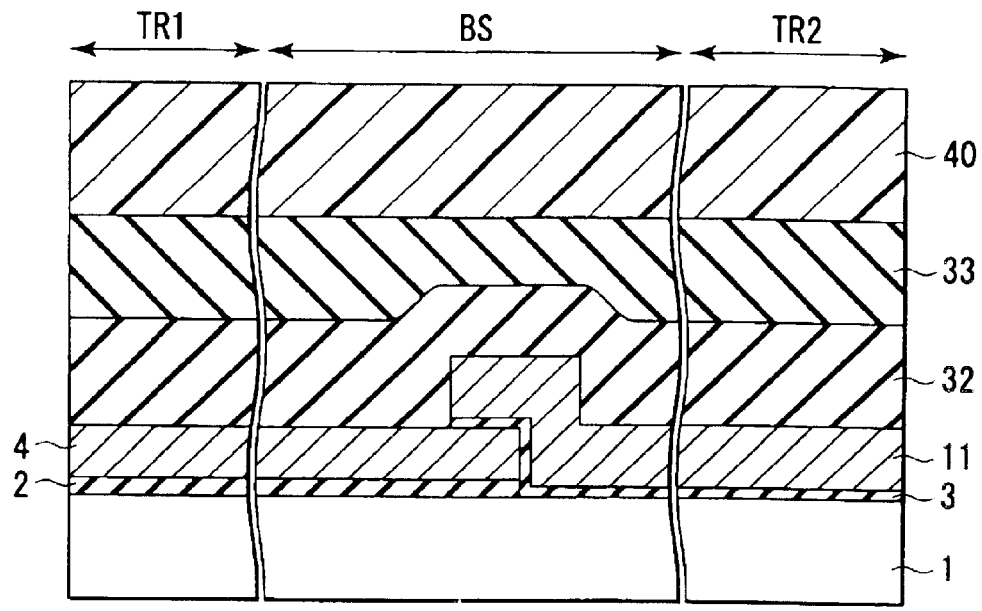
FIGS. 10A and 10B, 11A and 11B, and 12A and 12B are sectional views showing a method of fabricating the structure shown in FIG. 2A.
Figure 10B:
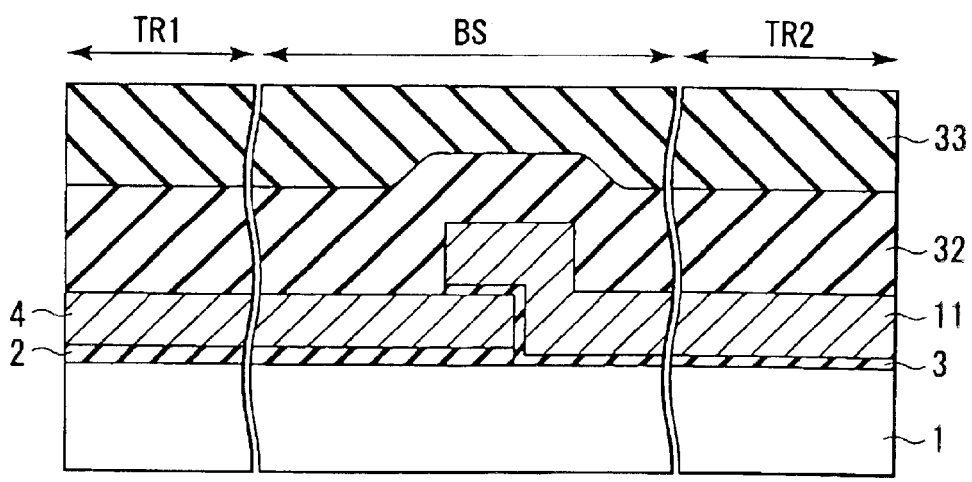

Next, as shown in FIG. 10A, a photoresist layer 40 for device isolation is deposited on a second mask layer 33. In this manner, the photoresist is left behind in a boundary area BS of separate formation, so no device isolation region is formed in that portion. After the second mask layer 33 is anisotropically etched, as shown in FIG. 10B, the photoresist layer 40 is removed to expose the second mask layer 33. At this time, although not shown, there are etched portions in the second mask layer 33 in the first and second transistor regions TR1 and TR2.

Figure 11A:
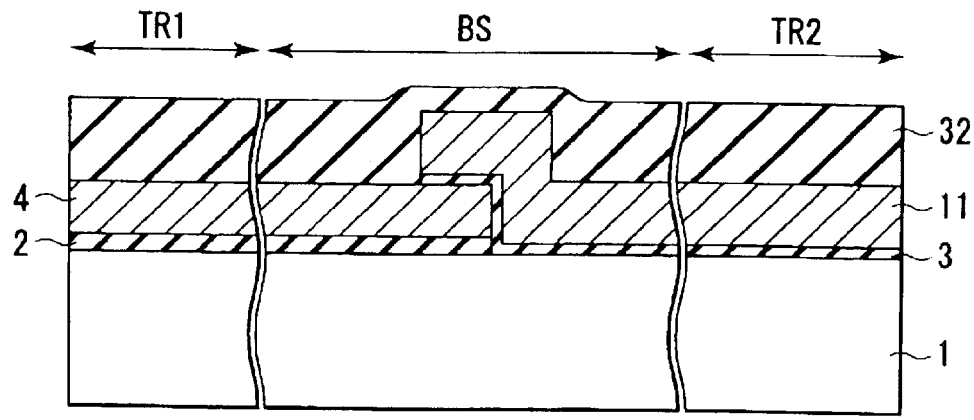
Figure 11B:
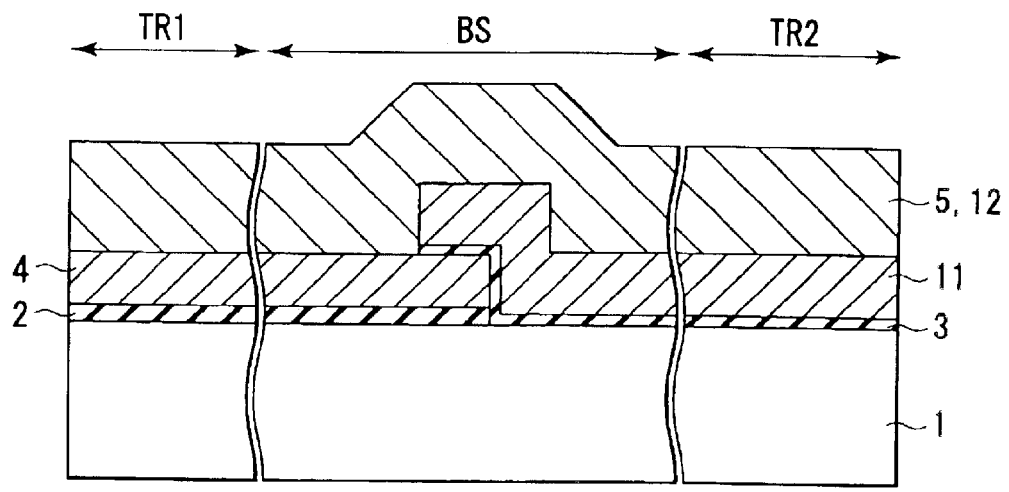

Next, using the steps of FIGS. 6B to 7B, the device isolation regions 26 (see FIGS. 3A and 3B) are formed in the first and second transistor regions TR1 and TR2. The shape of the boundary area BS at this time is shown in FIG. 11A. Subsequently, as shown in FIG. 11B, the first mask layer 32 is removed, an upper electrode layer 5 (12) is formed on exposed lower electrode layers 4 and 11. Since the boundary area BS is covered with the resist as described above, the stacked structure of the gate electrode layers remains as it is.

Figure 12A:
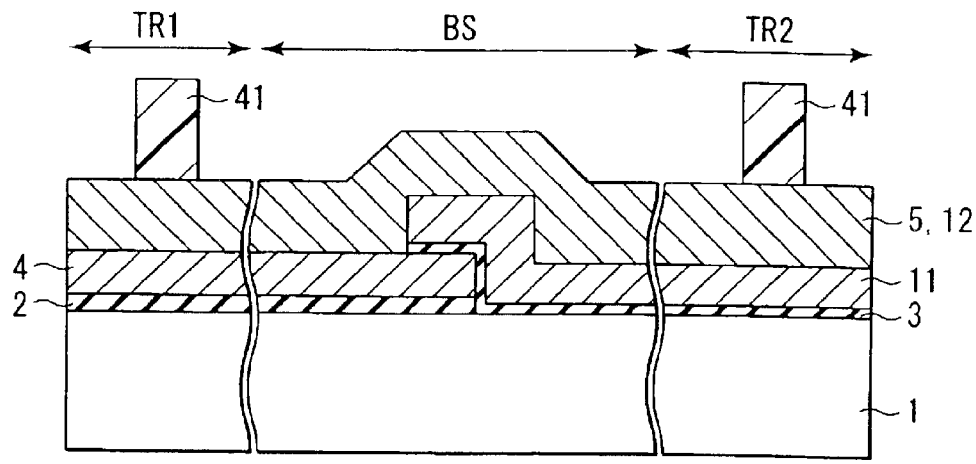
Figure 12B:
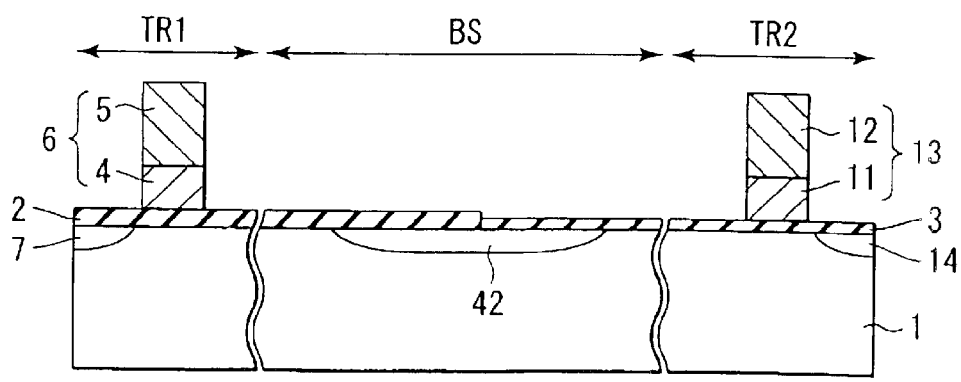

As shown in FIG. 12A, a photoresist layer 41 for processing gate electrode layers is deposited and patterned. As shown in FIG. 12B, this photoresist layer 41 is used as a mask to anisotropically etch the gate electrode layers, thereby forming first and second gate electrodes 6 and 13. After that, damage by the processing is recovered by post-oxidation or the like. The first and second gate electrodes 6 and 13 are then used as masks to implant a diffusion layer impurity into a semiconductor substrate 1, thereby forming source/drain diffusion layers 7 and 14 and a diffusion layer 42 in the boundary area BS. Note that it is also possible to deposit a mask layer such as a silicon nitride film or silicon oxide film on the gate electrode layers and process the gate electrode layers by using this mask layer.

After that, although not shown, interlayer dielectric films, contact plugs, interconnections, and the like are formed to complete the semiconductor device. When no device isolation region is formed in the boundary area BS and the gate electrode layers are removed from that portion as described above, the result is a shape as shown in FIG. 12B.

If, however, an etching residue is produced because the gate electrode layers have a stacked structure in the boundary area BS, the result is the shape shown in FIG. 2A. That is, the first and second gate electrodes 6 and 13, an electrode layer 20, and a side-wall insulating film 21 are used as masks to implant an diffusion layer impurity into the semiconductor substrate 1, thereby forming source/drain diffusion layers 7 and 14. Even in this case, there is no problem such as a gate electrode short circuit. In addition, the etching time can be made shorter than that when the gate electrodes in the boundary area BS are completely removed. Furthermore, since the etching conditions need be optimized in accordance only with the transistor regions, the total processing margin improves.

A method of fabricating the structure shown in FIG. 2B will be described below. Until the step shown in FIG. 11B, this fabrication method is the same as the fabrication method of the structure shown in FIG. 1A.

Figure 13:
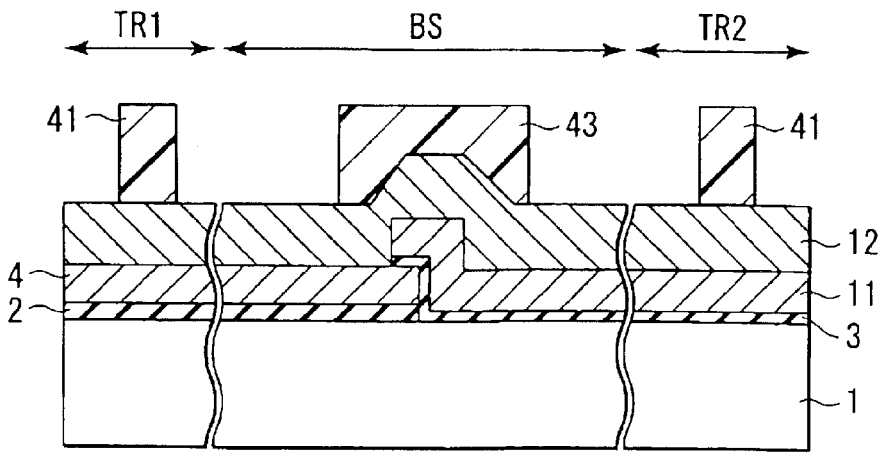
FIG. 13 is a sectional view showing a method of fabricating the structure shown in FIG. 2B.

Next, as shown in FIG. 13, a photoresist layer 41 for processing gate electrode layers and a photoresist layer 43 for forming a gate structure 18 in a boundary area BS are deposited and patterned. As shown in FIG. 2B, these photoresist layers 41 and 43 are used as masks to anisotropically etch the gate electrode layers, thereby forming first and second gate electrodes 6 and 13 and the gate structure 18. After that, damage by the processing is recovered by post-oxidation or the like. The first and second gate electrodes 6 and 13 and the gate structure 18 are then used as masks to implant a diffusion layer impurity into a semiconductor substrate 1, thereby forming source/drain diffusion layers 7 and 14. Note that it is also possible to deposit a mask layer such as a silicon nitride film or silicon oxide film on the gate electrode layers and process the gate electrode layers by using this mask layer.

After that, although not shown, interlayer dielectric films, contact plugs, interconnections, and the like are formed to complete the semiconductor device. In this shape shown in FIG. 2B as described above, a gate structure in which electrode layers unprocessed by etching are stacked is formed on the semiconductor substrate 1 in the boundary area BS.

Generally, the boundary area BS of separate formation has a special shape, so the gate electrode is difficult to process. In this method, the gate electrode in the boundary area BS need not be etched, and this facilitates processing and improves the yield. The gate electrode is particularly difficult to process when it has a stacked structure in the boundary area BS as shown in FIG. 2B. Therefore, the effect of obviating the necessity of processing this portion is large.

In this embodiment as described above, in a semiconductor device having two or more transistors different in gate insulating film thickness or type, these gate insulating films are separately formed prior to the formation of a device isolation trench, and the number of fabrication steps is reduced by improving the structure of the boundary area BS. Additionally, the performance of the semiconductor device can be improved.

Furthermore, in this embodiment, the shape of a device isolation trench or gate electrode and the process of separate formation are improved in the boundary area BS contacting transistor regions in a semiconductor device having two or more different gate insulating films. This improves the reliability and can achieve both a sufficient process margin and satisfactory device performance.

This embodiment is particularly useful in a nonvolatile semiconductor device in which a device isolation region is formed to be self-aligned with a gate electrode.

In this embodiment, gate insulating films are separately formed before a device isolation trench is formed. Also, these gate insulating films are not directly coated with a photoresist during the separate formation.

This embodiment can provide a semiconductor device in which a device isolating oxide film is not etched from the edge of a device isolation region, and gate insulating films are highly reliable. Furthermore, when an ONO film is used as a gate insulating film of a memory cell, it is possible to prevent nonuniformity of the ONO film thickness on the edge of a device isolation region.

In the structures shown in FIGS. 1A and 1B, the bottom of the device isolation trench in the boundary area BS projects upward. As shown in FIG. 7A, when this trench is filled, the upper surface reflects the shape of the trench bottom portion, so the surface of the buried oxide film projects upward in the center of the boundary area BS. Although a wide device isolation region is readily dished during CMP, the buried shape projecting upward cancels this dishing. Consequently, CMP can be performed flat as shown in FIG. 7B. As described above, neither poor trench filling nor dishing by CMP occur unlike in the conventional device isolation regions shown in FIGS. 62A and 62B. This increases the process margin and improves the yield.

Even where the trench has the same depth on the right and left sides with a projection projecting upward, it is possible to obtain the effects described above, although the trench has depths different between the right and left sides in FIGS. 1A and 1B. In addition, there is also an effect in that a leakage current flowing through the STI bottom is reduced. This is so because the STI bottom becomes longer due to the step formed by the projection, thereby making formation of a leakage passage difficult.

In the structure shown in FIG. 2A, the unprocessed gate electrode in the boundary area BS is made thicker than those in the transistor regions as shown in FIG. 12A. If this gate electrode in the boundary area BS is to be completely removed, the etching amount in the boundary area BS becomes larger than that in the transistor regions. If the gate electrode in the boundary area BS is completely removed in this state, the etching amount in the transistor regions becomes too large, so the semiconductor substrate itself is etched. A processing margin for preventing this overetching is difficult to ensure. In this embodiment shown in FIG. 2A, however, the gate electrode in the boundary area BS is also etched by the same amount as the gate electrodes in the transistor regions. Since the etching amount can be determined only in the transistor regions, a sufficient processing margin can be assured.

In the structures shown in FIGS. 1B and 2B, the boundary area BS is covered with a photoresist during gate processing, as shown in FIGS. 9 and 10A, so the gate electrode in this boundary area BS is not etched. Particularly in the boundary area BS shown in FIGS. 2B and 10B, since the gate electrode structure differs from that in the transistor regions, it is difficult to etch this gate electrode in the boundary area BS simultaneously with the gate electrodes in the transistor regions. In the structures shown in FIGS. 1B and 2B, the etching amount can be determined only in the transistor regions. Accordingly, a sufficient processing margin can be ensured.

In the method as shown in FIG. 2A in which the gate electrode in the boundary area BS is partially left behind, the boundary area BS need not be covered with a resist when the gate electrode is etched. Hence, no alignment margin is necessary, and this can reduce a region for the gate electrode in the boundary area BS. On the other hand, in the method as shown in FIG. 2B in which the gate electrode in the boundary area BS is entirely left behind, the pattern of the gate electrode in this boundary area BS is large. This eliminates the possibility that this gate electrode peels off to produce dust, so the yield increases.

(Second Embodiment)

Figure 14A:
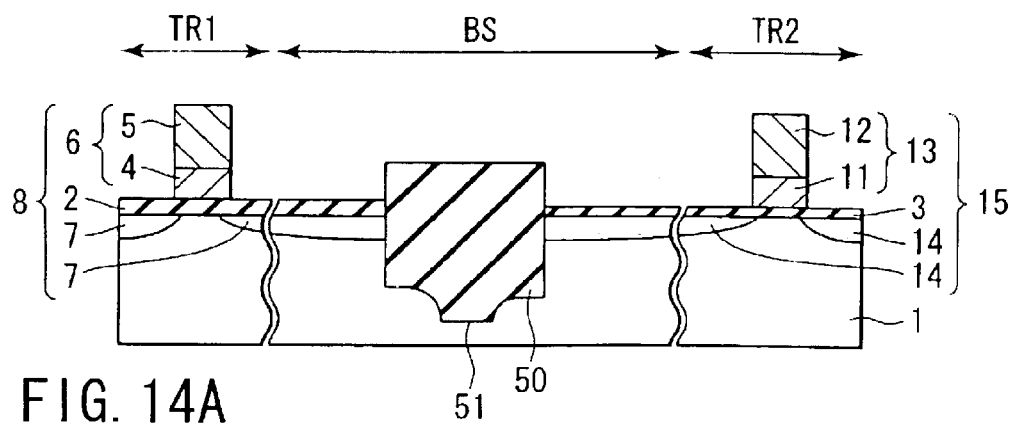
FIG. 14A is a sectional view showing a boundary area and its vicinity of a semiconductor device according to the second embodiment of the present invention.
Figure 14B:
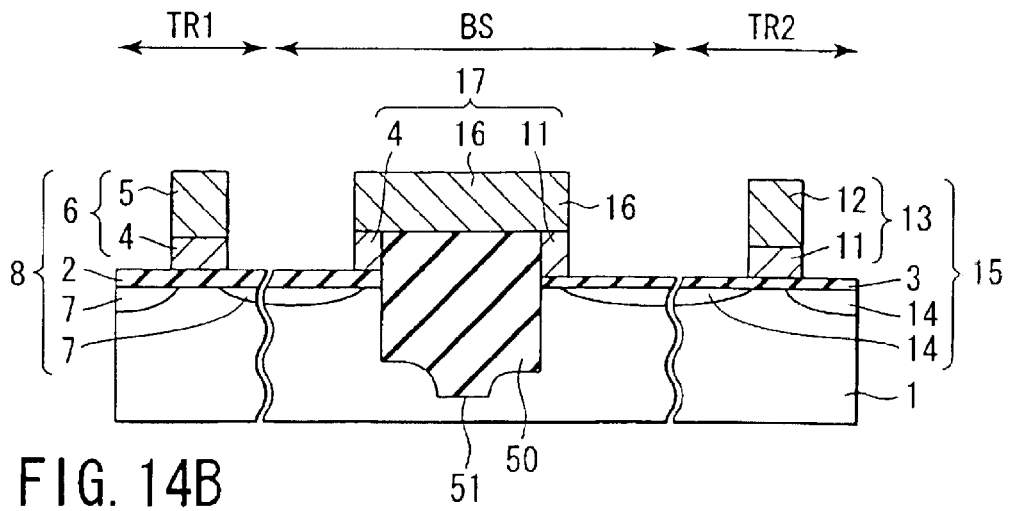
FIGS. 14B, 15A, and 15B are sectional views showing boundary areas and their vicinities of semiconductor devices according to modifications of the second embodiment.
Figure 15A:
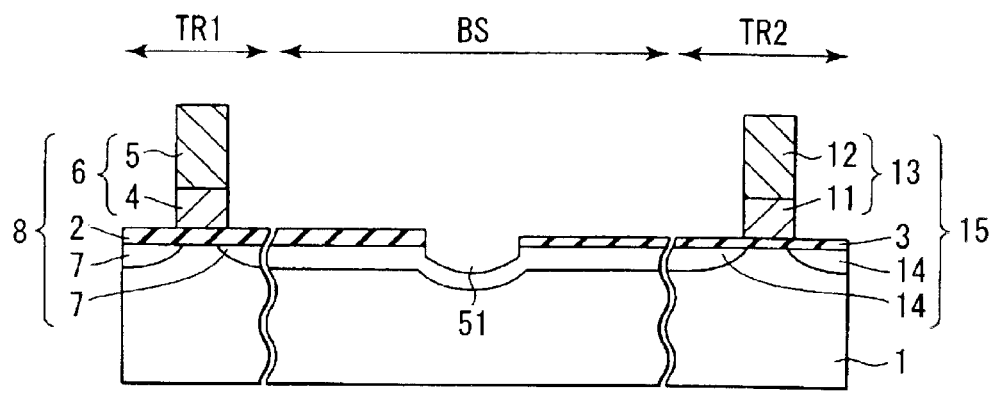
Figure 15B:
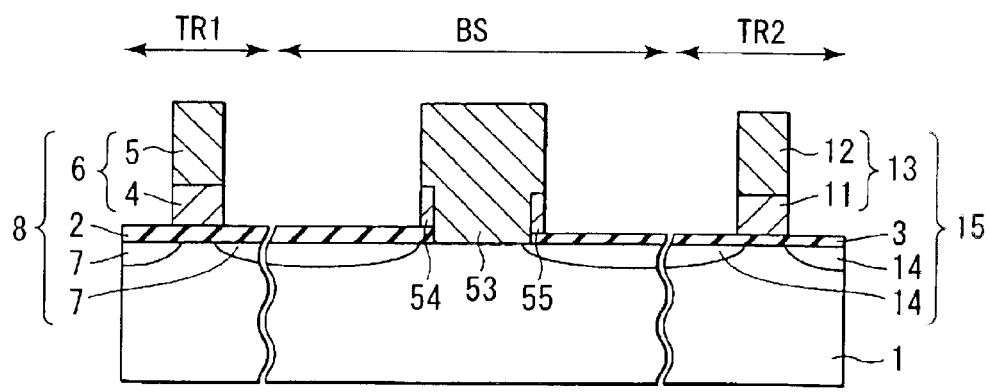

FIG. 14A is a sectional view showing a boundary area and its vicinity of a semiconductor device according to the second embodiment. FIGS. 14B, 15A, and 15B are sectional views showing boundary areas and their vicinities of semiconductor devices according to modifications of the second embodiment. The characteristic feature of this embodiment is that two types of transistors (e.g., first and second transistor regions TR1 and TR2) different in the type of the gate insulating films such as a film material and a film thickness are present on the same semiconductor substrate, and that a boundary area BS between these transistors has a device isolation region shape or electrode structure different from those of these transistors (i.e., the device isolation region shapes or electrode structures in the first and second transistor regions TR1 and TR2). More specifically, the boundary area BS, etc. is provided with a trench-type device isolation region having depths different with portions.

The semiconductor memory shown in FIG. 14A has the first and second transistor regions TR1 and TR2 formed on a semiconductor substrate 1, and the boundary area BS formed between these first and second transistor regions TR1 and TR2 in contact with them. When the first transistor region TR1 is a high-voltage transistor region, a gate insulating film 2 formed on the semiconductor substrate 1 is a silicon oxide film about 10 to 40 nm thick. When the second transistor region TR2 is a low-voltage transistor region, a gate insulating film 3 formed on the semiconductor substrate 1 is a silicon oxide film about 1 to 10 nm thick. When the second transistor region TR2 is a memory cell region, this gate insulating film 3 is a silicon oxide film about 1 to 10 nm thick or ONO film about 10 to 50 nm.

In the device shown in FIG. 14A, at least two of the three transistor regions described above are formed adjacent to each other such that the types or film thicknesses of their gate insulating films are different. Note that a well having a conductivity type opposite to that of the semiconductor substrate 1 can be formed near the surface of this semiconductor substrate 1. Furthermore, another well having the same conductivity type as the semiconductor substrate 1 can be formed on the well having the opposite conductivity type (this similarly applies to the rest of the specification).

In the first transistor region TR1, a lower electrode layer 4 is formed on the gate insulating film 2, and an upper electrode layer 5 is formed on this lower electrode layer 4, thereby forming a first gate electrode 6. In the semiconductor substrate 1, a pair of source/drain diffusion layers 7 are formed by implantation using the first gate electrode 6 as a mask. This first gate electrode 6 and the source/drain diffusion layers 7 form a first transistor 8. Both the lower and upper electrode layers 4 and 5 are polysilicon layers or the like.

A trench type device isolation region 50 is formed in the boundary area BS shown in FIG. 14A. On the bottom of the trench of this device isolation region 50, a step having a projection 51 which projects downward is formed. This changes the depth of this trench from one portion to another. The width of the projection 51 in a direction in which the first and second transistor regions TR1 and TR2 are connected is about 100 to 10,000 nm, and desirably, about 100 to 1,000 nm. The height (depth) of the projection 51 from the shallow portion of the bottom of the trench is about 10 to 300 nm, and desirably, about 30 to 100 nm. This height changes in accordance with the film thicknesses of the gate electrode materials in the adjacent first and second transistor regions TR1 and TR2. Also, the width of the projection 51 which projects downward on the bottom of the device isolation region 50 is determined by taking account of misalignment of lithography in the fabrication process. For example, this width is about 100 to 10,000 nm.

In the second transistor region TR2 adjacent to the boundary area BS, a lower electrode layer 11 is formed on the gate insulating film 3, and an upper electrode layer 12 is formed on this lower electrode layer 11, thereby forming a second gate electrode 13. In the semiconductor substrate 1, a pair of source/drain diffusion layers 14 are formed by implantation using the second gate electrode 13 as a mask. This second gate electrode 13 and the source/drain diffusion layers 14 form a second transistor 15. Both the lower and upper electrode layers 11 and 12 are polysilicon layers or the like.

In the structure shown in FIG. 14A, the depth of the device isolation region 50 is larger in the center of the boundary area BS than in those portions of the boundary area BS which are close to the left and right transistor regions. This improves the device isolation breakdown voltage. The bottom of this device isolation region becomes shallower as the thickness of the gate insulating film in the adjacent transistor region increases, and becomes deeper as the thickness of the gate insulating film decreases. Also, the bottom of the trench in the device isolation region 50 has a step, so the depth of the bottom of this device isolation region on the side of the first transistor region TR1 differs from that on the side of the second transistor region TR2 by about 5 to 50 nm, and desirably, about 10 to 30 nm. This is so because the film thickness of the first gate insulating film 2 is larger than that of the second gate insulating film 3 by about 5 to 50 nm, and desirably, about 10 to 30 nm. Another device isolation region can also be formed between the device isolation region 50 and each of the left and right transistors 8 and 15.

In the semiconductor memory shown in FIG. 14B, the structures of first and second transistor regions TR1 and TR2 are the same as in FIG. 15A, and the structure of a boundary area BS is different from that shown in FIG. 14A. Around a device isolation region 50, a lower electrode layer 4 is formed on a first gate insulating film 2, and a lower electrode layer 11 is formed on a second gate insulating film 3. In addition, an upper electrode layer 16 is formed on the device isolation region 50 and on the lower electrode layers 4 and 11 around this device isolation region 9, thereby forming a gate structure 17.

In this configuration, the gate structure 17 is desirably electrically insulated from gate electrodes 6 and 13 in the first and second transistor regions TR1 and TR2, respectively. Another device isolation region can also be formed between the device isolation region 50 and each of left and right transistors 8 and 15.

The structures shown in FIGS. 14A and 14B are characterized in that the bottom of the trench in the device isolation region 50 in the boundary area BS has a step, particularly, the projection 51 which projects downward. Additionally, the depth of the trench in this device isolation region 50 on the side of the first transistor region TRI differs from that on the side of the second transistor region TR2. The bottom of this device isolation region becomes shallower as the thickness of the gate insulating film in the adjacent transistor region increases, and becomes deeper as the thickness of the gate insulating film decreases.

Since the device isolation depth increases in the center of the device isolation region 50, a high device isolation breakdown voltage can be obtained even when the device is highly integrated by decreasing the width of the device isolation region. That is, the trench width can be made smaller to make the device finer than in the conventional device in which the trench depth in the transistor regions and the boundary area BS is constant. In addition, there is also an effect in that a leakage current flowing through the STI bottom is reduced. This is so because the STI bottom becomes longer due to the step formed by the projection, thereby making formation of a leakage passage difficult.

Furthermore, the gate structure 17 on the device isolation region 50 shown in FIG. 14B is easily processed, because this gate structure 17 is the same as the gate structures in the first and second transistor regions TR1 and TR2.

In the semiconductor memory shown in FIG. 15A, the structures of first and second transistor regions TR1 and TR2 are the same as in FIGS. 14A and 14B, and the structure of a boundary area BS is different from those shown in FIGS. 14A and 14B. In this boundary area BS, a recess 52 formed in a semiconductor substrate 1 is present.

If necessary for well isolation or the like, a device isolation region is formed between the boundary area BS and each of the first and second transistor regions TR1 and TR2.

This shape is readily processed since no device isolation region having a special shape as shown in FIGS. 14A and 14B is formed in the boundary area BS.

In the semiconductor memory shown in FIG. 15B, the structures of first and second transistor regions TR1 and TR2 are the same as in FIGS. 14A and 14B, and the structure of a boundary area BS is different from those shown in FIGS. 14A and 14B. As in the structure shown in FIG. 15A, no device isolation region is formed in the boundary area BS. In this boundary area BS, an electrode layer 53 is directly formed on a semiconductor substrate 1. This electrode layer 53 has the same composition and the same height as upper electrode layer 5 and 12.

Also, first and second conductive side walls 54 and 55 are formed on those side surfaces of the electrode layer 53, which oppose the first and second transistor regions TR1 and TR2, respectively. The first conductive side wall 54 has the same composition as a lower electrode layer 4 and is formed between a projection of the electrode layer 53 and a first gate insulating film 2. The second conductive side wall 55 has the same composition as a lower electrode layer 11 and is formed between a projection of the electrode layer 53 and a second gate insulating film 3. With this structure, the height of the gate structure in the boundary area BS equals the height of the transistors formed in the first and second transistor regions TR1 and TR2.

If necessary for well isolation or the like, a device isolation region is formed between the boundary area BS and each of the first and second transistor regions TR1 and TR2.

As described above, the semiconductor memory shown in FIG. 15B is characterized in that the electrode layer 53 is in direct contact with the semiconductor substrate in the boundary area BS. In addition, in this boundary area BS the first and second gate insulating films 2 and 3 exist on the two sides of the electrode layer 53. By the use of this structure, a plurality of transistors can be formed on the same semiconductor substrate with a few fabrication steps.

In the structure shown in FIG. 15B, the semiconductor substrate is not etched in the boundary area BS, and the electrode layer in this boundary area BS is not removed. Therefore, the film thickness of the conductor to be etched is the same as the gate electrode film thickness of the transistor. This eliminates a lowering of the yield caused by processing of the boundary area BS.

Also, the fabrication process of this embodiment has no step of directly coating the gate insulating films with a photoresist. This can improve the reliability of these gate insulating films. Especially in the structure shown in FIG. 15B, the gate electrode is left behind in the boundary area BS by patterning. This improves the yield since the gate electrode having a special structure in the boundary area BS need not be etched.

As in the first embodiment, this embodiment also has the structures shown in FIGS. 3A and 3B. Since the gate electrode does not fall to the side surface of the gate insulating film on the edge of each device isolation region, it is possible to prevent the formation of a parasitic transistor on the edges of the device isolation regions, and improve the performance of the transistors. Also, the number of fabrication steps is reduced because a self-aligned STI process is used, and the process has no steps of depositing and removing dummy insulating films and dummy gates for forming device isolation regions.

Examples of a semiconductor device fabrication method according to this embodiment will be described below. First, a method of fabricating the structure shown in FIG. 14A will be explained with reference to FIGS. 16A to 20.

Figure 16A:
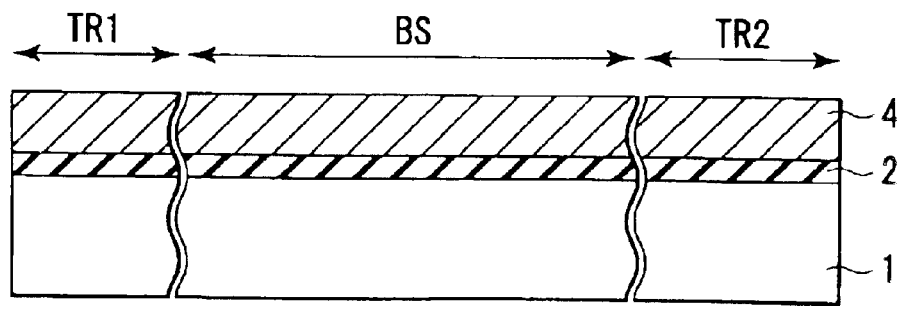
FIGS. 16A to 16C, 17A to 17C, 18A to 18C, 19A to 19C, and 20 are sectional views showing a method of fabricating the structure shown in FIG. 14A.

As shown in FIG. 16A, a sacrificial oxide film (not shown) is formed on the upper surface of a semiconductor substrate 1. Next, a well impurity and a channel impurity are implanted as needed, and the sacrificial oxide film is removed. Subsequently, a first gate insulating film 2 such as a silicon oxide film or silicon nitride film and a lower electrode layer 4 made of, e.g., polysilicon are formed on the semiconductor substrate 1.

Figure 16B:
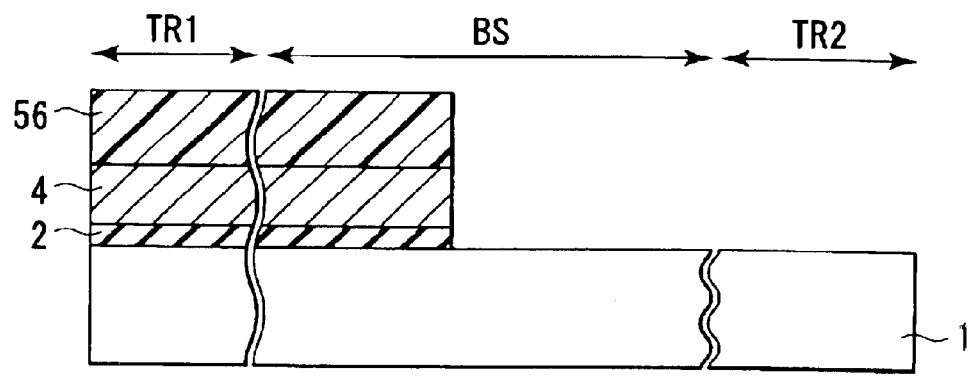

As shown in FIG. 16B, a first transistor region TRI and a region extending halfway in a boundary area BS from this first transistor region TR1 are covered with a photoresist layer 56, and the gate electrode layer and the gate insulating film in other regions are removed. The method of removal can be either isotropic etching such as wet etching or anisotropic etching such as RIE.

Figure 16C:
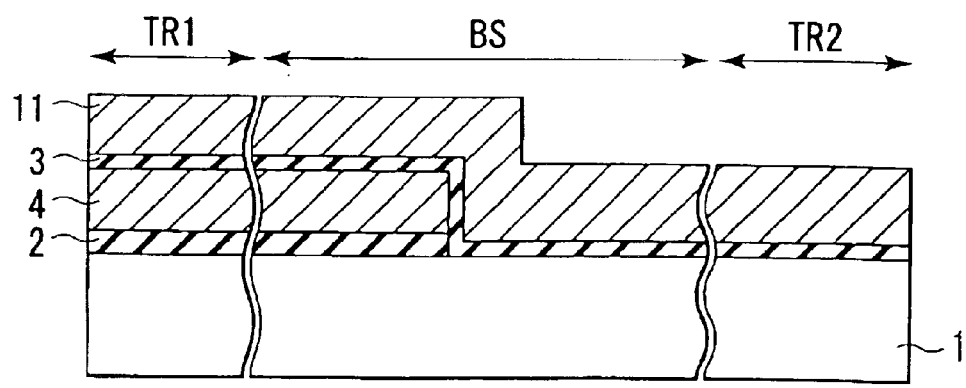

As shown in FIG. 16C, a second gate insulating film 3 such as a silicon oxide film or silicon nitride film and a lower electrode layer 11 made of, e.g., polysilicon are formed on the entire surface of the semiconductor substrate 1. Consequently, a stacked structure in which the second gate insulating film 3 and the lower electrode layer 11 are formed on the lower electrode layer 4 is obtained in the first transistor region TR1. The material and film thickness of the lower electrode layer 4 in the first transistor region TR1 can be different from those of the lower electrode layer 11 in a second transistor region TR2. However, if the materials and film thicknesses of these layers are the same, gate electrodes are readily etched at the same time in the subsequent step.

Figure 17A:
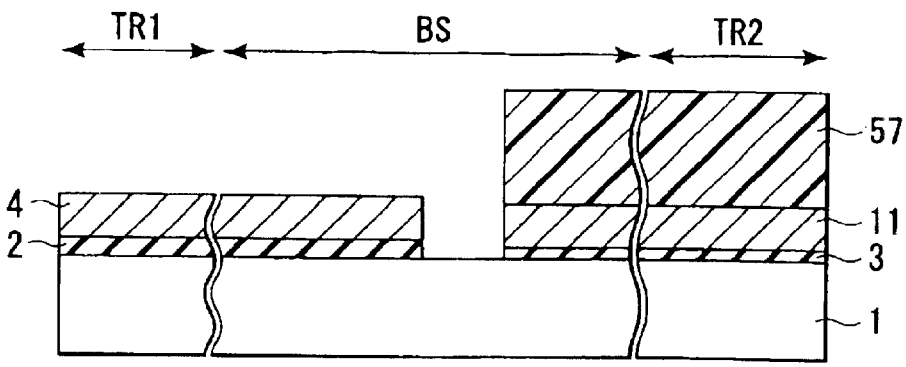

Next, as shown in FIG. 17A, the second transistor region TR2 and a region extending halfway in a boundary area BS from this second transistor region TR2 are covered with a photoresist layer 57, and the gate electrode layer and the gate insulating film in other regions are removed. The method of removal can be either isotropic etching such as wet etching or anisotropic etching such as RIE. Etching is so performed that the edge of the photoresist layer 57 is separated from the edge of the remaining lower electrode layer 4. That is, in the center of the boundary area BS of separate formation of the first and second transistor regions TR1 and TR2, both the lower electrode layers 4 and 11 are removed, and the surface of the semiconductor substrate 1 is exposed.

Figure 17B:
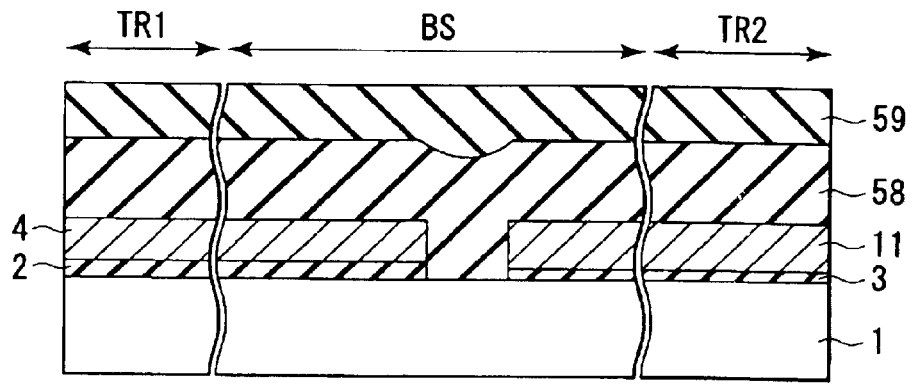
Figure 17C:
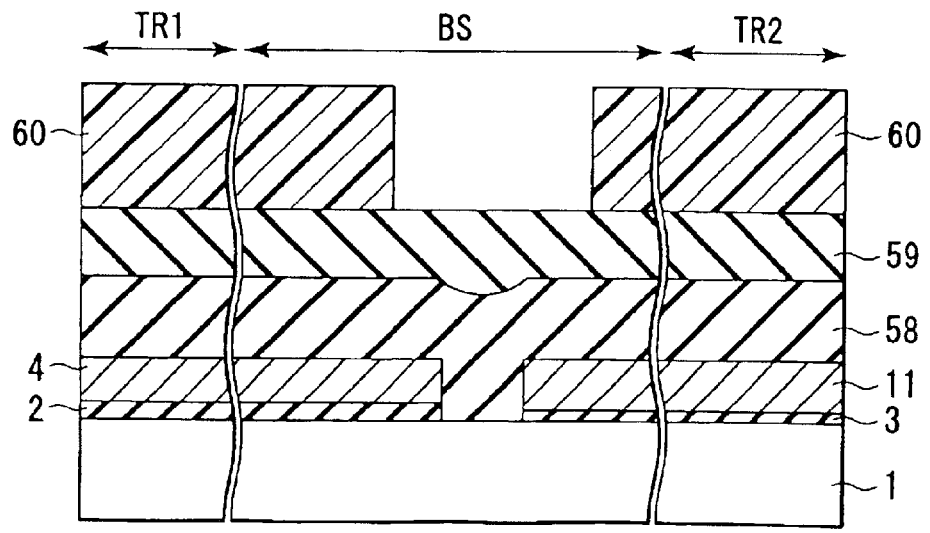

As shown in FIG. 17B, the photoresist layer 57 is removed, and first and second mask layers 58 and 59 are deposited. The first mask layer 58 is, e.g., a silicon nitride film, and the second mask layer 59 is, e.g., a silicon oxide film. Subsequently, as shown in FIG. 17C, a photoresist layer 60 for forming a device isolation region is deposited on the second mask layer 59, and a device isolation pattern is formed. This photoresist layer 60 is positioned above portions where no device isolation region is formed.

Figure 18A:
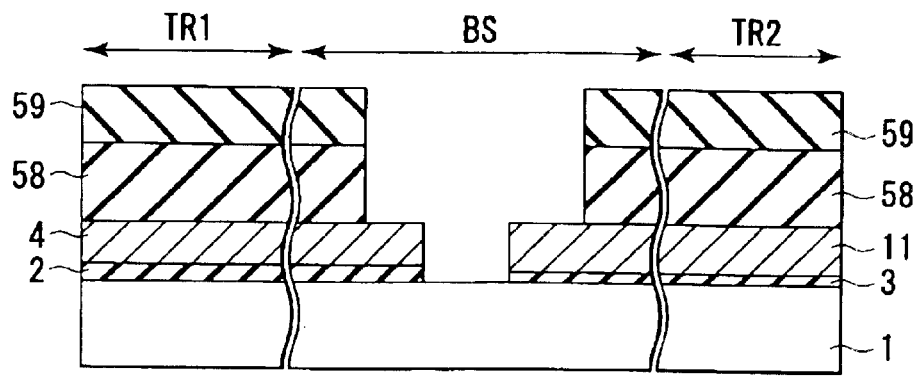
Figure 18B:
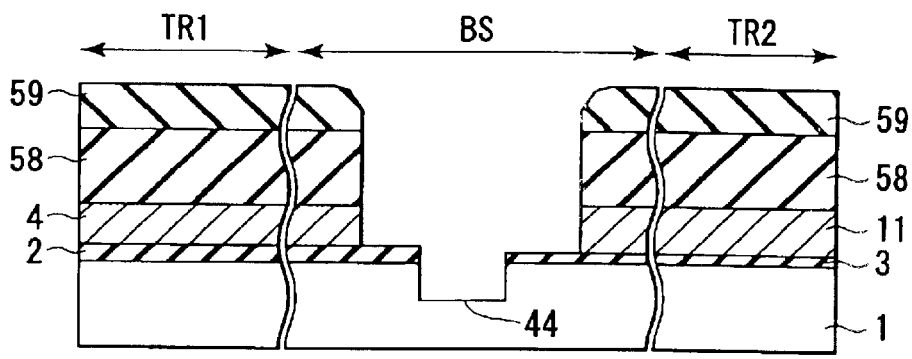

As shown in FIG. 18A, the photoresist layer 60 is used to remove the first and second mask layers 58 and 59 by anisotropic etching, so that a hole corresponding to the device isolation pattern is formed. Since no gate electrode is present in the center of the boundary area BS of separate formation, the semiconductor substrate 1 is exposed to the surface in that portion after the etching. As shown in FIG. 18B, the lower electrode layers 4 and 11 not covered with the first and second mask layers 58 and 59 are removed by anisotropic etching. Consequently, in the center of the boundary area BS the semiconductor substrate 1 is etched to form a recess 44.

Figure 18C:
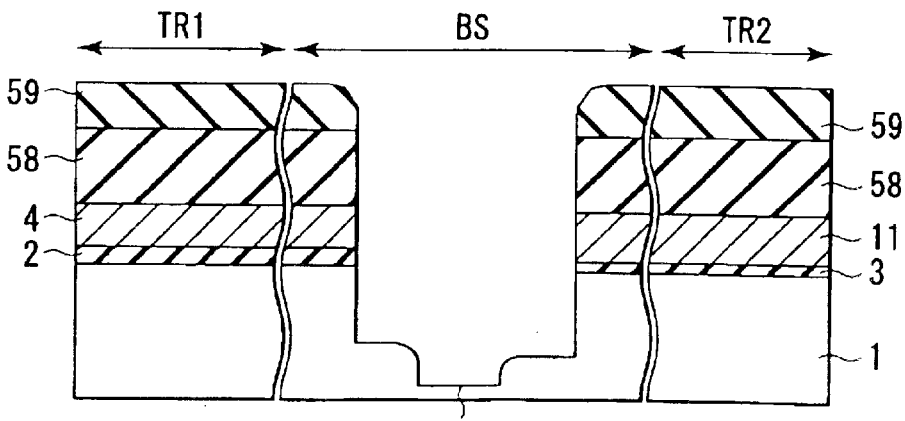

As shown in FIG. 18C, the semiconductor substrate 1 is etched to form a device isolation region. The depth of a trench 61 formed as a device isolation region in the semiconductor substrate 1 is about 50 to 300 nm, and desirably, about 150 to 250 nm. In the boundary area BS of separate formation, the step shown in FIG. 18A forms a downward projection on the bottom of the trench 61. The step amount of this projection depends upon the film thickness of the lower electrode layers 4 and 11 and the etching conditions. Generally, this step amount is about 10 to 300 nm, and desirably, about 30 to 100 nm.

Also, the depth of the bottom of the trench 61 on the side of the first transistor region TR1 differs from that on the side of the second transistor region TR2. In this embodiment, the depth of the bottom of the trench 61 on the side of the first transistor region TR1 is smaller than that on the side of the second transistor region TR2 by about 5 to 50 nm, and desirably, about 10 to 30 nm. This is so because the thickness of the first gate insulating film 2 is larger than that of the second gate insulating film 3. At this time, trenches for the device isolation regions 26 (see FIGS. 3A and 3B) are formed together in the first and second transistor regions TR1 and TR2, by etching the substrate 1 in the first and second transistor regions TR1 and TR2 to be self-aligned with the first and second lower electrode layers 4 and 11, respectively.

Figure 19A:
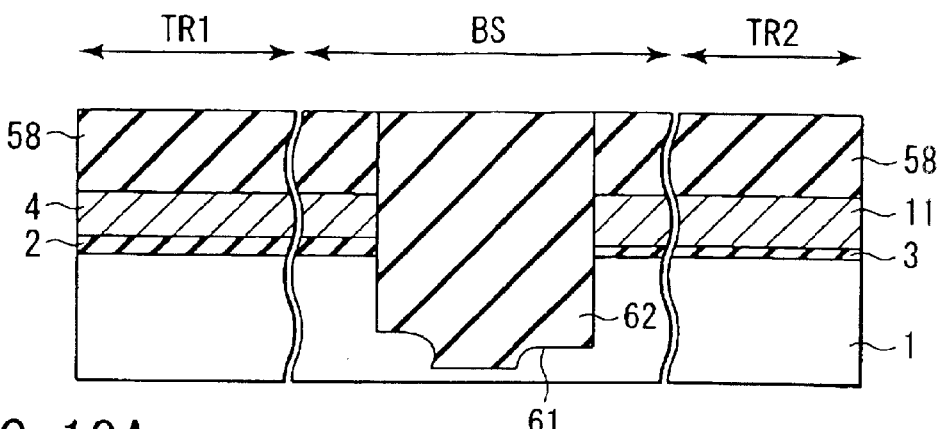
Figure 19B:
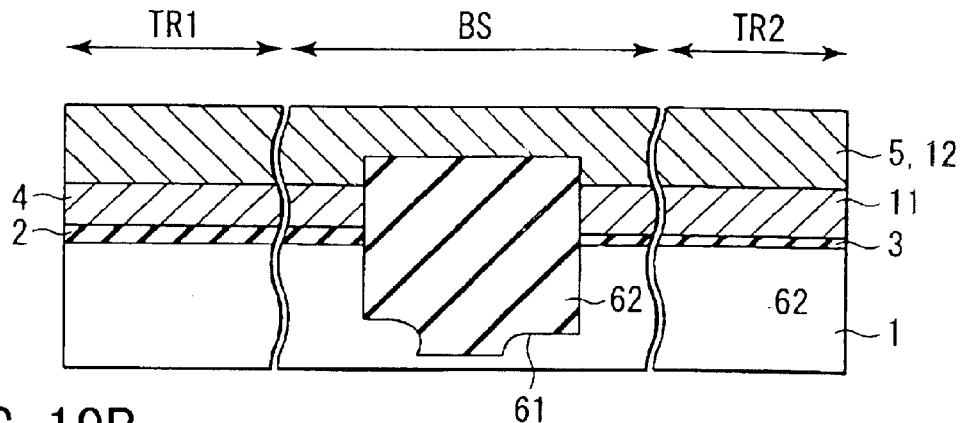
Figure 19C:
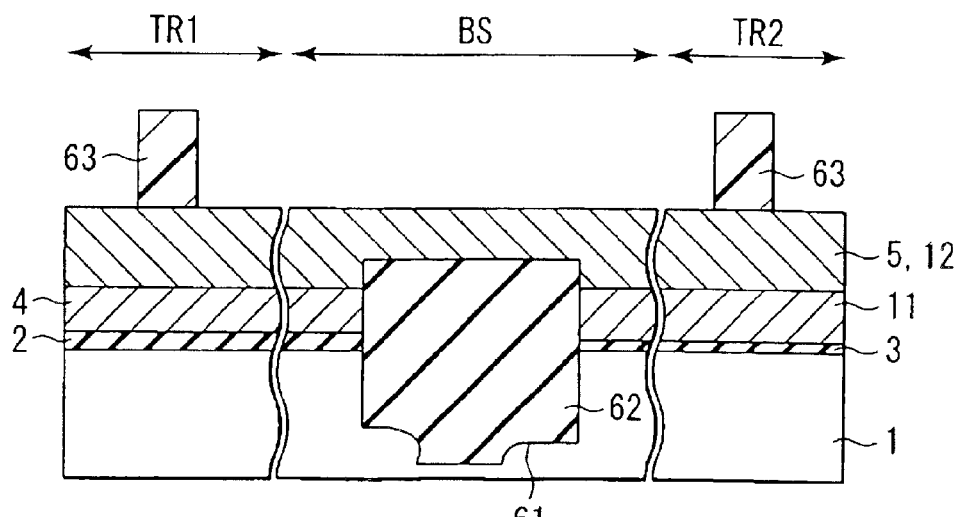

As shown in FIG. 19A, an insulator 62 such as a silicon oxide film is buried in the trench 61 in the boundary area BS and the trenches in the first and second transistor regions TR1 and TR2, and etched back by a method such as CMP by using the first mask layer 58 as a stopper. Subsequently, as shown in FIG. 19B, the first mask layer 58 is removed, and an upper electrode layer 5 (12) is deposited on the entire surface of the semiconductor substrate 1. This upper electrode layer 5 (12) is a polysilicon film, a multilayered film of polysilicon and a metal or a silicon and metal compound, or a single-layered film of a metal or a silicon and metal compound. Next, as shown in FIG. 19C, a photoresist layer 63 for processing the gate electrodes is deposited, and gate electrode patterns are formed.

Subsequently, as shown in FIG. 14A, the photoresist layer 63 is used as a mask to anisotropically etch the gate electrodes, thereby forming first and second gate electrodes 6 and 13. After that, damage by the processing is recovered by post-oxidation or the like. A diffusion layer impurity is then implanted to form source/drain diffusion layers 7 and 14, such that no resist layer is left behind in the boundary area BS and the gate electrodes are removed from this boundary area BS. Note that it is also possible to deposit a mask layer such as a silicon nitride film or silicon oxide film on the gate electrode layers and process the gate electrode layers by using this mask layer.

Figure 20:
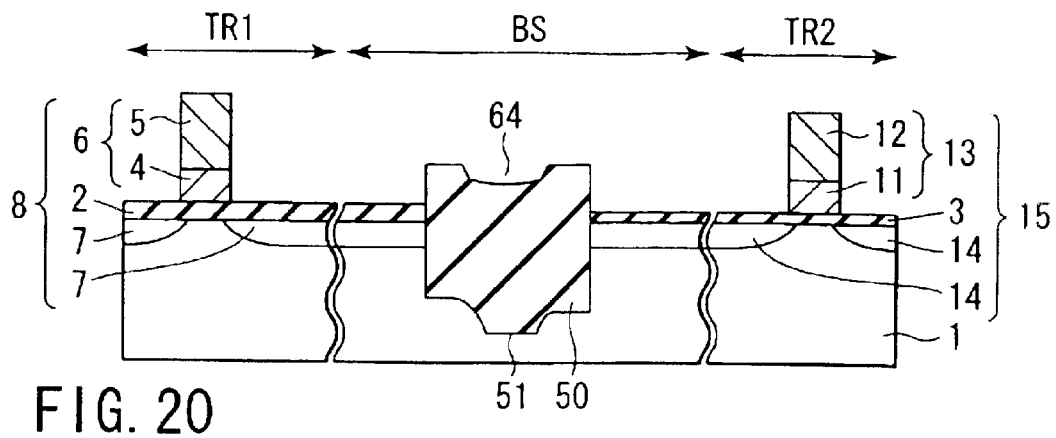

After that, although not shown, interlayer dielectric films, contact plugs, interconnections, and the like are formed to complete the semiconductor device. When the device isolation region is formed in the boundary area BS as described above, a step remains as the downward projection 51 on the bottom of the device isolation trench. Note that the device isolation trench is deep in the boundary area BS, so the buried shape sometimes projects downward by reflecting that. In this case, a recess 64 is formed in the upper surface as shown in FIG. 20.

Figure 21:
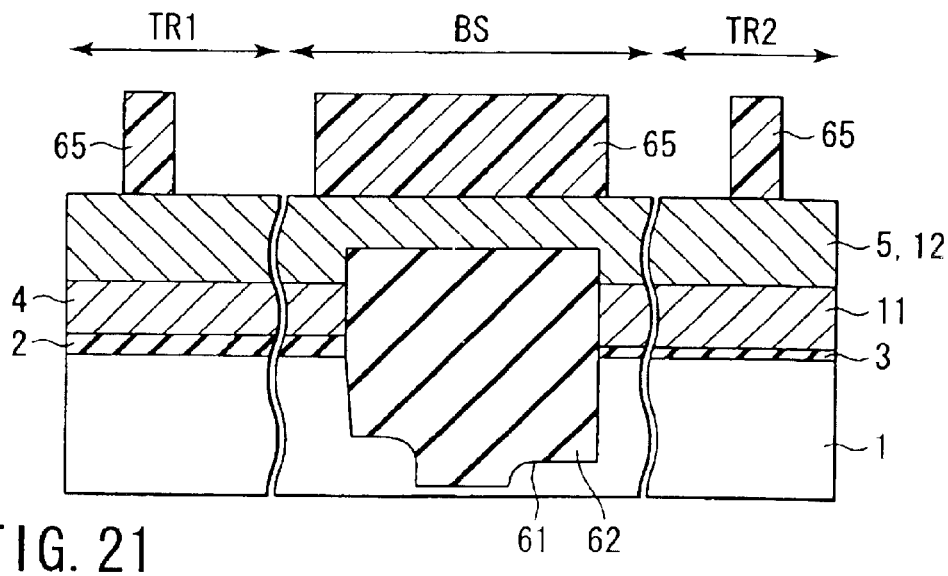
FIGS. 21 and 22 are sectional views showing a method of fabricating the structure shown in FIG. 14B.

A method of fabricating the structure shown in FIG. 14B will be described below. Until the step shown in FIG. 19B, this fabrication method is the same as the fabrication method of the structure shown in FIG. 14A. In the above fabrication process, the photoresist layer for processing the gate electrodes is opened in the boundary area BS. In this fabrication method, a photoresist layer is left behind in a boundary area BS. That is, as shown in FIG. 21, a pattern by which a photoresist layer 65 is left behind in the boundary area BS of separate formation is used. In this case, holes are formed in a photoresist layer 65 outside the width of a trench 61.

Next, as shown in FIG. 14B, the photoresist layer 65 is used as a mask to anisotropically etch the gate electrodes, thereby forming first and second gate electrodes 6 and 13. Around a device isolation region 50, a lower electrode layer 4 remains on a first gate insulating film 2, and a lower electrode layer 11 remains on a second gate insulating film 3. An upper electrode layer 16 is left behind in the device isolation region 50 and on the lower electrode layers 4 and 11 around the region 50, thereby forming a gate structure 17. After that, damage by the processing is recovered by post-oxidation or the like. A diffusion layer impurity is then implanted into a semiconductor substrate 1 to form source/drain diffusion layers 7 in a first transistor region TR1 and source/drain layers 14 in a second transistor region TR2. Note that it is also possible to deposit a mask layer such as a silicon nitride film or silicon oxide film on the gate electrode layers and process the gate electrode layers by using this mask layer.

Figure 22:
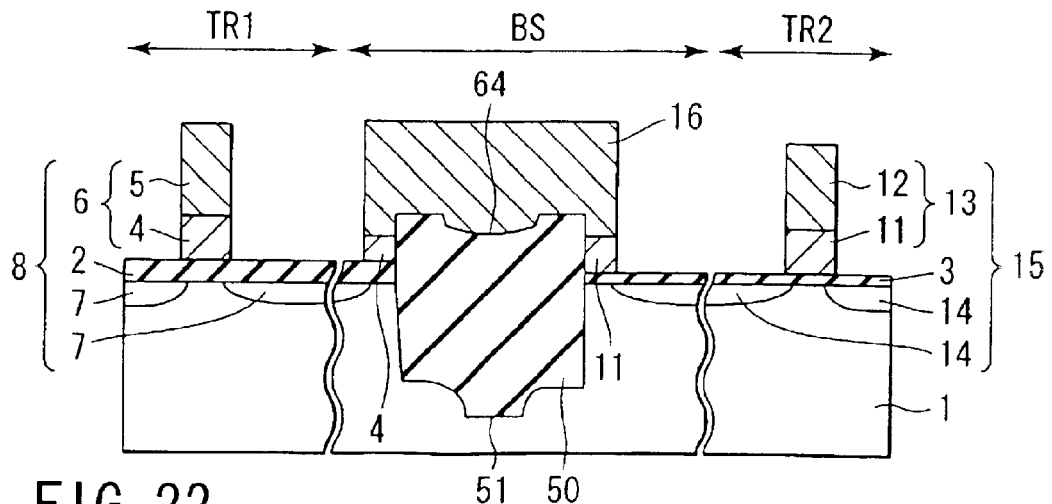

Note also that the device isolation trench is deep in the boundary area BS, so the buried shape sometimes projects downward by reflecting that. In this case, a recess 64 is formed in the upper surface as shown in FIG. 22, and an upper electrode layer 16 is formed by filling this recess 64.

A method of fabricating the structure shown in FIG. 15A will be described below. Until the step shown in FIG. 17B, this fabrication method is the same as the fabrication method of the structure shown in FIG. 14A.

Figure 23A:
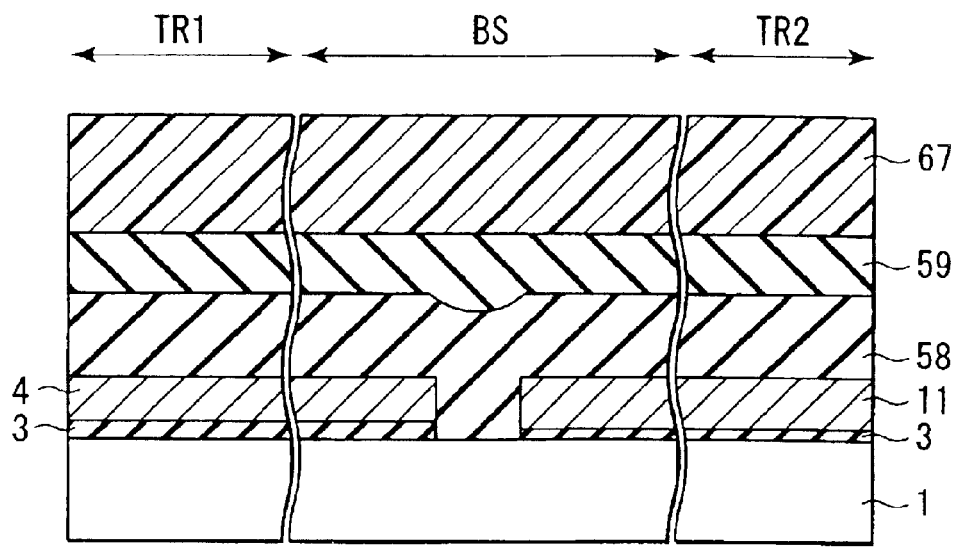
FIGS. 23A and 23B, 24A and 24B, and 25A and 25B are sectional views showing a method of fabricating the structure shown in FIG. 15A.
Figure 23B:
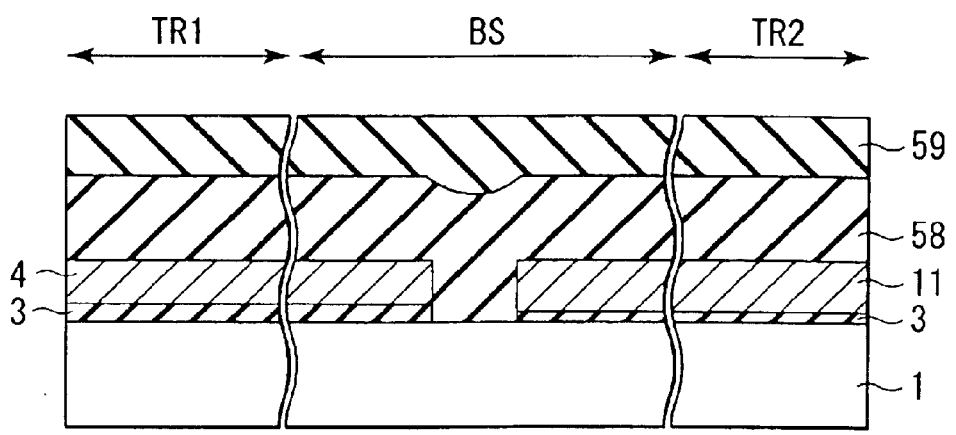

Next, as shown in FIG. 23A, a photoresist layer 67 for device isolation is deposited on a second mask layer 59. After the second mask layer 59 is anisotropically etched, as shown in FIG. 23B, the photoresist layer 67 is removed to expose the upper surface of the second mask layer 59. At this time, although not shown, there are etched portions in the second mask layer 59 in the first and second transistor regions TR1 and TR2.

Figure 24A:
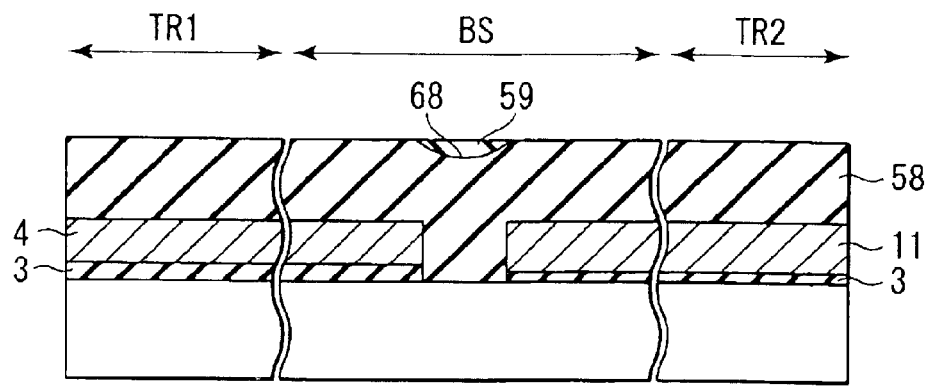

Next, using the steps of FIGS. 18A to 19A, the device isolation regions 26 (see FIGS. 3A and 3B) are formed in the first and second transistor regions TR1 and TR2. The shape of the boundary area BS at this time is shown in FIG. 24A. The second mask layer 59 remains in a recess 68 formed on the upper surface of the first mask layer 58.

Figure 24B:
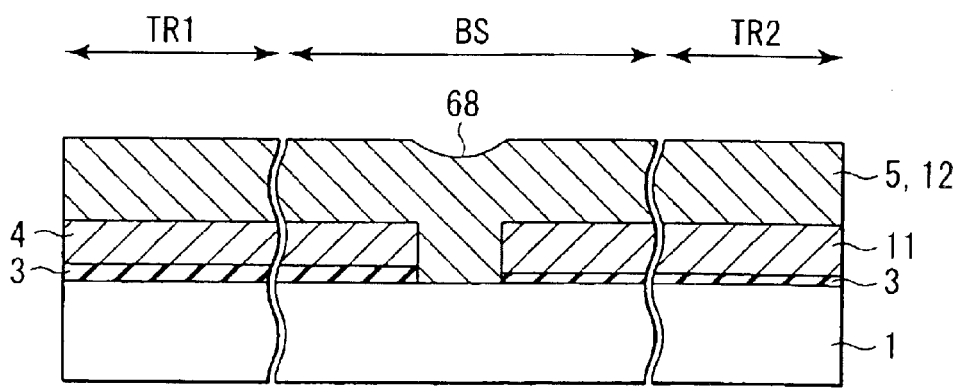
Figure 25A:
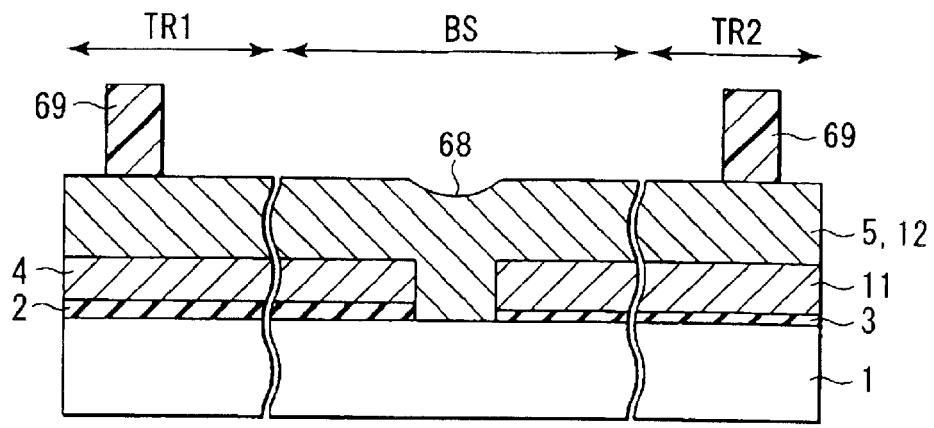

Subsequently, as shown in FIG. 24B, the first and second mask layers 58 and 59 are removed to expose the upper surfaces of lower electrode layers 4 and 11 and the upper surface of the semiconductor substrate 1, thereby forming an upper electrode layer 5 (12) on these upper surfaces. As shown in FIG. 25A, a photoresist layer 69 for forming gate electrodes is formed on this upper electrode layer 5 (12).

Figure 25B:
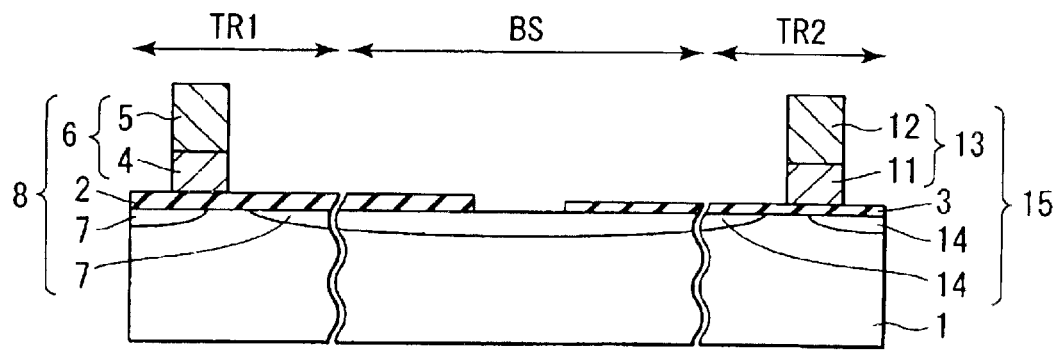

Next, as shown in FIG. 25B, etching is performed using this photoresist layer 69 as a mask, thereby forming first and second gate electrodes 6 and 13. After that, damage by the processing is recovered by post-oxidation or the like. A diffusion layer impurity is then implanted into the semiconductor substrate 1 to form source/drain diffusion layers 7 in a first transistor region TR1 and source/drain diffusion layers 14 in a second transistor region TR2. In this step, a boundary area BS is not covered with any mask, so a diffusion layer similar to the source/drain diffusion layers in the first and second transistor regions TR1 and TR2 is also formed in this boundary area BS. The boundary area BS can be covered with a photoresist layer, so that no source/drain diffusion layers are formed.

When the boundary area BS is not a device isolation region and the gate electrodes are removed from this boundary area BS as described above, the result is a shape as shown in FIG. 25B. However, high etching selectivity is difficult to ensure in the boundary area BS because the gate electrode is in direct contact with the semiconductor substrate in that portion. If the semiconductor substrate is etched, the result is the shape shown in FIG. 15A. Even in this case, no gate electrode remains, so there is no problem such as a gate electrode short circuit.

A method of fabricating the structure shown in FIG. 15B will be described below. Until the step shown in FIG. 24B, this fabrication method is the same as the fabrication method of the structure shown in FIG. 15A.

Figure 26:
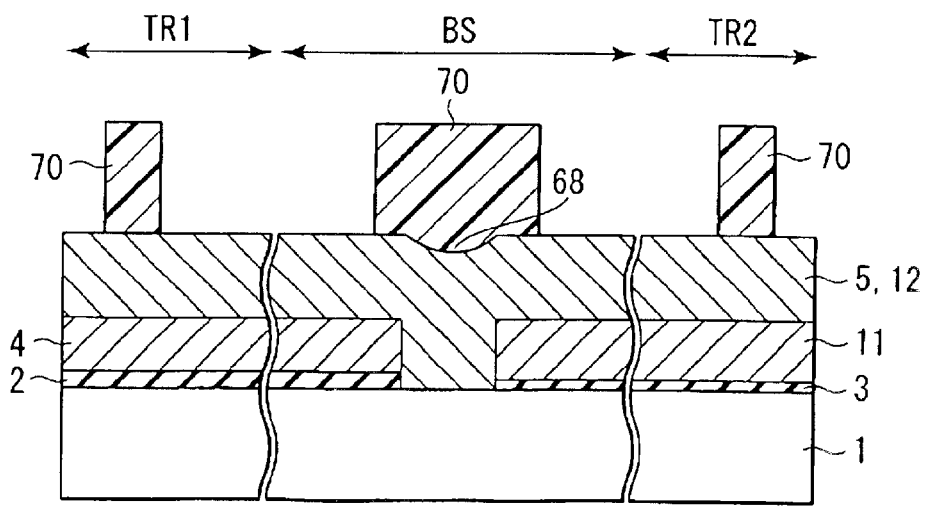
FIG. 26 is a sectional view showing a method of fabricating the structure shown in FIG. 15B.

Next, as shown in FIG. 26, a photoresist layer 70 for forming gate electrodes in first and second transistor regions TR1 and TR2 and a gate structure in a boundary area BS is formed on an upper electrode layer 5 (12). Around the boundary area BS, this photoresist layer 70 is so formed as to extend to the outside of a recess 68. As shown in FIG. 15B, the photoresist layer 70 is used as a mask to etch the gate electrode layers, thereby forming first and second gate electrodes 6 and 13, an electrode layer 53, and first and second conductive side walls 54 and 55. In this structure shown in FIG. 15B, the electrode layer in direct contact with a semiconductor substrate in the boundary area BS remains.

The boundary area BS of separate formation has a special shape, so the gate electrode is difficult to process. In this method, the gate electrode in the boundary area BS need not be processed, and this facilitates processing and improves the yield compared to other methods. The gate electrode is particularly difficult to process when it is in direct contact with the semiconductor substrate in the boundary area BS. Therefore, the effect of obviating the necessity of processing this portion is large.

Poor trench filling and CMP dishing shown in FIGS. 62A and 62B as the conventional problems are caused by a wide trench in the boundary area BS. In this embodiment, therefore, the trench bottom portion projects downward, and the trench width is made smaller than in the conventional devices. This prevents poor filling and dishing without lowering the device isolation breakdown voltage. In this case, the trench aspect ratio (height-to-width ratio) in the boundary area BS increases. However, by making this trench aspect ratio lower than that in the memory cell region, a significant lowering of the filling characteristics caused by the increase in the aspect ratio can be prevented.

In the method shown in FIG. 15A in which no gate electrode is left behind and the semiconductor substrate is etched in the boundary area BS, no dust is produced because no gate electrode remains in the boundary area BS. Also, since the boundary area BS is not covered with any resist, the sarface area of this boundary area BS can be decreased.

In the fabrication method shown in FIG. 25A, the unprocessed gate electrode is not thicker than the transistor regions. Accordingly, the etching amount can be determined by the necessary amount in the transistor regions. In addition, the semiconductor substrate is etched only in the boundary area BS, so etching damage is of no problem.

In the method shown in FIG. 15B in which the electrode layers 53, 54, and 55 (the conductive portions of the gate structure) are left behind in the boundary area BS, and these electrode layers are electrically connected to the semiconductor substrate (well), the gate electrodes can be processed in accordance only with the conditions in the transistor regions. In particular, electrically connecting the electrode layers (the conductive portions of the gate structure) to the well lowers the well resistance and increases the speeds of rise and fall of the voltage of the well. This improves the device performance. Furthermore, since a potential can be given to the well or the semiconductor substrate through the electrode layers, it is unnecessary to form another well contact or substrate contact.

(Third Embodiment)

Figure 27A:
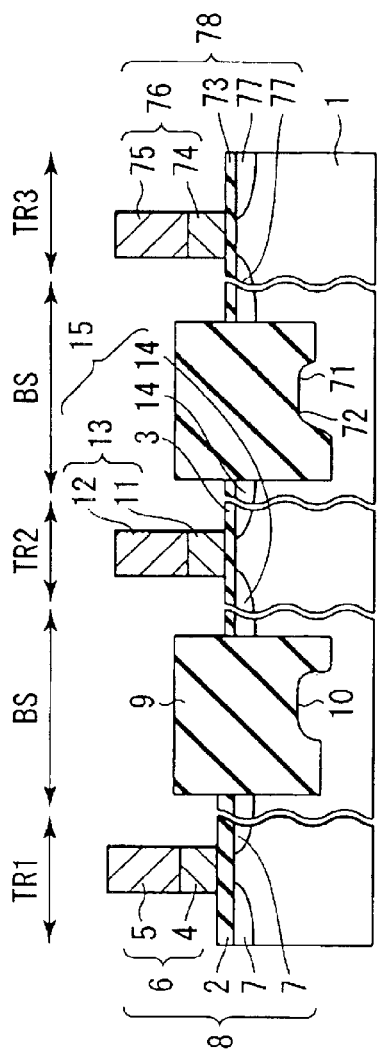
FIGS. 27A and 27B are sectional views showing boundary areas and their vicinities of semiconductor devices according to the third embodiment of the present invention and its modification, respectively.
Figure 27B:
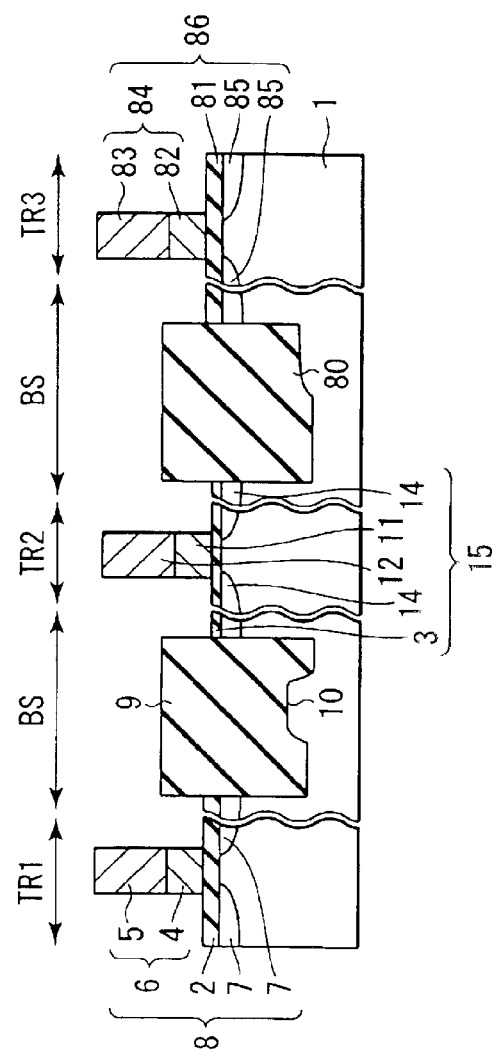

FIGS. 27A and 27B are sectional views each showing a semiconductor device according to this embodiment. The characteristic feature of this embodiment is that three types of transistors (e.g., first, second, and third transistor regions TR1, TR2, and TR3) different in gate insulating film type or thickness are present on the same semiconductor substrate, and that a boundary area BS between two adjacent transistor regions has a device isolation region shape or electrode structure different from those of these two adjacent transistor regions.

In the semiconductor device shown in FIG. 27A, the first and second transistor regions TR1 and TR2 have the same structures as shown in FIG. 1A. In addition, a device isolation region 72 having on its bottom a projection 71 which projects upward is formed between the second and third transistor regions TR2 and TR3. In the third region TR3, a third gate insulating film 73 is formed on a semiconductor substrate 1. This third gate insulating film 73 has the composition and film thickness different from those of first and second gate insulating films 2 and 3. On this third gate insulating film 73, a third gate electrode 76 in which a lower electrode layer 74 and an upper electrode layer 75 are stacked is formed.

This third gate electrode 76 is used as a mask to form source/drain diffusion layers 77 in the semiconductor substrate 1, thereby forming a third transistor 78.

The structure shown in FIG. 27A is characterized in that the bottom of a trench in a device isolation region 9 in one boundary area BS has a step, particularly, a projection 10 which projects upward. Likewise, the bottom of a trench in the device isolation region 72 in the other boundary area BS has a step, particularly, the projection 71 which projects upward. Additionally, the depth of the trench in the device isolation region 9 on the side of the first transistor region TR1 differs from that on the side of the second transistor region TR2. Analogously, the depth of the trench in the device isolation region 72 on the side of the second transistor region TR2 differs from that on the side of the third transistor region TR3. In this structure, the gate insulating film 3 in the second transistor region TR2 is thinner than the gate insulating film 73 in the third transistor region TR3, so the bottom of the device isolation region 72 is shallower on the side of the third transistor region TR3 accordingly.

The semiconductor device shown in FIG. 27B is characterized in that the structure of a boundary area BS between first and second transistor regions TR1 and TR2 differs from the structure of a boundary area BS between the second transistor region TR2 and a third transistor region TR3. In the boundary area BS between the second and third transistor regions TR2 and TR3, the bottom of a device isolation region 80 has no projection, i.e., has only a step resulting from the difference between the depths of regions contacting this device isolation region 80. Since the film thickness of a third gate insulating film 81 is made larger than that of a second gate insulating film 3, the device isolation region 80 is deeper on the side of the second transistor region TR2.

In the third transistor region TR3, the third gate insulating film 81 is formed on a semiconductor substrate 1, and a third gate electrode 84 made up of a lower electrode layer 82 and an upper electrode layer 83 is formed on this third gate insulating film 81. This third gate electrode 84 is used as a mask to form source/drain diffusion layers 85 in the semiconductor substrate 1, thereby forming a third transistor 86.

The use of these structures realizes a self-aligned STI process requiring no steps of depositing and removing dummy insulating films and dummy gates for STI formation. Consequently, a plurality of transistors can be formed on the same semiconductor substrate with a few fabrication steps. Also, the fabrication process of the structure shown in FIG. 27A has no step of directly coating the gate insulating films with a photoresist. This can improve the reliability of these gate insulating films.

In the fabrication process of the structure shown in FIG. 27B, a step of removing the separately formed gate electrodes is omitted. This can simplify the fabrication process and reduce the cost.

Figure 28A:
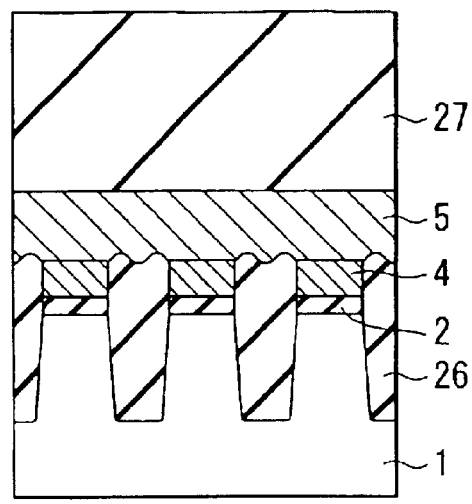
FIGS. 28A, 28B, and 28C are sectional views showing, in the extending direction, the gate electrodes of first, second, and third transistor regions, respectively, in the third embodiment.
Figure 28B:
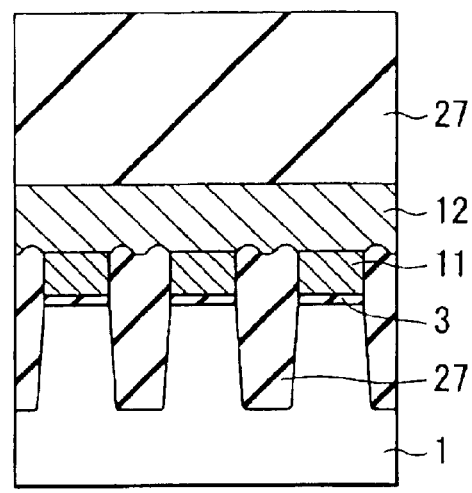
Figure 28C:
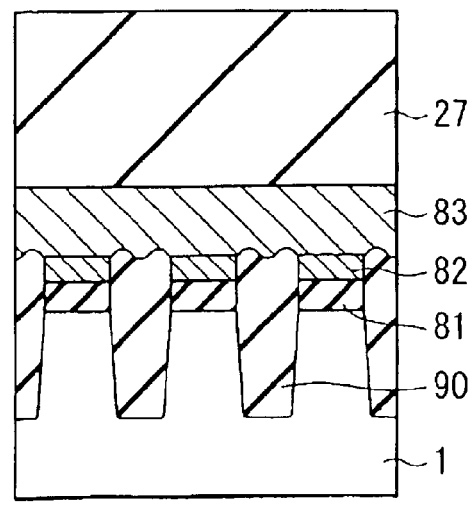
Figure 29A:
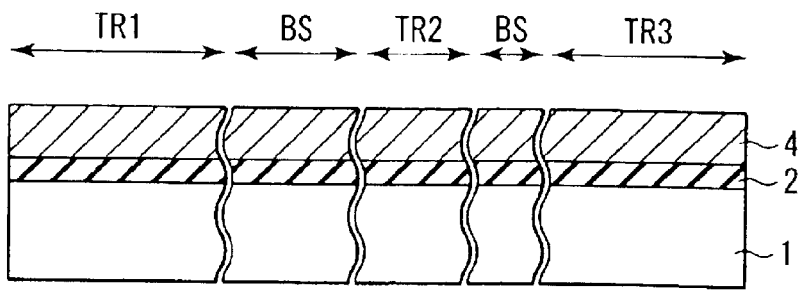
FIGS. 29A to 29C, 30A to 30C, and 31A and 31B are sectional views showing a method of fabricating the structure shown in FIG. 27A.
Figure 29B:
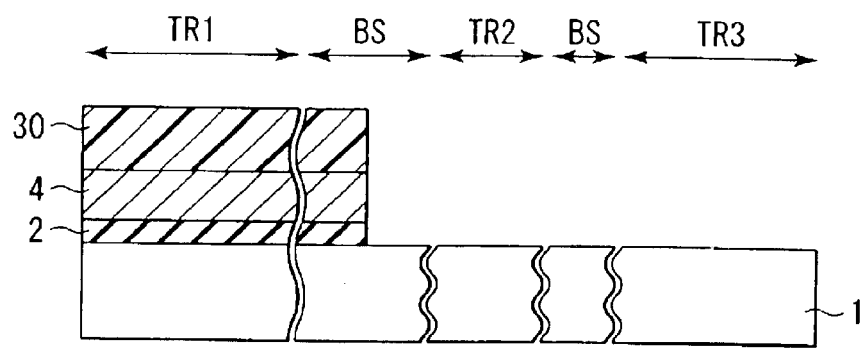
Figure 29C:
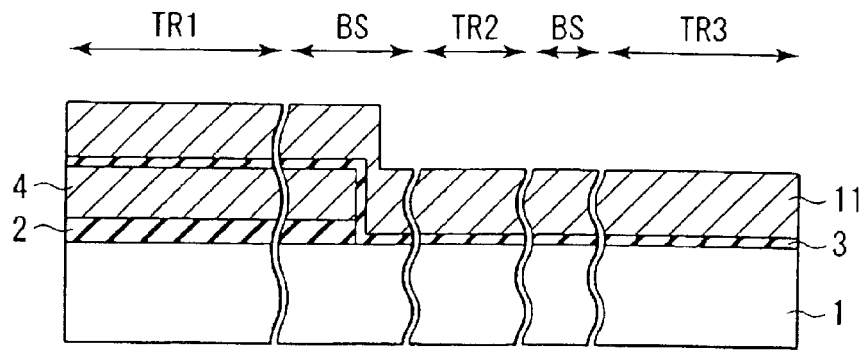

FIG. 28A is a sectional view showing the structure of the gate electrode in the first transistor region TR1. FIG. 28B is a sectional view showing the structure of the gate electrode in the second transistor region TR2. FIG. 28C is a sectional view showing the structure of the gate electrode in the third transistor region TR3. As shown in FIGS. 28A to 28C, in the transistor of this embodiment the gate electrode is formed to be self-aligned with the device isolation region. Therefore, on the edge of each device isolation region, the gate electrode does not fall to the side surface of the gate insulating film. This prevents the formation of a parasitic transistor on the edges of the device isolation regions, and improves the performance of the transistors.

The structure of the boundary area BS of separate formation shown in each of FIGS. 27A and 27B is formed by the method which overlaps gate electrodes and forms a device isolation trench in the boundary area BS, and removes the gate electrode from the boundary area BS. However, as explained in the first and second embodiments, it is possible to arbitrarily combine the presence/absence of overlapping, the presence/absence of a device isolation trench, and the presence/absence of removal of the gate electrode in the boundary area BS. Furthermore, the individual boundary areas of separate formation can have the same structure or different structures.

An example of a method of fabricating a semiconductor device having the structure shown in FIG. 27A according to this embodiment will be described below. FIGS. 29A to 30A are the same as the steps shown in FIGS. 4A to 5A.

Figure 30A:
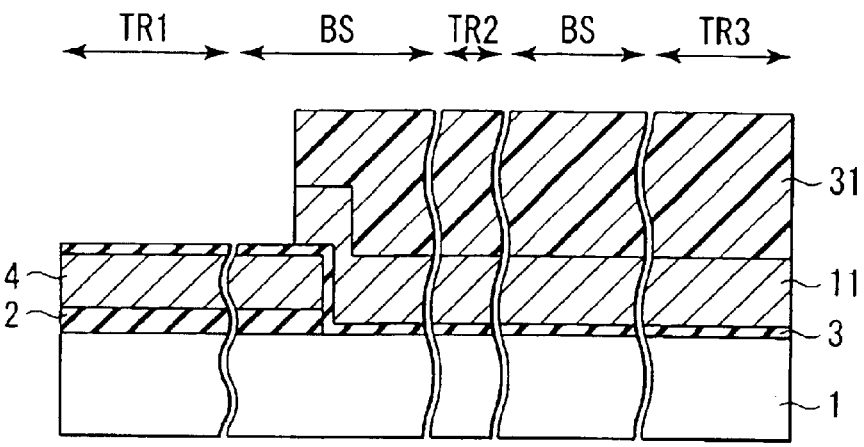
Figure 30B:
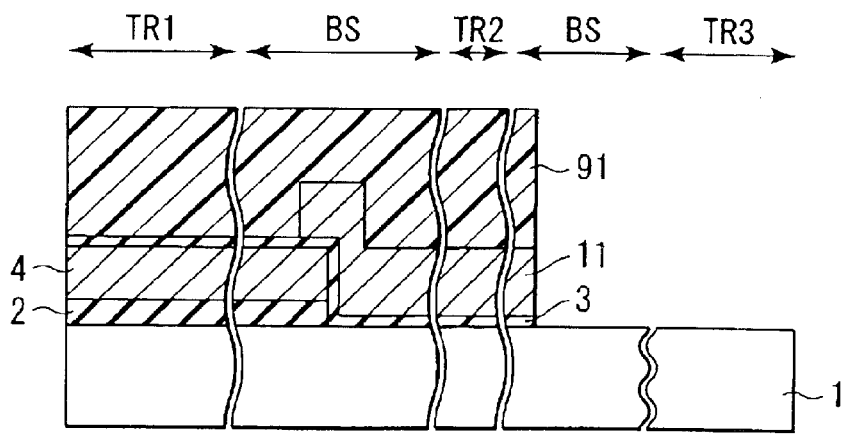
Figure 30C:
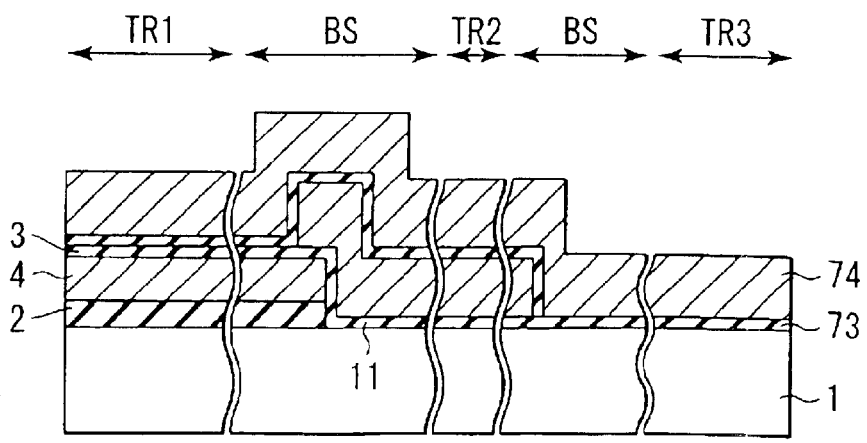
Figure 31A:
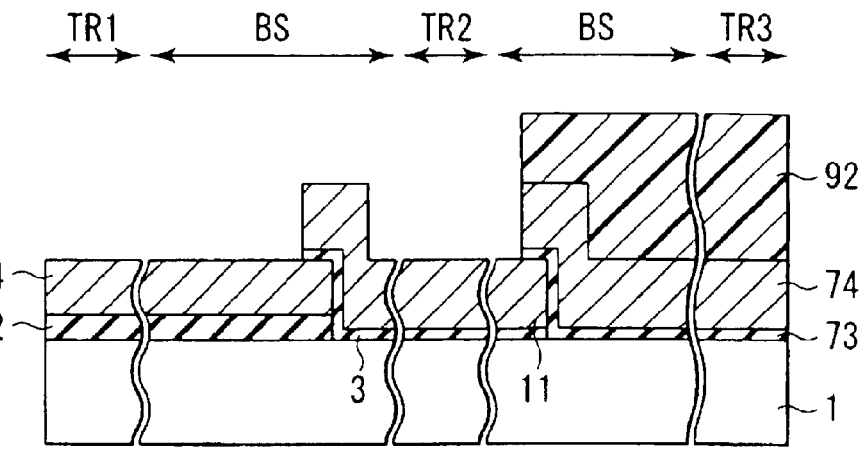

Next, as shown in FIG. 30B, etching is performed using a photoresist 91 which exposes a third transistor region TR3 and its boundary area BS. As shown in FIG. 30C, this photoresist 91 is removed, a third gate insulating film 73 is deposited on the entire surface, and a lower electrode layer 74 is formed on this third gate insulating film 73. Subsequently, as shown in FIG. 31A, a photoresist layer 92 is formed on the third transistor region TR3 and its boundary area BS, and etching is performed. Consequently, a lower electrode layer 4 is exposed in a first transistor region TR1, and a lower electrode layer 11 is exposed from a boundary area BS to a second transistor region TR2.

Figure 31B:
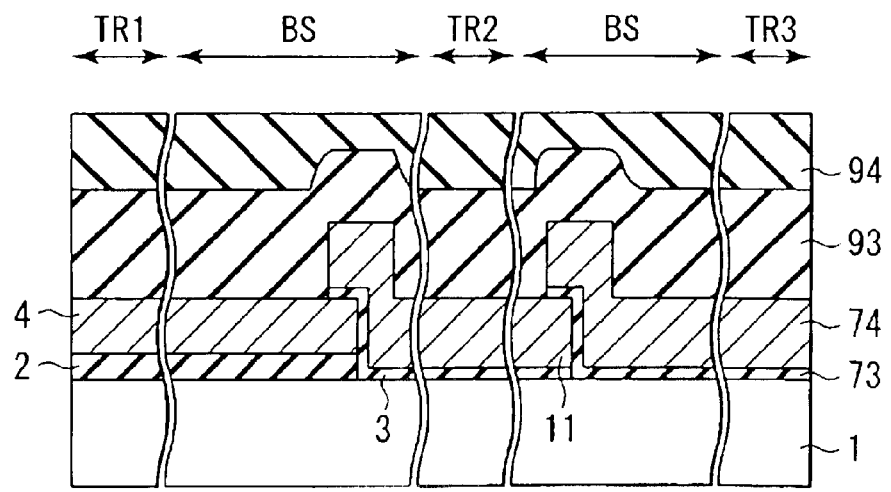

As shown in FIG. 31B, the photoresist layer 92 is removed, and first and second mask layers 93 and 94 are formed in this order on the exposed surface. The first mask layer 93 is, e.g., a silicon nitride film, and the second mask layer 94 is, e.g., a silicon oxide film. After that, device isolation regions and gate electrodes are formed in the same manner as in the steps shown in FIGS. 5C to 8 explained as the fabrication method of the first embodiment. In addition, although not shown, interlayer dielectric films, contact plugs, interconnections, and the like are formed to complete the semiconductor device.

Since the method of this embodiment has no step in which a photoresist is in direct contact with a gate insulating film, so high reliability of a gate insulating film can be assured. Also, the structure of the boundary area BS of separate formation is not restricted to the structure shown in FIG. 27A; it is possible to use other structures explained in the first and second embodiments or combine a plurality of different structures. Furthermore, four or more types of gate insulating films and gate electrodes can be separately formed by the use of the method of this embodiment.

Next, an example of a method of fabricating the structure shown in FIG. 27B will be explained.

Figure 32A:
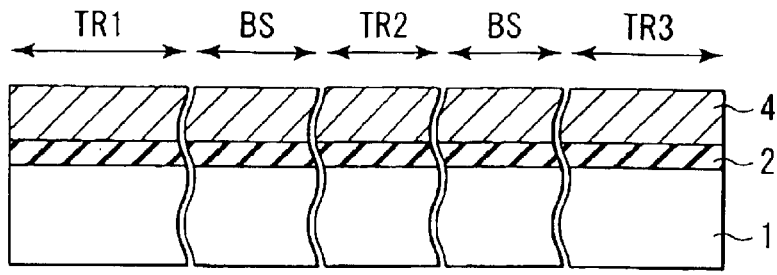
FIGS. 32A to 32D, 33A to 33C, and 34A and 34B are sectional views showing a method of fabricating the structure shown in FIG. 27B.

First, a sacrificial oxide film is formed on the surface of a semiconductor substrate 1. After a well impurity and a channel impurity are implanted as needed, this sacrificial oxide film is removed. Subsequently, as shown in FIG. 32A, a first gate insulating film 2 such as a silicon oxide film or silicon nitride film and a lower electrode layer 4 made of, e.g., polysilicon are formed on the semiconductor substrate 1.

Figure 32B:
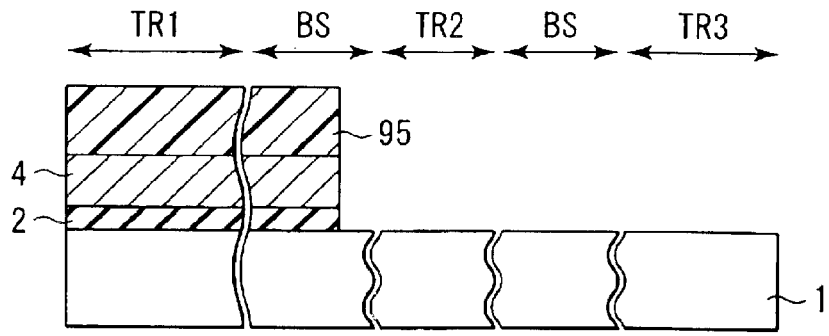

As shown in FIG. 32B, a region to be a first transistor region TRI is covered with a photoresist layer 95, and the gate electrode layer and the gate insulating film in other regions are removed. The method of removal can be either isotropic etching such as wet etching or anisotropic etching such as RIE.

Figure 32C:
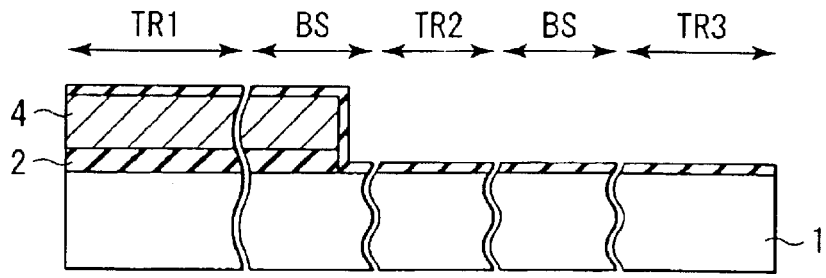
Figure 32D:
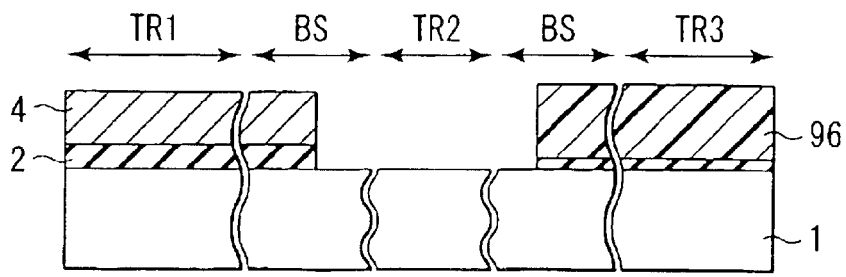

As shown in FIG. 32C, an oxide film 96 such as a silicon oxide film or silicon nitride film is formed on the entire surface of the semiconductor substrate 1. As shown in FIG. 32D, a third transistor region TR3 is covered with a photoresist 97, and the oxide film 96 in other regions is removed.

Figure 33A:
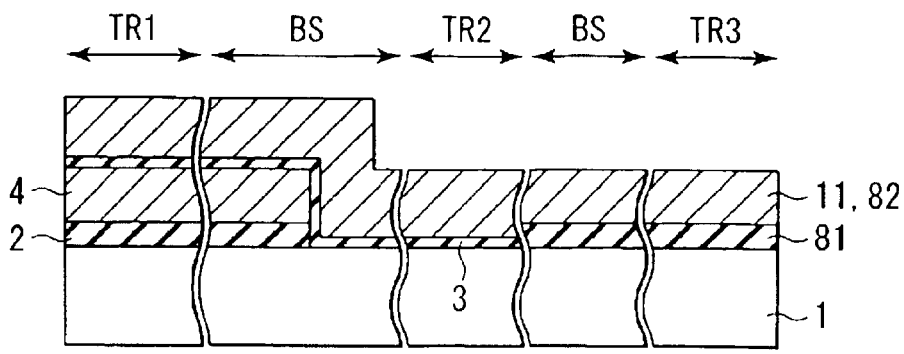

As shown in FIG. 33A, a second gate insulating film 3 and a lower electrode layer 11 (82) are formed on the exposed surface. The second gate insulating film 3 is formed on the oxide film 96 to increase the thickness of this portion, thereby forming a third gate insulating film 81 in the third transistor region TR3. The lower electrode layers 11 and 82 can be different in material and film thickness. However, if the materials and film thicknesses of these layers are the same, gate electrodes are readily etched at the same time in the subsequent step.

Figure 33B:
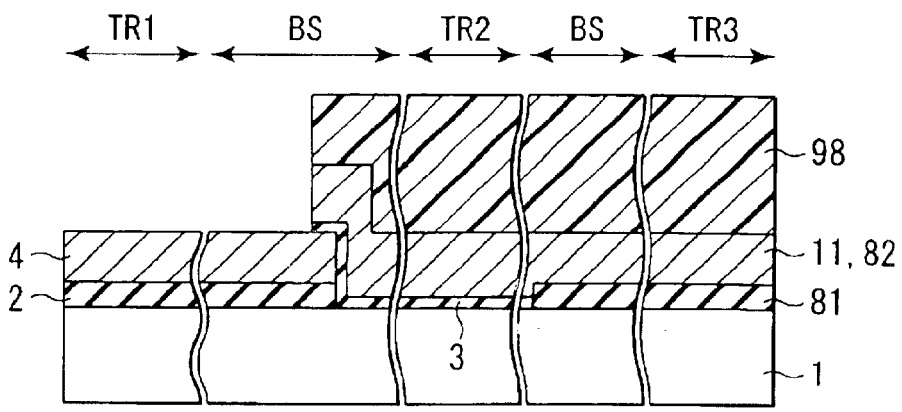

Next, as shown in FIG. 33B, regions to be second and third transistor regions TR2 and TR3 are covered with a photoresist layer 98, and the lower electrode layers 11 and 82 and the second gate insulating film in other regions are removed. The method of removal can be either isotropic etching such as wet etching or anisotropic etching such as RIE. Etching is so performed that a portion of the photoresist reaches a boundary area BS on the side of the first transistor region TR1. Accordingly, the gate electrode stacked structure remains as it is in the boundary area BS of separate formation between the first and second transistor regions TR1 and TR2.

Figure 33C:
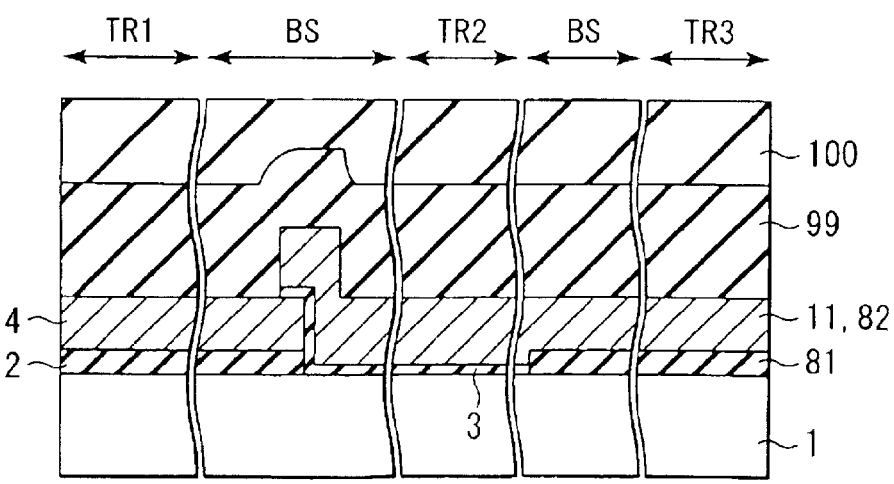

As shown in FIG. 33C, first and second mask layers 99 and 100 are deposited. The first mask layer 99 is, e.g., a silicon nitride film, and the second mask layer 100 is, e.g., a silicon oxide film. After that, device isolation trenches and device isolation regions are formed by steps similar to the steps shown in FIGS. 6A to 7C.

Figure 34A:
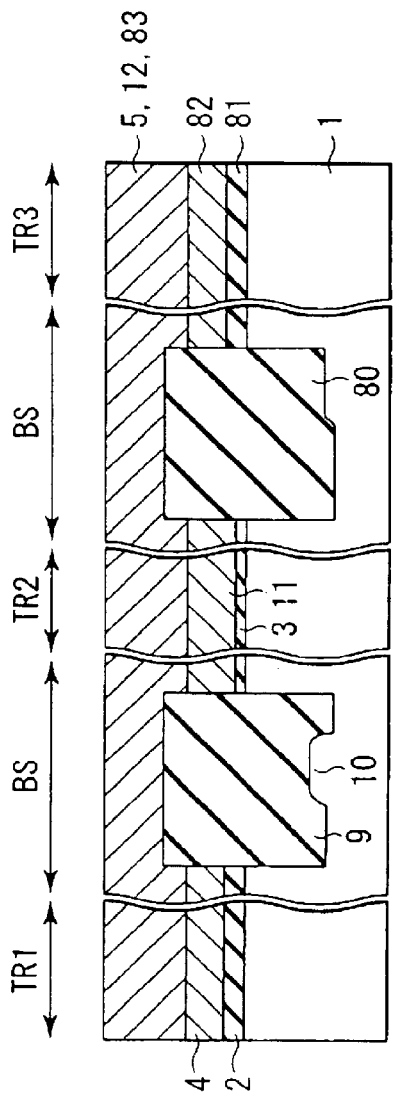
Figure 34B:
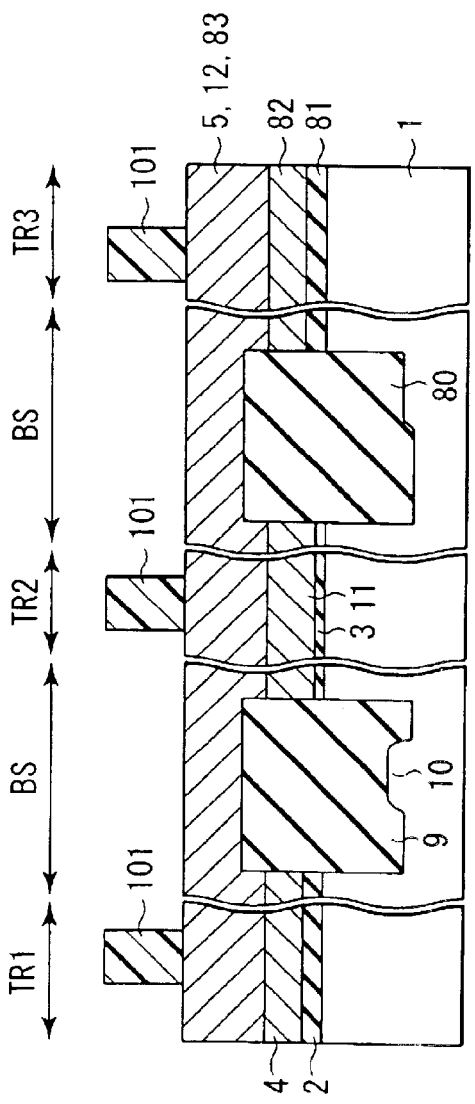

Next, structures shown in FIGS. 34A and 34B are formed by steps similar to the steps shown in FIGS. 5C to 8. A photoresist 101 is then used as a gate electrode formation mask to process the gate electrodes in the same manner as in the step explained with reference to FIG. 1A. Since the lower electrode layers 11 and 82 are the same layer in the boundary area BS between the second and third transistor regions TR2 and TR3, no film thickness difference is produced in this boundary area BS. Hence, the bottom of a device isolation region 80 has a step corresponding to the difference between the second and third gate insulating films. That is, that portion of this device isolation region 80 in the boundary area BS, which is adjacent to the thick third transistor is shallower than that portion of the device isolation region 80, which is adjacent to the second transistor. In addition, although not shown, interlayer dielectric films, contact plugs, interconnections, and the like are formed to complete the semiconductor device.

In contrast to the fabrication method of the semiconductor device shown in FIG. 27A, in the fabrication method of the semiconductor device shown in FIG. 27B, the lower electrode layer 11 in the second transistor region TR2 and the lower electrode layer 82 of the third transistor region TR3 are simultaneously deposited. Since this omits a step of removal, the fabrication process can be simplified.

The structure of the boundary area BS of separate formation is not restricted to the structures shown in FIGS. 27A and 27B; it is possible to use other structures explained in the first and second embodiments or combine a plurality of different structures. Furthermore, four or more types of gate insulating films and gate electrodes can be separately formed by the use of the method of this embodiment. In addition, since only a gate insulating film of a high-voltage type transistor is directly coated with a photoresist, the number of the steps of separate formation can be reduced without impairing the reliability of a memory cell.

(Fourth Embodiment)

Figure 35:
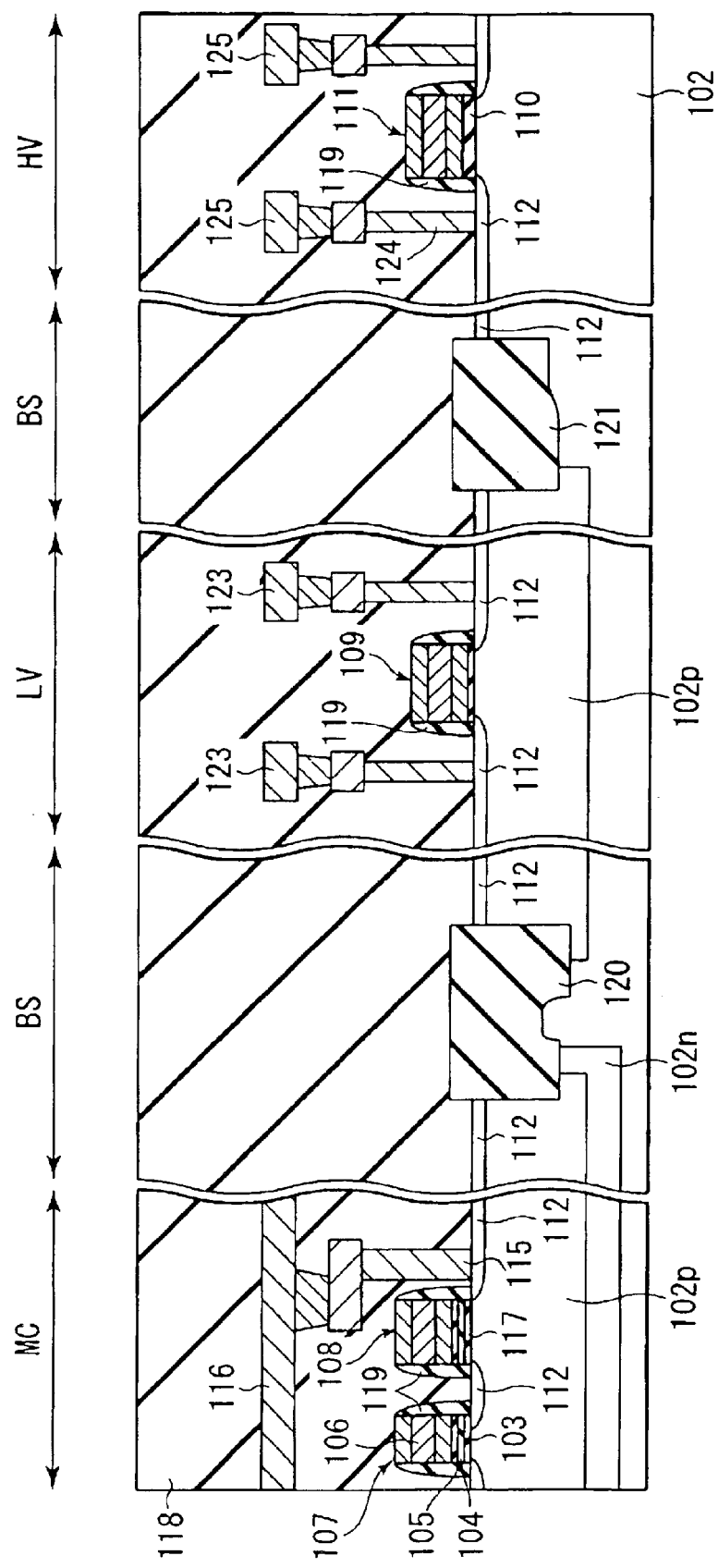
FIG. 35 is a sectional view showing boundary areas and their vicinities of a semiconductor device according to the fourth embodiment of the present invention.
Figure 36:
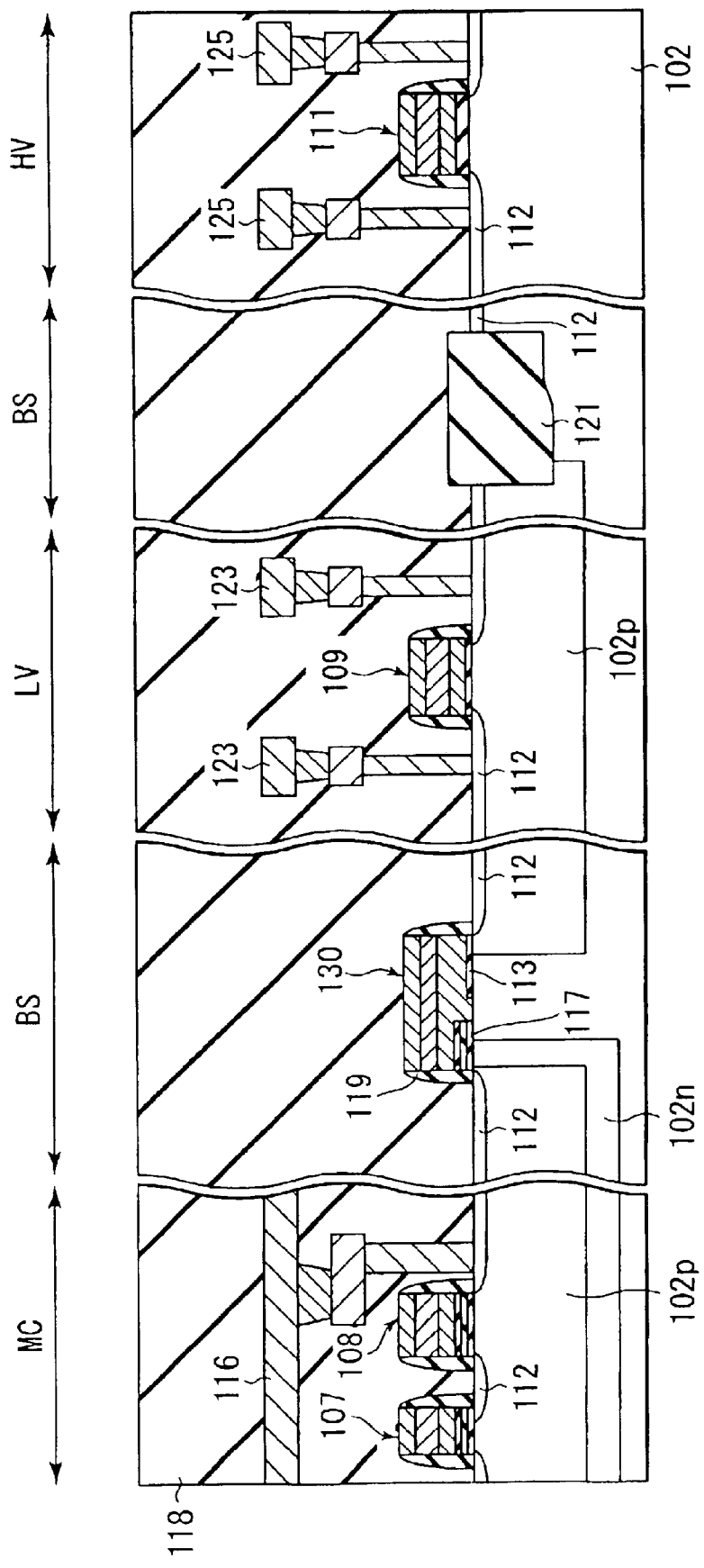
FIGS. 36 and 37 are sectional views showing boundary areas and their vicinities of semiconductor devices according to modifications of the fourth embodiment.
Figure 37:
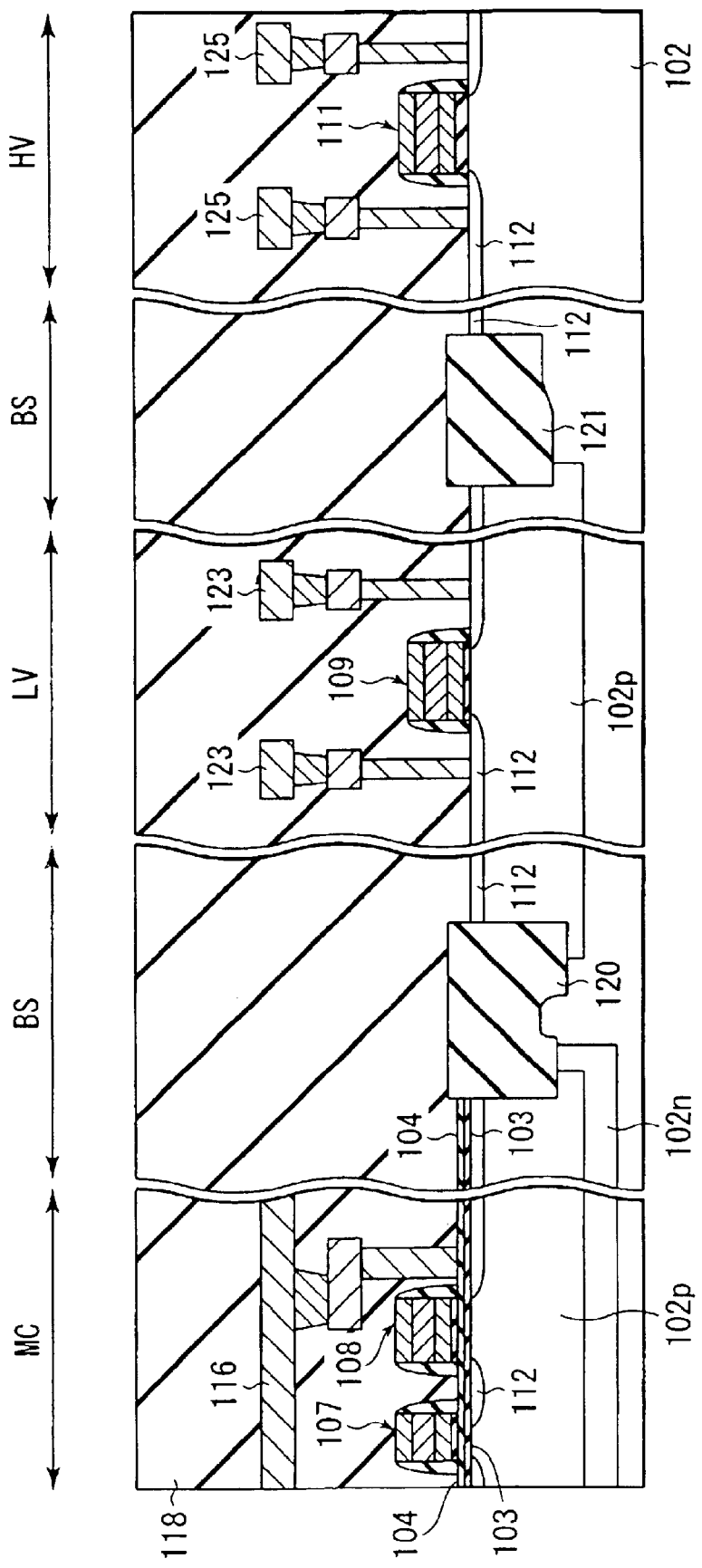

A semiconductor device of this embodiment is applied to a NAND EEPROM, NOR EEPROM, AND EEPROM, or Virtual Ground Array EEPROM each having a MONOS cell structure as a nonvolatile memory. FIGS. 35 to 37 are sectional views showing boundary areas BS of separate formation and their vicinities according to this embodiment.

Figure 38:
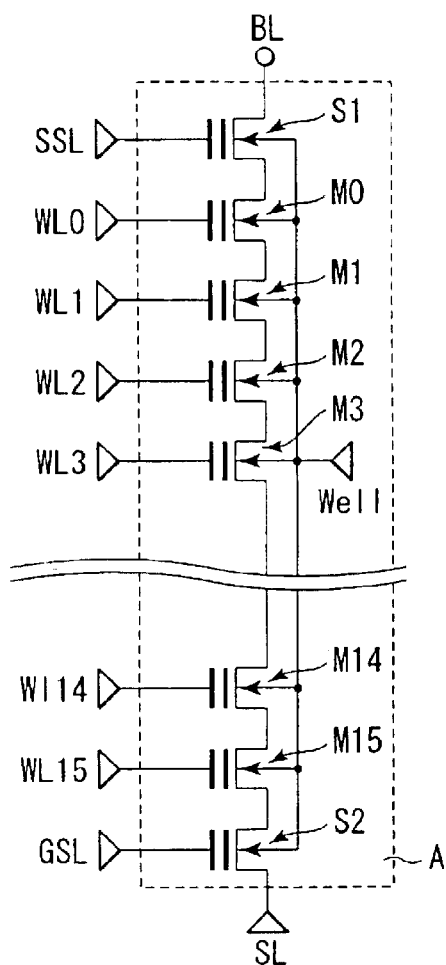
FIGS. 38 and 39 are different equivalent circuit diagrams showing NAND MONOS memory cells of the semiconductor device according to the fourth embodiment.

FIG. 38 is an equivalent circuit diagram of a NAND memory cell block in which a plurality of memory cells are arranged in series between selection transistors. That is, nonvolatile memory cells M0 to M15 are connected in series. One end of the memory cell M0 is connected to a data transfer line BL via a selection transistor S1. One end of the memory cell M15 is connected to a common source line SL via a selection transistor S2.

The control electrodes of these memory cells M0 to M15 are connected to data transfer lines WL0 to WL15, respectively. To select one of a plurality of memory cell blocks arranged along the data transfer line and connect this selected memory cell block to the data transfer line, the control electrode of the selection transistor S1 is connected to a block select line SSL. In addition, the control electrode of the selection transistor S2 is connected to a block select line GSL. In this manner, a NAND memory cell block A is formed in a region indicated by the dotted lines.

Figure 39:
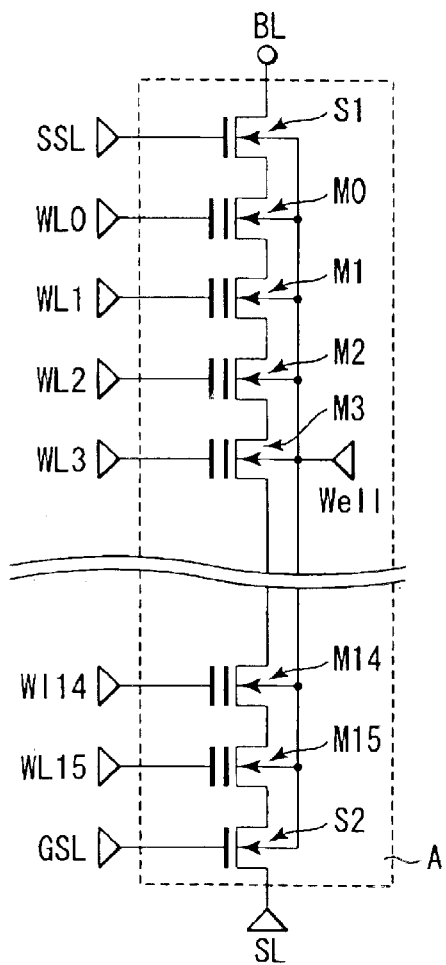

Referring to FIG. 38, 16 memory cells are connected in the memory cell block A. However, the number of memory cells to be connected to the data transfer line and data select line need only be a plural number, and is preferably $2^n$ (n is a positive integer) in order to perform address decoding. Also, the same structure as the memory cell transistor need not be used as the selection transistor. As shown in FIG. 39, common MOS transistors can be used as the selection transistors S1 and S2.

A MONOS nonvolatile memory includes at least three types of transistors: a MONOS transistor forming a memory cell, a MOS transistor (to be referred to as an LV transistor hereinafter) which forms a low-voltage peripheral circuit and has a relatively thin gate oxide film, and another MOS transistor (to be referred to as an HV transistor hereinafter) which forms a high-voltage peripheral circuit and has a relatively thick gate oxide film. The MONOS memory cell and the LV transistor are separately formed by the method according to the first to third embodiments, and their boundary area BS has a shape shown in FIG. 35, for example. However, as explained in the first to third embodiments, it is possible to arbitrarily combine the presence/absence of overlapping, the presence/absence of a device isolation trench, and the presence/absence of removal of the gate electrode in the boundary area BS.

In the semiconductor device having the sectional view shown in FIG. 35, a memory cell region MC, a low-voltage (LV) transistor region LV, a high-voltage (HV) transistor region HV, and boundary areas BS between them are formed on a p-semiconductor substrate 102, which contains boron at an impurity concentration of, e.g., $10^{14}$ to $10^{19}$ cm$^{-3}$. In this substrate 102, an n-well 102$n$ and a p-well 102$p$ are formed. When the p-well 102$p$ is thus formed in the n-well 102$n$, a voltage can be applied to the p-well 102$p$ independently of the p-semiconductor substrate 102. Consequently, it is possible to reduce the booster circuit load during erasure and reduce the power consumption.

In the memory cell region MC, a charge storage layer 104 is formed via a tunnel gate insulating film 103. This tunnel gate insulating film 103 is, e.g., a 1- to 10-nm thick silicon oxide film or oxynitride film. The charge storage layer 104 is made of, e.g., 3- to 5-nm thick SiN or SiON. On top of this charge storage layer 104, a block insulating film 105 which is, e.g., a 2- to 10-nm thick silicon oxide film.

A 10- to 500-nm thick control gate 106 is formed on this block insulating film 105, thereby forming a memory cell gate 107 and a selector gate 108. The control gate 106 has a stacked structure of polysilicon or WSi (tungsten silicide) and polysilicon, a stacked structure of NiSi, MoSi, TiSi, or CoSi and polysilicon, a stacked structure of a metal and polysilicon, or a single-layered structure of a metal compound of silicon or a metal. A mask insulating film which is a silicon oxide film or silicon nitride film having a thickness of about 10 to 300 nm is formed on the control gate 106.

In the LV transistor region LV, an LV gate insulating film 113 is formed on the substrate 102, and an LV gate 109 is formed on this LV gate insulating film 108. In the HV transistor region HV, an HV gate insulating film 110 is formed on the substrate 102, and an HV gate 111 is formed on this HV gate insulating film 110.

On the two sides of the gate electrode in each of these regions MC, LV, and HV, a side-wall insulating film 119 which is, e.g., a 5- to 200-nm thick silicon nitride film or silicon oxide film is formed. Also, source/drain diffusion layers 112 as n-diffusion layers are formed on the surface of the substrate 102. These source/drain diffusion layers 112 and the memory cell gate 107 form a MONOS nonvolatile EEPROM cell. The gate length of the charge storage layer is, e.g., 0.01 to 0.5 $\mu$m.

These source/drain diffusion layers 112 are formed to a depth of, e.g., 10 to 500 nm by using phosphorus, arsenic, or antimony such that the surface concentration is $10^{17}$ to $10^{21}$ cm$^{-3}$. Furthermore, these source/drain diffusion layers 112 are connected in series between memory cells to realize a NAND connection. A source/drain diffusion layer 112 at one end of the selector gate 108 is connected to a data transfer line 116 via a contact plug 115.

The selector gate 108 is formed by the same layers as the control gate 106 of the memory cell gate 107. The contact plug is filled with n- or p-doped polysilicon or tungsten, and tungsten, Al, TiN, or Ti, and functions as a conductor region. The data transfer line 116 is made of tungsten, tungsten silicide, titanium, titanium nitride, or aluminum.

The selector gate 108 opposes the substrate 102 via a gate insulating film 117 having the same structure as the charge storage layer 104 of the memory cell gate 107, thereby forming a selection transistor. The gate length of the selector gate 108 is larger than that of the memory cell gate and is, e.g., 0.02 to 1 $\mu$m. This ensures a high ON/OFF ratio between block selection and non-selection, and prevents write and read errors.

These elements are filled with an SiO$_2$ or SiN interlayer 118. On top of this interlayer 118, an insulating film protective layer (not shown) made of, e.g., SiO$_2$, SiN, or polyimide and an upper interconnection (not shown) made of, e.g., W, Al, or Cu are formed.

Between the memory cell region MC and the LV transistor region LV, a first device isolation region 120 having the structure as shown in FIG. 1A is formed. Between the LV transistor region LV and the HV transistor region HV, a second device isolation region 121 having the structure as shown in FIG. 27B is formed.

Contact plugs 122 are connected to the source/drain diffusion layers 112 in the LV transistor region LV. These contact plugs 122 are connected to interconnections 123. Also, contact plugs 124 are connected to the source/drain diffusion layers 112 in the HV transistor region HV. These contact plugs 124 are connected to interconnections 125.

Since this embodiment uses a MONOS EEPROM cell, the write voltage and erase voltage can be made lower than those in a floating gate type EEPROM to be described later. Therefore, in the peripheral circuit transistors, the breakdown voltage can be maintained even if the gate insulating film is thinned by narrowing the device isolation spacing.

This can reduce the surface area of a circuit to which a high voltage is applied and can further reduce the chip area. Furthermore, compared to a floating gate type memory cell, the thickness of the charge storage layer 104 can be decreased to 20 nm or less. Since this reduces the aspect ratio during gate formation, it is possible to improve the gate electrode processing shape and the inter-gate filling characteristics of the interlayer 118. This improves the breakdown voltage.

Also, a process for forming a floating gate electrode and a slit formation process are unnecessary, so the fabrication process can be further shortened. In addition, the charge storage layer 104 is an insulator, and electric charge is trapped in each individual charge trap. This gives high resistance to this charge storage layer 104 because electric charge is not easily extracted by radiation. Furthermore, even when the side-wall insulating film of the charge storage layer 104 is thinned, electric charge trapped in this charge storage layer 104 is not entirely extracted. This maintains good holding characteristics.

The selection transistor shown in FIG. 35 has the same MONOS structure as the memory cell transistor. In this case, steps for separately forming these selection transistor and memory cell transistor can be omitted, so the fabrication cost is reduced. In addition, since no margin for separate formation need be formed, the distance between the selection transistor and the memory cell can be decreased. This can reduce the device area.

In the structure shown in FIG. 35, no gate insulating film is present on the substrate 102 on which no gate is formed.

FIG. 36 shows a modification of the structure shown in FIG. 35. In this modification, instead of the first device isolation region 120 shown in FIG. 35, a gate structure 130 is formed in a boundary area BS between a memory cell region MC and an LV transistor region LV. On a substrate 102 in this gate structure 130, a gate insulating film 117 of a selector gate 108 is formed on a side close to the memory cell region MC, and an LV gate insulating film 113 is formed on a side far from the memory cell region MC. Between the gate insulating film 117 and the LV gate insulating film 113, a gate electrode material is formed in direct contact with the substrate 102. An insulating film 119 is formed on the side walls of this gate structure. The gate structure 130 is formed by the same method as for forming the electrode layer 53 in the boundary area BS shown in FIG. 15B, by changing the compositions of the insulating film and conductor.

FIG. 37 shows another modification of the structure shown in FIG. 35. This structure is the same as the structure shown in FIG. 35 except that when a gate electrode close to a memory cell region MC is processed, a gate insulating film is not simultaneously processed but is left behind. That is, in the memory cell region MC and its adjacent boundary area BS, a tunnel gate insulating film 103 and a charge storage layer 104 are formed on the surface of a semiconductor substrate.

As the structure of the boundary area BS between the memory cell region MC and an LV transistor region LV shown in FIG. 37, structures shown in FIGS. 40A to 40H can be used. These structures can also be applied to a boundary area BS between the memory cell region MC and an HV transistor region HV by switching an LV gate insulating film and an HV gate insulating film. That is, the structures shown in FIGS. 40A to 40H are applicable to a boundary area BS in a NAND MONOS semiconductor memory.

In each boundary area BS, the substrate 102 can be exposed without forming any gate insulating film. This structure can be applied to the boundary areas BS in the semiconductor devices shown in FIGS. 35 and 36. Each boundary area BS can have a structure in which no diffusion layers 112 are formed. Also, the individual boundary structures of separate formation can be the same structure or can be different structures in different places.

Figure 40A:
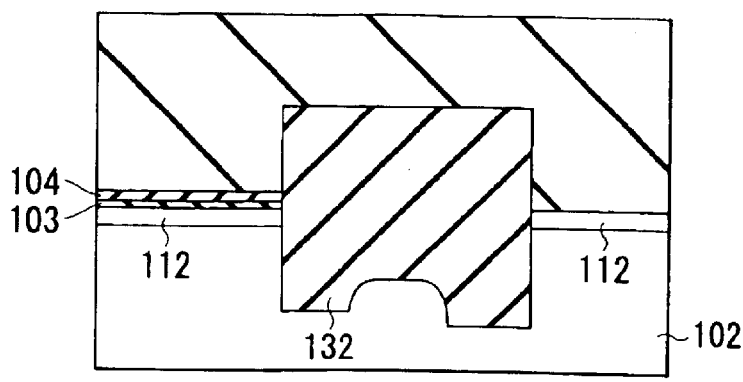
FIGS. 40A to 40H are sectional views showing structures usable as a boundary area between a memory cell region and an LV transistor region in the device shown in FIG. 37.

In the boundary area BS shown in FIG. 40A, a device isolation region 132 similar to the structure shown in FIG. 1A is formed in a substrate 102. On the memory cell region MC side of this device isolation region 132, a tunnel gate insulating film 103 and a charge storage layer 104 are formed. On the two sides of the device isolation region 132, source/drain diffusion layers 112 are formed in the substrate 102. Steps including a projection projecting upward are formed on the bottom of the trench of the device isolation region 132. By using the structure of this boundary area BS, it is possible to improve the STI filling properties, prevent dishing, and reduce the area.

Figure 40B:
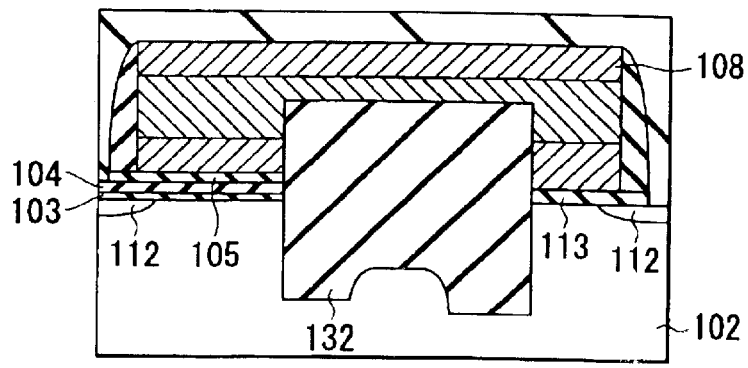

In the boundary area BS shown in FIG. 40B, the same gate structure as the selector gate 108 is formed to cover the device isolation region 132 in the structure shown in FIG. 40A. By using the structure of this boundary area BS, it is possible to improve the STI filling properties, prevent dishing, and facilitate gate processing.

Figure 40C:
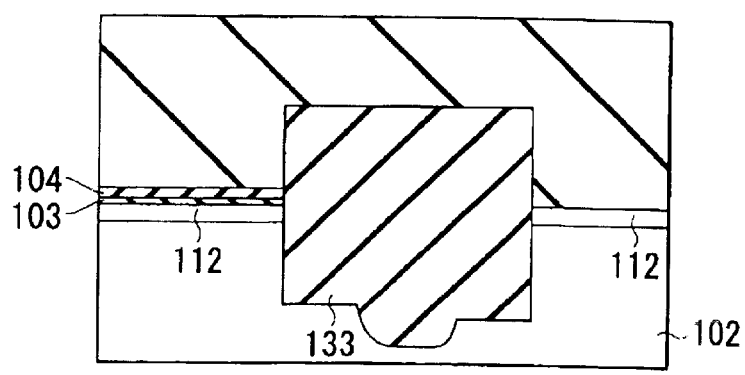

In the boundary area BS shown in FIG. 40C, a device isolation region 133 similar to the structure shown in FIG. 14A is formed in place of the device isolation region 132 shown in FIG. 40A. By the use of the structure of this boundary area BS, it is possible to improve the STI breakdown voltage and reduce the area.

Figure 40D:
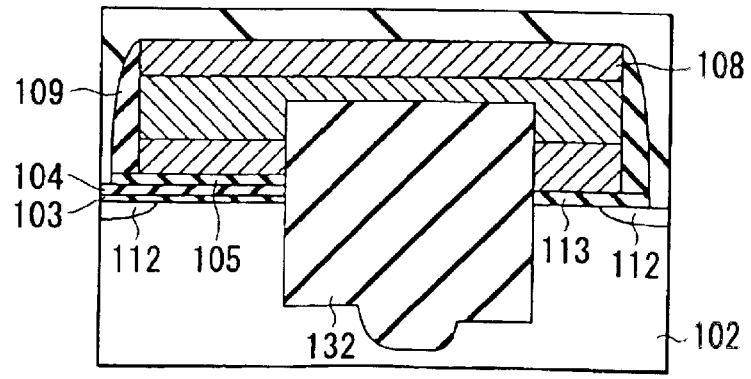

In the boundary area BS shown in FIG. 40D, a device isolation region 132 is formed in place of the device isolation region 133 shown in FIG. 40C in the structure shown in FIG. 40B. By the use of the structure of this boundary area BS, it is possible to improve the STI breakdown voltage and facilitate gate processing.

Figure 40E:
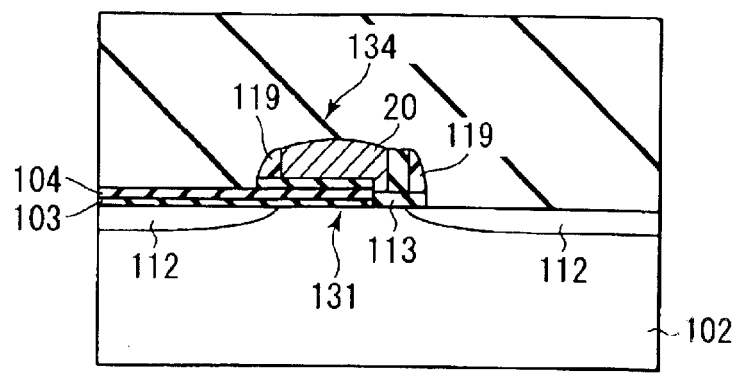

In the boundary area BS shown in FIG. 40E, a structure analogous to the structure shown in FIG. 2A is formed. On a substrate 102 in the center of this boundary area BS, a gate structure 134 is formed by the constituent materials of the gate structures in a memory cell region MC and an LV transistor region LV. On the substrate 102 in this gate structure 134, an ONO film 131 is formed on the side of the memory cell region MC, and an LV gate insulating film 113 is formed on the side of the LV transistor region LV. An electrode layer 20, a side-wall insulating film 119, and the like are formed on the ONO film 131 and the insulating film 113. On the substrate 102 from the gate structure 134 to the memory cell region MC, a tunnel gate insulating film 103 and a charge storage layer 104 are formed. On the two sides of the gate structure 134, source/drain diffusion layers 112 are formed in the substrate 102. By using the structure of this boundary area BS, it is possible to facilitate gate processing and avoid defects caused by STI.

Figure 40F:
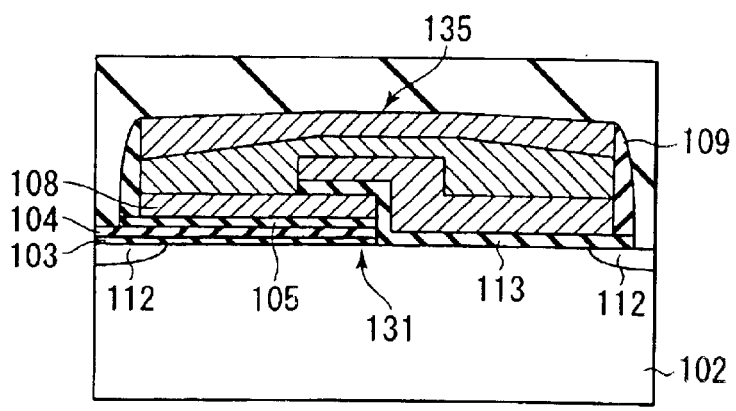

The boundary area BS shown in FIG. 40F has a structure similar to that shown in FIG. 2B. On a substrate 102 in the center of this boundary area BS, a gate structure 135 formed by the constituent materials of gate structures in a memory cell region MC and an LV transistor region LV is formed. On the substrate 102 in this gate structure 135, an ONO film 131 is formed on the side of the memory cell region MC, and an LV gate insulating film 113 is formed on the side of the LV transistor region LV. On the ONO film 131, the same stacked gate structure as a control gate 108 is formed. On the LV gate insulating film 113, a lower structure of an LV gate 109 is formed. An insulating film 119 is formed on the side surfaces of this gate structure 135. By the use of the structure of this boundary area BS, it is possible to reduce dust and avoid defects caused by STI.

Figure 40G:
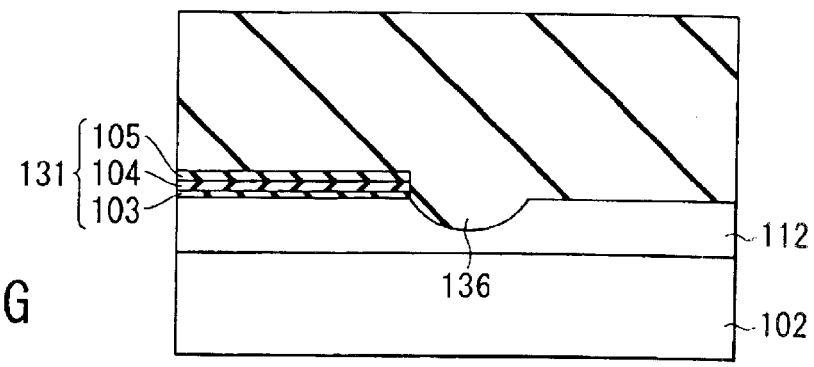

The boundary area BS shown in FIG. 40G has a structure similar to that shown in FIG. 15A. A recess 136 is formed in the surface of a substrate 102 in the center of this boundary area BS. On the substrate 102 from this recess 136 toward a memory cell region MC, a tunnel gate insulating film 103 and a charge storage layer 104 are formed. By the use of the structure of this boundary area BS, it is possible to reduce dust and avoid defects caused by STI.

Figure 40H:
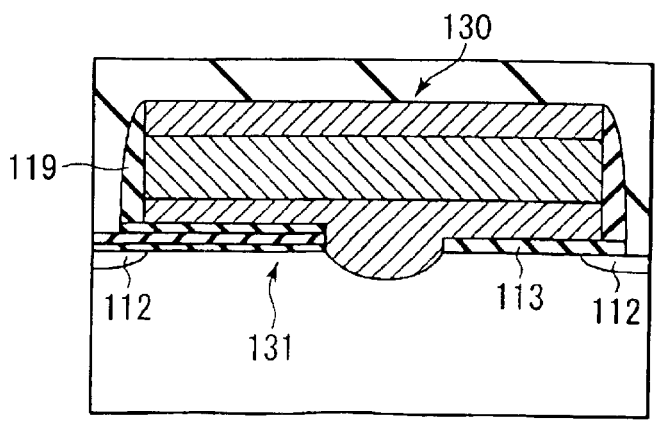

The boundary area BS shown in FIG. 40H has a structure similar to the gate structure 130 shown in FIG. 15B. Although a recess is formed in the surface of a semiconductor substrate 102 at the center of the boundary area, the center can be flat as shown in FIG. 15B. In this gate structure, an electrode layer is in direct contact with the surface of the substrate 102 without any insulating film between them. By using the structure of this boundary area BS, it is possible to facilitate gate processing, reduce dust, avoid defects caused by STI, and match the aspect ratios.

FIG. 41A shows a sectional view, on the gate of the memory cell, taken along a direction perpendicular to the data transfer line. FIG. 41B shows a sectional view, on the gate of the peripheral transistor, taken along a direction perpendicular to the data transfer line.

As shown in FIGS. 41A and 41B, the side surfaces of the substrate 102 and gate insulating films are covered with a device isolation region 300. Therefore, it is possible to prevent the gate electrode 106 from coming lower than the surface of the substrate 102, while the ends of the device isolation region are not exposed by etching before the formation of the gate insulating film 103, in both the memory cell and the peripheral transistor. This is so because this structure is formed by a self-aligned STI method. This makes electric filed concentration or a parasitic transistor having a decreased threshold value difficult to form in the boundary between the device isolation region 300 the tunnel gate insulating film 103. In addition, a sidewalk phenomenon which is a lowering of the write threshold value resulting from a bird beak does not easily occur. Accordingly, a highly reliable transistor can be formed.

FIG. 42 shows an equivalent circuit diagram of NOR MONOS memory cells. The sources and drains of memory cells M01, M02, M11, M12, M21, and M22 are connected between data transfer lines BL1 and BL2 and a source line SL. Data select lines WL0, WL1, and WL2 are connected to the gates of these memory cells. The above-mentioned structures of this embodiment can be properly changed and applied to NOR MONOS memory cells like these.

FIG. 43 shows an equivalent circuit diagram of an AND MONOS memory cell block in which a plurality of memory cells are arranged in series between selection transistors. Nonvolatile memory cells M0 to M15 are connected in parallel. One end of these memory cells M0 to M15 is connected to a data transfer line BL via a selection transistor S1. The other end of each of the memory cells M0 to M15 is connected to a common source line SL via a selection transistor S2.

The control electrodes of these memory cells M0 to M15 are connected to data transfer lines WL0 to WL15, respectively. To select one of a plurality of memory cell blocks arranged along the data transfer line and connect this selected memory cell block to the data transfer line, the control electrode of the selection transistor S1 is connected to a block select line SSL. In addition, the control electrode of the selection transistor S2 is connected to a block select line GSL. In this manner, a NAND memory cell block B is formed in a region indicated by the dotted lines.

Referring to FIG. 43, 16 memory cells are connected in the memory cell block B. However, the number of memory cells to be connected to the data transfer line and data select line need only be a plural number, and is preferably $2^n$ (n is a positive integer) in order to perform address decoding. Also, the same structure as the memory cell transistor need not be used as the selection transistor. As shown in FIG. 44, for example, common MOS transistors can be used as the selection transistors S1 and S2.

The aforementioned structures of this embodiment can be properly changed and applied to an AND MONOS memory cell block like this.

An example of a method of fabricating the nonvolatile semiconductor memory of this embodiment shown in FIG. 35 will be explained below with reference to FIGS. 45A to 48C. First, a sacrificial oxide film (not shown) is formed on the surface of a semiconductor substrate 102. After a well impurity and a channel impurity are implanted as needed, this sacrificial oxide film is removed.

Figure 45A:
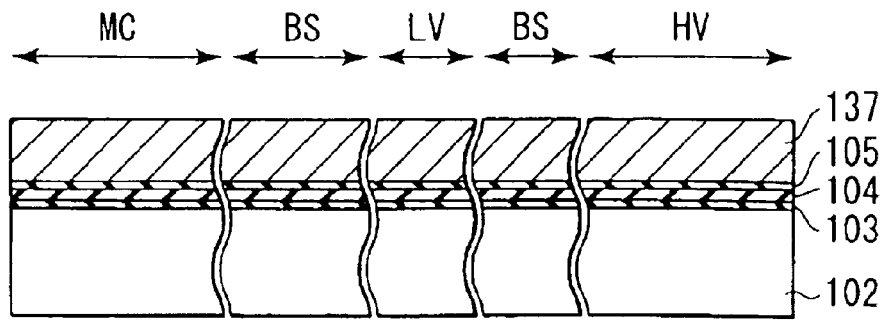
FIGS. 45A to 45C, 46A to 46C, 47A to 47C, and 48A to 48C are sectional views showing a method of fabricating the structure shown in FIG. 35.

Subsequently, as shown in FIG. 45A, a 1- to 10-nm thick tunnel gate insulating film 103 such as a silicon oxide film or oxynitride film is formed. Then, a 3- to 50-nm thick charge storage layer 104 made of, e.g., SiN or SiON is formed. A block insulating film 105 which is a silicon oxide film having a thickness of, e.g., 2 to 10 nm is formed. On top of this block insulating film 105, a 10- to 500-nm thick polysilicon layer 137 is deposited.

Figure 45B:
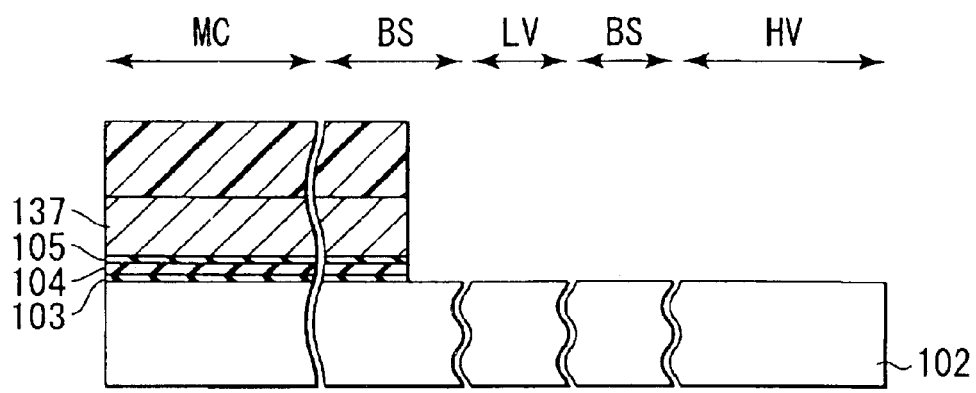
Figure 45C:
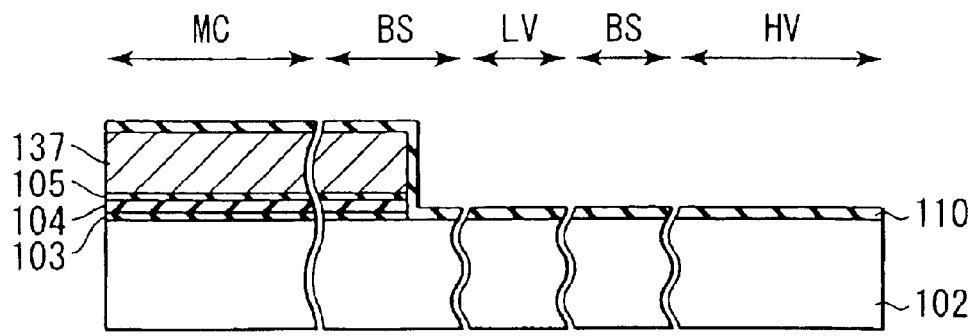

As shown in FIG. 45B, a region to be a memory cell region MC is covered with a photoresist layer 138, and the polysilicon layer 137, the block insulating film 105, the charge storage layer 104, and the tunnel gate insulating film 103 in other regions are removed. The method of removal can be either isotropic etching such as wet etching or anisotropic etching such as RIE. Next, as shown in FIG. 45C, a 5- to 50-nm thick HV-transistor gate insulating film 110 such as a silicon oxide film or oxynitride film is formed on the entire surface of the semiconductor substrate 102.

Figure 46A:
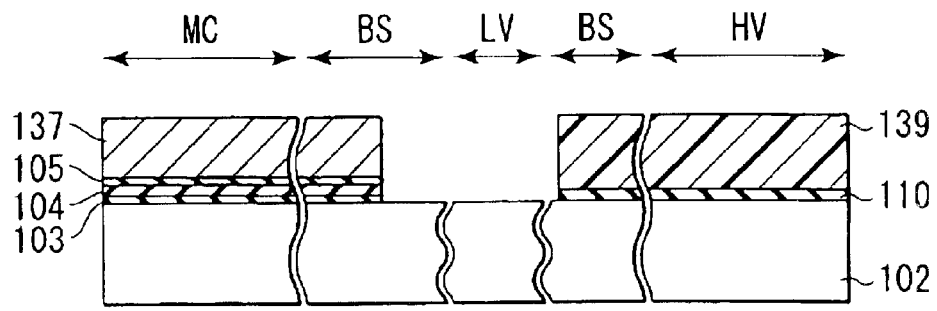
Figure 46B:
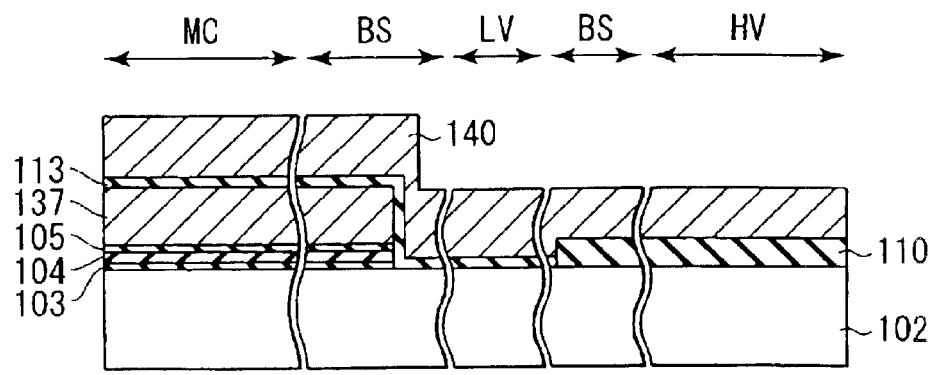

As shown in FIG. 46A, an HV transistor region HV is covered with a photoresist layer 139, and the HV-transistor gate insulating film 110 in other regions is removed. As shown in FIG. 46B, the photoresist layer 139 is removed, a 1- to 10-nm thick LV gate insulating film 113 which is a silicon oxide film or oxynitride film is formed on the entire surface of the semiconductor substrate 102, and an HV gate insulating film 110 is formed to have a predetermined film thickness. A polysilicon layer 140 having a thickness of, e.g., 10 to 500 nm is deposited via this HV gate insulating film 110.

In this state, the memory cell region MC has a stacked structure in which the LV-transistor gate insulating film 113 and the polysilicon layer 140 are formed on the polysilicon layer 137 of the memory cell. The gate electrodes of the memory cell and the LV transistor can be different in material and film thickness. However, if the materials and film thicknesses of these gate electrodes are the same, the gate electrodes are readily etched at the same time.

Figure 46C:
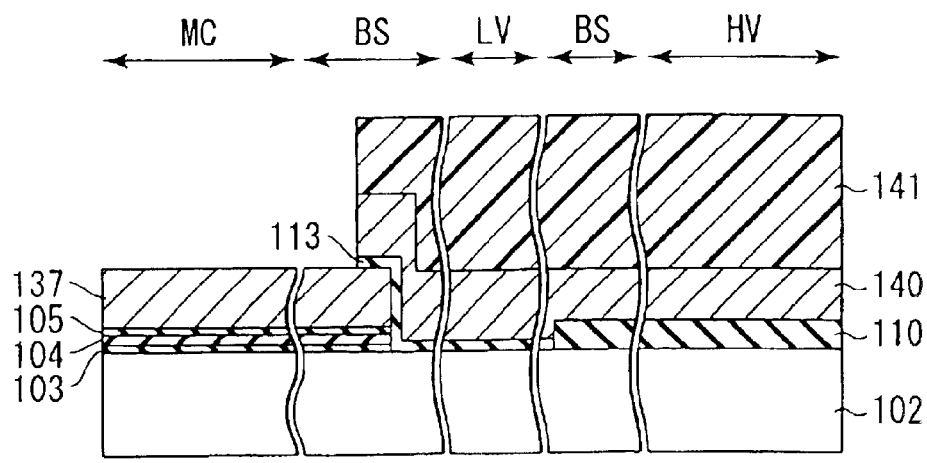

Next, as shown in FIG. 46C, the LV and HV transistor regions (peripheral circuit regions) are covered with a photoresist layer 141, and the polysilicon layer 140 and the LV gate insulating film in other regions are removed. The method of removal can be either isotropic etching such as wet etching or anisotropic etching such as RIE. Etching is so performed that a portion of the photoresist layer 141 reaches the memory cell region MC. Accordingly, the gate electrode stacked structure remains as it is in a boundary area BS of separate formation between the memory cell region MC and the peripheral circuit region.

Figure 47A:
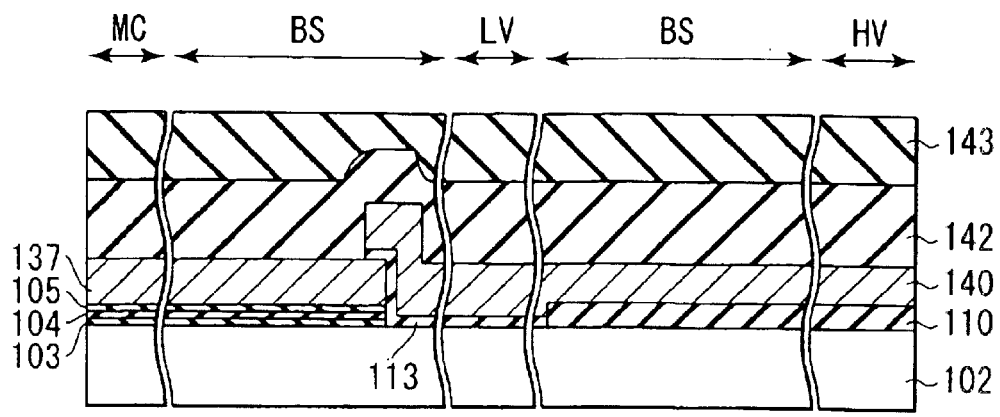
Figure 47B:
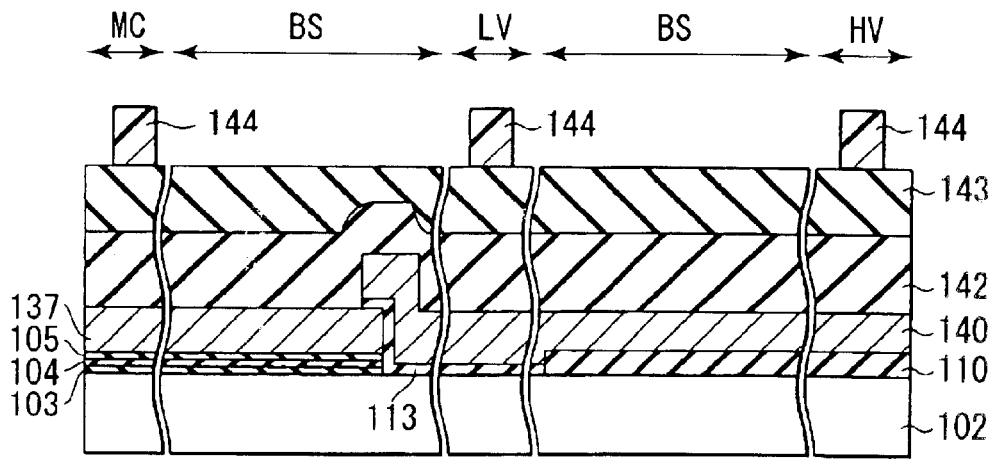

Subsequently, the photoresist layer 141 is removed, and, as shown in FIG. 47A, first and second mask layers 142 and 143 are deposited. The first mask layer 142 is, e.g., a silicon nitride film, and the second mask layer 143 is, e.g., a silicon oxide film. As shown in FIG. 47B, a photoresist layer 144 for forming device isolation regions is deposited, and device isolation patterns are formed. In the following description, a method of forming device isolation regions in the boundary areas BS of separate formation without leaving resists in those portions will be explained.

Figure 47C:
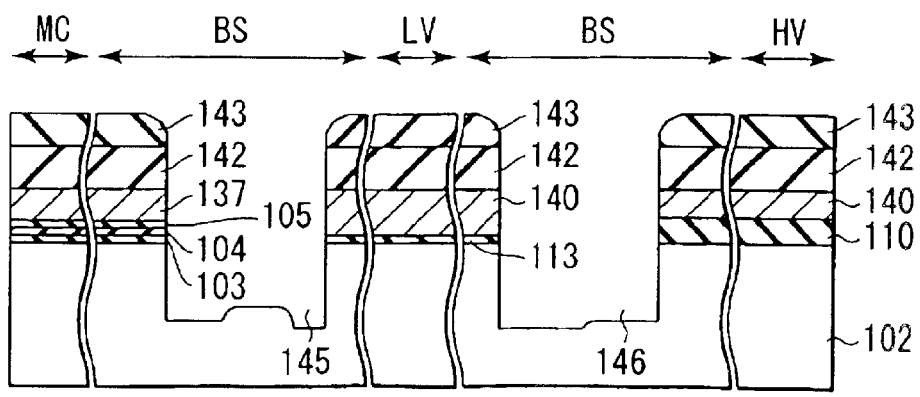

As shown in FIG. 47C, the photoresist layer 144 and the first and second mask layers 142 and 143 are removed by anisotropic etching, and then the polysilicon layer 140 is removed by anisotropic etching. Subsequently, to form device isolation regions, the semiconductor substrate 102 is etched to form device isolation trenches 145 and 146. The depth of these device isolation trenches 145 and 146 is, e.g., about 50 to 300 nm.

In the boundary area BS of separate formation between the memory cell region MC and the LV transistor region LV, the step produced in FIG. 46B remains in FIG. 47B and forms an upward projection on the bottom of the device isolation region. Although the height of this projection depends upon the step shown in FIG. 46B and the etching conditions, this height is, e.g., about 10 to 300 nm, and desirably, about 30 to 100 nm. The depth of the device isolation trench also depends upon a region in contact with the trench. This depth reflects the differences between the ONO film thickness in the memory cell region MC, the gate insulating film thickness in the LV transistor region LV, and the gate insulating film thickness in the HV transistor region HV; the thinner the gate insulating film, the deeper the device isolation trench. In the boundary area BS of separate formation between the LV transistor region LV and the HV transistor region HV, the depth of the bottom of the device isolation trench 146 changes from one place to another, since the step produced in FIG. 46B remains in FIG. 47B.

Figure 48A:
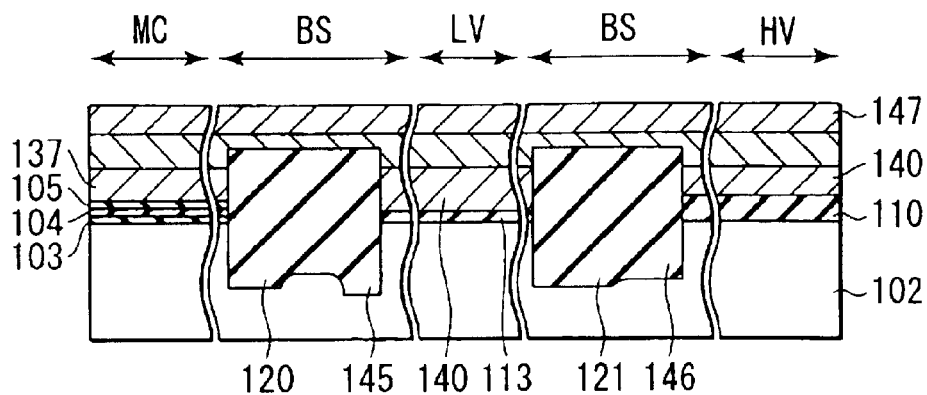

Next, as shown in FIG. 48A, the device isolation trenches 145 and 146 are filled with an insulating film such as a silicon oxide film, and this buried material is etched back by a method such as CMP by using the first mask layer 142 as a stopper. Since the device isolation regions in the boundary areas BS are deep, the filling properties are excellent. After etch back, therefore, the upper portion of the device isolation insulating film is almost flat. After the first mask layer 142 is removed, a gate electrode layer 140 is deposited on the entire exposed surface. This gate electrode layer 140 is a polysilicon film, a stacked film of polysilicon and a metal or a silicon and metal compound, or a single-layered film of a metal or a silicon and metal compound. A mask insulating film 147 which is a silicon oxide film or silicon nitride film having a thickness of about 10 to 300 nm is further deposited.

Figure 48B:
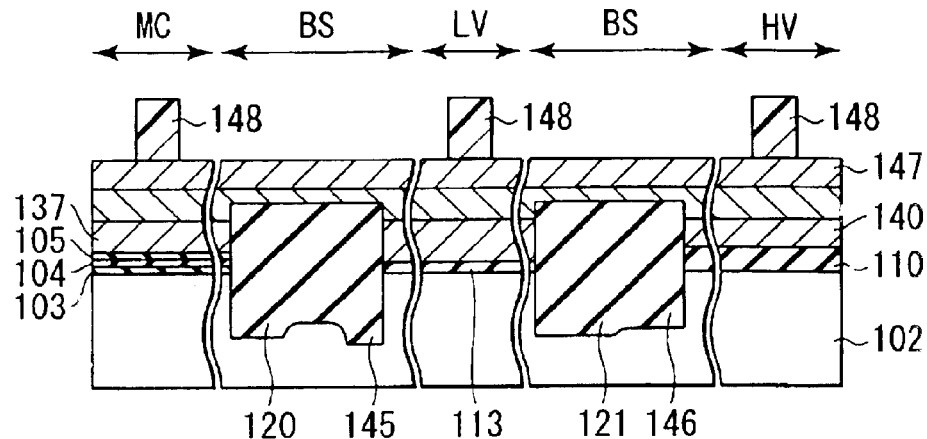
Figure 48C:
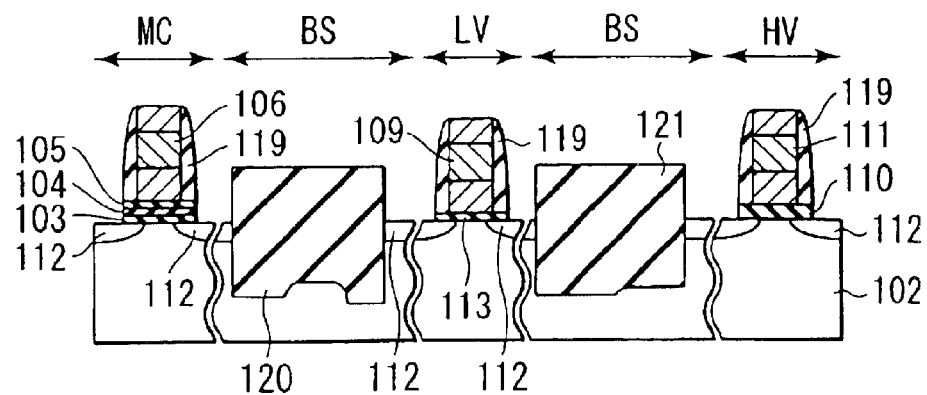

As shown in FIG. 48B, a photoresist layer 148 for processing the gate electrodes is deposited and patterned. Subsequently, as shown in FIG. 48C, the photoresist layer 148 is used as a mask to anisotropically etch the gate electrodes. After that, damage by the processing is recovered by post-oxidation or the like. A gate side-wall insulating film 119 is formed if necessary, and a diffusion layer impurity is implanted to form source/drain diffusion layers 112.

In this case, no resist is left behind in the boundary areas BS, and the gate electrodes are removed from the boundary areas BS. Note that it is also possible to deposit a mask layer such as a silicon nitride film or silicon oxide film on the gate electrode layers and process the gate electrode layers by using this mask layer. After that, although not shown, interlayer dielectric films, contact plugs, interconnections, and the like are formed to complete the semiconductor device as shown in FIG. 35.

It is also possible to form a twin-well structure in which a first well having a conductivity type opposite to that of a semiconductor substrate is formed on the semiconductor substrate, and a second well having the same conductivity type as the semiconductor layer is formed on the first well.

In this embodiment, it is possible to obtain the same effects as in the first to third embodiments. In addition, the transistors forming the peripheral circuit are exemplified by two types of transistors having the MOS structure and differing in gate oxide film thickness. Note that this embodiment is also applicable to a case in which transistors forming the peripheral circuit have three or more different gate oxide film thicknesses.

(Fifth Embodiment)

A semiconductor device of this embodiment is applied to a NAND EEPROM, NOR EEPROM, AND EEPROM, or Virtual Ground Array EEPROM each having a MONOS cell structure as a nonvolatile memory. A floating gate type nonvolatile memory requires at least three types of transistors: a memory cell transistor forming a memory cell, a MOS transistor (to be referred to as an LV transistor hereinafter) forming a low-voltage peripheral circuit and having a relatively thin gate oxide film, and a MOS transistor (to be referred to an HV transistor hereinafter) forming a high-voltage peripheral circuit and having a relatively thick gate oxide film.

In this embodiment, it is possible to directly apply the configuration of the equivalent circuit of the NAND memory cell shown in FIG. 38 or 39, the configuration of the equivalent circuit of the NOR memory cell shown in FIG. 42, and the configuration of the equivalent circuit of the AND memory cell shown in FIG. 43 or 44.

Figure 49:
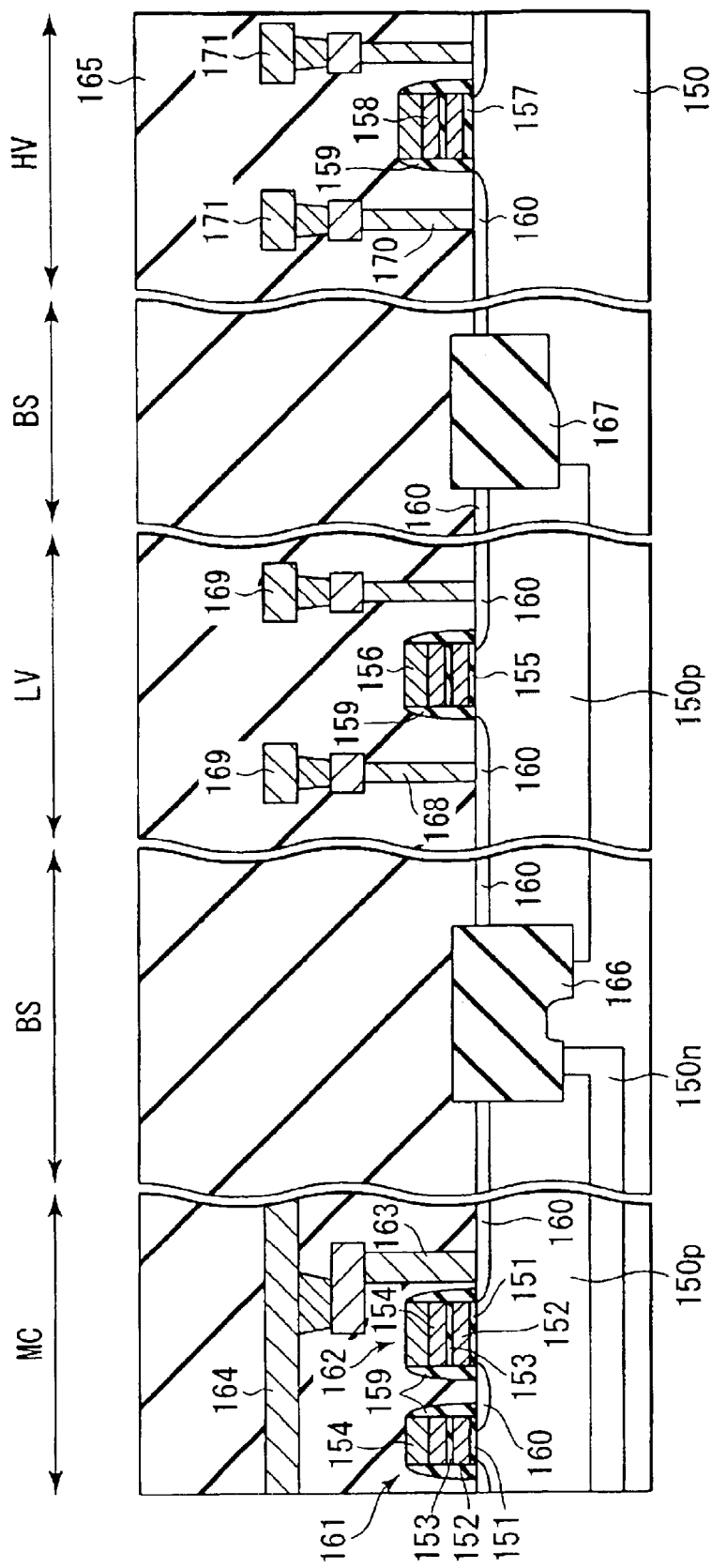
FIG. 49 is a sectional view showing boundary areas and their vicinities of a semiconductor device according to the fifth embodiment of the present invention.
Figure 50:
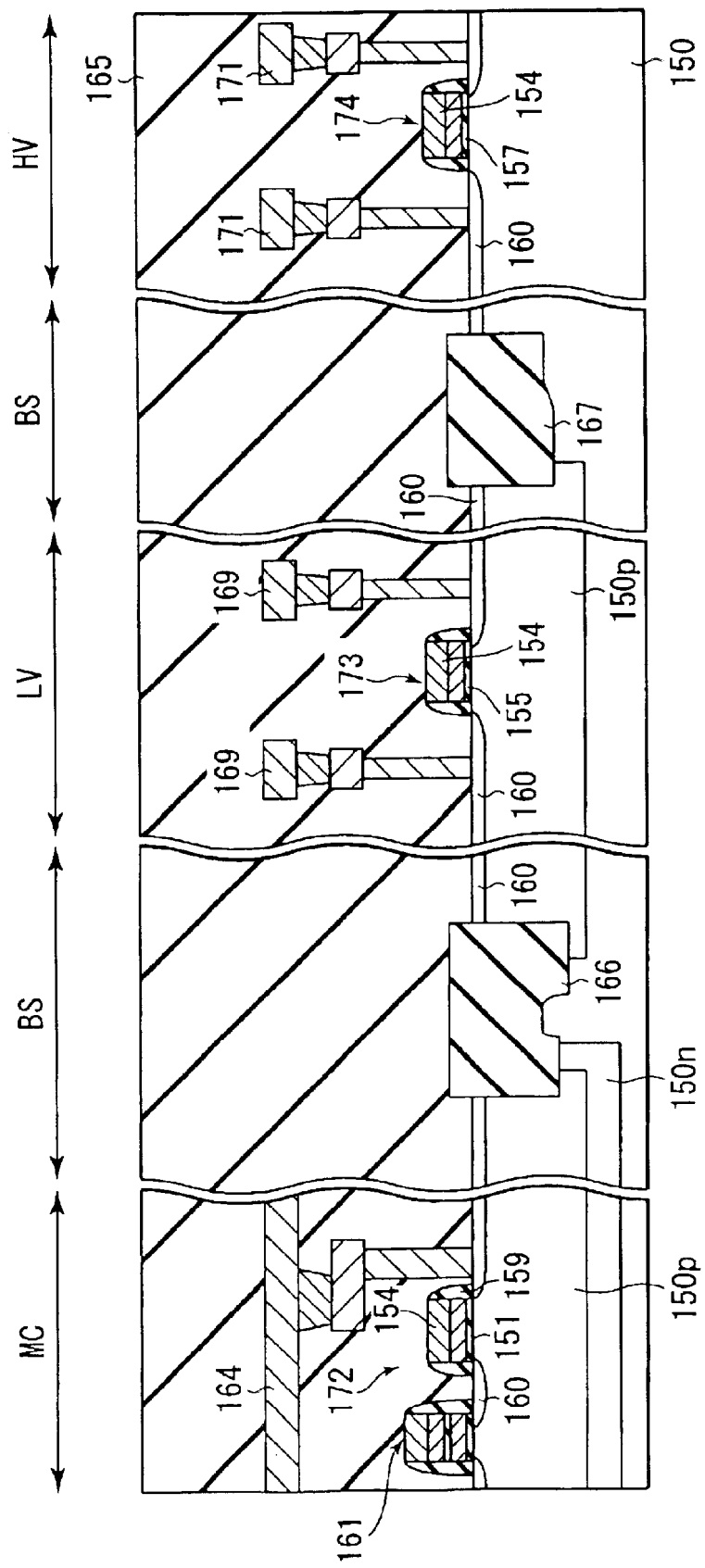
FIGS. 50 and 51 are sectional views showing boundary areas and their vicinities of semiconductor devices according to modifications of the fifth embodiment.
Figure 51:
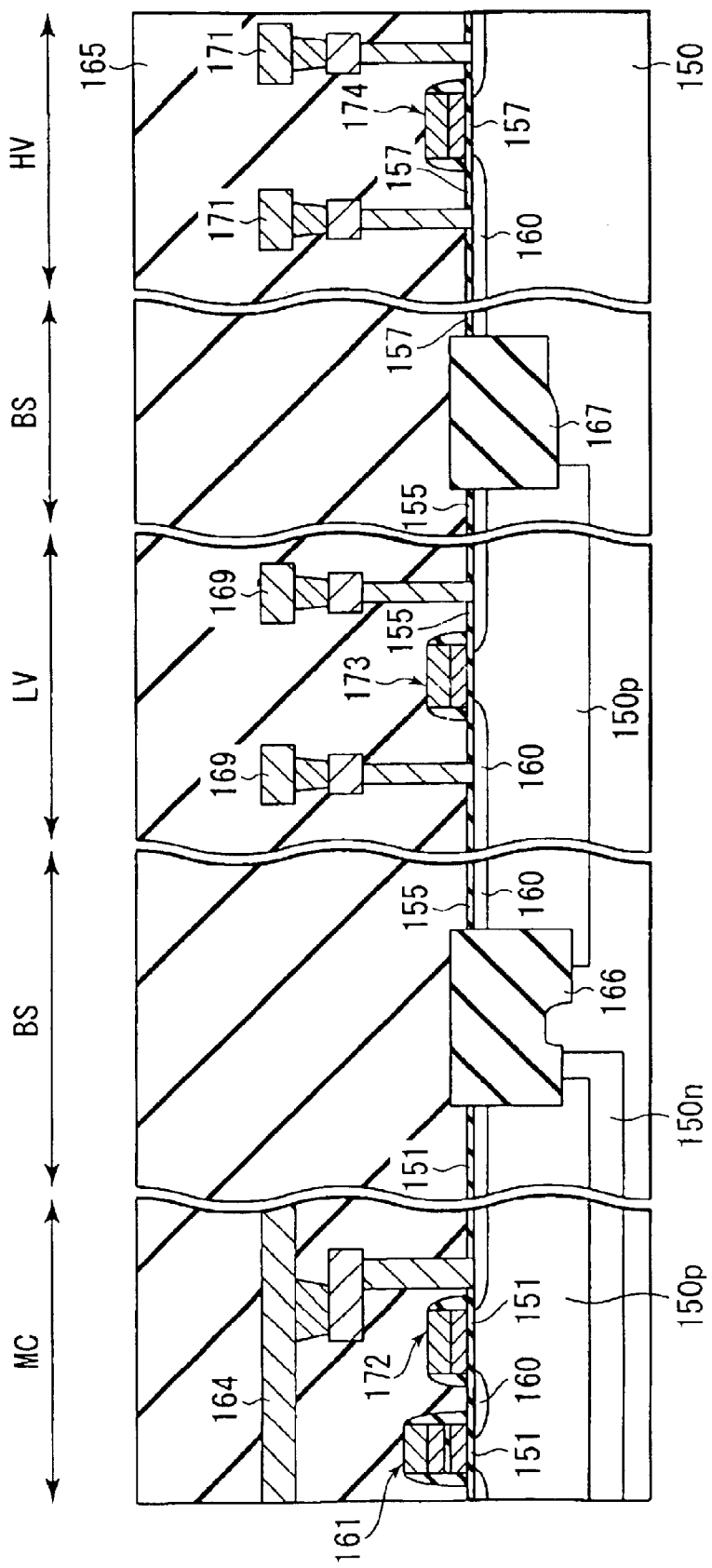

FIGS. 49 to 51 are sectional views showing boundary areas BS of separate formation and their vicinities according to this embodiment.

A floating gate type memory cell and an LV transistor are separately formed by the method according to the first to third embodiments, and a boundary area BS between them has the shape shown in FIG. 49, for example. However, as explained in the first to third embodiments, it is possible to arbitrarily combine the presence/absence of overlapping, the presence/absence of a device isolation trench, and the presence/absence of removal of the gate electrode in the boundary area BS.

In the semiconductor device having the sectional view shown in FIG. 49, a memory cell region MC, a low-voltage (LV) transistor region LV, a high-voltage (HV) transistor region HV, and boundary areas BS between them are formed on a p-semiconductor substrate 150, which contains boron at an impurity concentration of, e.g., $10^{14}$ to $10^{19}$ cm$^{-3}$. In this substrate 150, an n-well 150n and a p-well 150p are formed. When the p-well 150p is thus formed in the n-well 150n, a voltage can be applied to the p-well 150p independently of the p-semiconductor substrate 150. Consequently, it is possible to reduce the booster circuit load during erasure and reduce the power consumption.

In the memory cell region MC, a charge storage layer 152 is formed via a tunnel gate insulating film 151. This tunnel gate insulating film 151 is, e.g., a 3- to 15-nm thick silicon oxide film or oxynitride film. The charge storage layer 152 is made of, e.g., 10- to 500-nm thick polysilicon to which $10^{18}$ to $10^{21}$ cm$^{-3}$ of phosphorus or arsenic is added.

A device isolation insulating film 301 (see FIG. 53A) of, e.g., a silicon oxide film is formed to be self-aligned with the charge storage layer 152. For example, after the tunnel gate insulating film 151 and the charge storage layer 152 are deposited on the entire surface of the semiconductor substrate 150, patterning is performed to etch the semiconductor substrate 150 to a depth of 50 to 300 nm until the surface of this semiconductor substrate 150 is exposed, and an insulating film is buried. Since the tunnel gate insulating film 151 and the charge storage layer 152 can be formed on the entire flat surface having no steps, these films have improved uniformity and uniform characteristics.

On top of this charge storage layer 152, a control gate electrode 154 is formed via an inter-poly dielectric film 153. This inter-poly dielectric film 153 is, e.g., a 5- to 30-nm thick silicon oxide film, oxynitride film, or silicon oxide film/silicon nitride film/silicon oxide film. The gate electrode 154 has a thickness of, e.g., 10 to 500 nm, and is made of polysilicon doped with $10^{17}$ to $10^{21}$ cm$^{-3}$ of phosphorus, arsenic, or boron or has a stacked structure of WSi (tungsten silicide) and polysilicon, or a stacked structure of NiSi, MoSi, TiSi, or CoSi and polysilicon. A stacked structure of the tunnel gate insulating film 151, the charge storage layer 152, the inter-poly dielectric film 153, and the gate electrode 154 forms a memory cell gate 161 and a selector gate 162. A mask insulating film which is a silicon oxide film or silicon nitride film having a thickness of about 10 to 300 nm is formed on the control gate 154.

In the LV transistor region LV, an LV gate insulating film 155 is formed on the substrate 150, and an LV gate electrode 156 is formed on this LV gate insulating film 155. In the HV transistor region HV, an HV gate insulating film 157 is formed on the substrate 150, and an HV gate electrode 158 is formed on this HV gate insulating film 157. In each of the LV and HV transistor regions LV and HV, a terminal is disposed to apply an electric potential to a gate electrode in contact with the gate insulating film.

As shown in FIG. 49, on the two sides of these gate electrodes, a side-wall insulating film 159 which is, e.g., a 5- to 200-nm thick silicon nitride film or silicon oxide film is formed. Also, n-source/drain diffusion layers 160 are formed on the surface of the substrate 150. These source/drain diffusion layers 160 are formed to a depth of, e.g., 10 to 500 nm by using phosphorus, arsenic, or antimony such that the surface concentration is $10^{17}$ to $10^{21}$ cm$^{-3}$. Furthermore, these source/drain diffusion layers 160 are connected in series between memory cells to realize a NAND connection. The source/drain diffusion layers 160, the memory cell gate 161, and the selector gate 162 form a floating gate type EEPROM cell which uses a charge amount stored in the charge storage layer 152 as an information amount. The gate length is, e.g., 0.01 to 0.5 μm.

A source/drain diffusion layer 160 at one end of the selector gate 162 is connected to a data transfer line 164 via a contact plug 163. The data transfer line 164 is made of tungsten, tungsten silicide, titanium, titanium nitride, or aluminum. The contact plug 163 is filled with n- or p-doped polysilicon or tungsten, and tungsten, Al, TiN, or Ti, and functions as a conductor region.

The selector gate 162 forms a selection transistor. The gate length of the selector gate 162 is larger than that of the memory cell gate 161 and is, e.g., 0.02 to 1 μm. This ensures a high ON/OFF ratio between block selection and non-selection, and prevents write and read errors.

These elements are filled with an $SiO_2$ or SiN interlayer 165. On top of this interlayer 165, an insulating protective layer (not shown) made of, e.g., $SiO_2$, SiN, or polyimide and an upper interconnection (not shown) made of, e.g., W, Al, or Cu are formed.

Between the memory cell region MC and the LV transistor region LV, a first device isolation region 166 having the structure as shown in FIG. 1A is formed. Between the LV transistor region LV and the HV transistor region HV, a second device isolation region 167 having the structure as shown in FIG. 27B is formed.

Contact plugs 168 are connected to the source/drain diffusion layers 160 in the LV transistor region LV. These contact plugs 168 are connected to interconnections 169. Also, contact plugs 170 are connected to the source/drain diffusion layers 160 in the HV transistor region HV. These contact plugs 170 are connected to interconnections 171.

The selection transistor shown in FIG. 49 has the same stacked structure as the memory cell transistor. In this case, steps for separately forming these selection transistor and memory cell transistor can be omitted, so the fabrication cost is reduced. In addition, since no margin for separate formation need be formed, the distance between the selection transistor and the memory cell can be decreased. This can reduce the device area.

In the structure shown in FIG. 49, no gate insulating film is present on the substrate 150 on which no gate is formed.

FIG. 50 shows a modification of the structure shown in FIG. 49. This modification is the same as the structure shown in FIG. 49 except for the structures of the control gate in a memory cell region MC, the LV gate in an LV transistor region LV, and the HV gate in an HV transistor region HV.

In a control gate 172, the gate electrode 154 in the memory cell gate 161 is stacked on a semiconductor substrate 150 via a tunnel gate insulating film 153. A side-wall insulating film 159 is formed around this control gate 172. In an LV gate 173, the gate electrode 154 in the memory cell gate 161 is stacked on the semiconductor substrate 150 via an LV gate insulating film 155. A side-wall insulating film 159 is formed around this LV gate 173. In an HV gate 174, the gate electrode 154 in the memory cell gate 161 is stacked on the semiconductor substrate 150 via an HV gate insulating film 157. A side-wall insulating film 159 is formed around this HV gate 174. That is, although the transistor and selection transistor forming the peripheral circuit have the same stacked gates as the memory cell in FIG. 49, these stacked gates can also be single-layered gates as shown in FIG. 50.

FIG. 51 shows another modification of the structure shown in FIG. 49. This structure is the same as the structure shown in FIG. 50 except that a gate insulating film in each transistor region covers an exposed surface of a semiconductor substrate 150 in that region. That is, in FIGS. 49 and 50, no gate insulating film exists in a region in which the gate electrode is etched. As shown in FIG. 51, however, a gate insulating film may also be left behind on the entire surface of the semiconductor substrate 150.

As the structure of a boundary area BS between a memory cell region MC and an LV transistor region LV shown in FIG. 49, structures shown in FIGS. 52A to 52H can be used. These structures can also be applied to a boundary area BS between the memory cell region MC and an HV transistor region HV by switching an LV gate insulating film and an HV gate insulating film.

The individual boundary structures of separate formation may be the same structure or may be different structures in different places. Each boundary area BS can have a structure in which no diffusion layers 160 are formed.

Figure 52A:
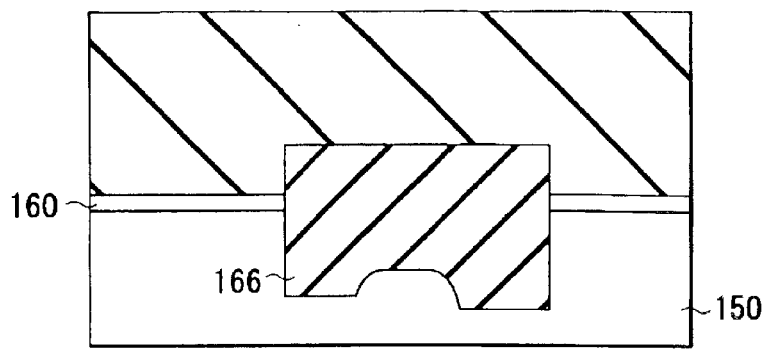
FIGS. 52A to 52H are sectional views showing structures usable as a boundary area between a memory cell region and an LV transistor region in the device shown in FIG. 51.

In the boundary area BS shown in FIG. 52A, a device isolation region 166 similar to the structure shown in FIG. 1A is formed in a substrate 150. On the two sides of this device isolation region 166, source/drain diffusion layers 160 are formed in the substrate 150. Steps including a projection projecting upward are formed on the bottom of the trench of the device isolation region 166. By using the structure of this boundary area BS, it is possible to improve the STI filling properties, prevent dishing, and reduce the area.

Figure 52B:
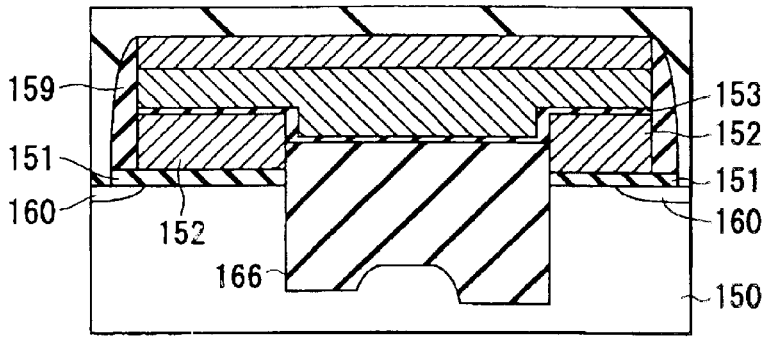

In the boundary area BS shown in FIG. 52B, a gate structure is formed by covering the device isolation region 166 in the structure shown in FIG. 52A. This gate structure has the same structure as the selector gate 162 on the tunnel gate insulating film 151 and the LV gate insulating film 155 in the boundary area BS. On the device isolation region 166, the same structure as the selector gate 162 except for the charge storage layer 152 is formed. By using the structure of this boundary area BS, it is possible to improve the STI filling properties, prevent dishing, and facilitate gate processing.

Figure 52C:
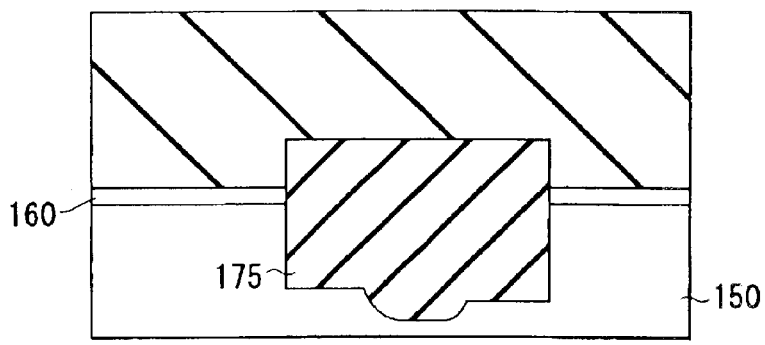

In the boundary area BS shown in FIG. 52C, a device isolation region 175 similar to the structure shown in FIG. 14A is formed in place of the device isolation region 166 shown in FIG. 52A. By the use of the structure of this boundary area BS, it is possible to improve the STI breakdown voltage and reduce the area.

Figure 52D:
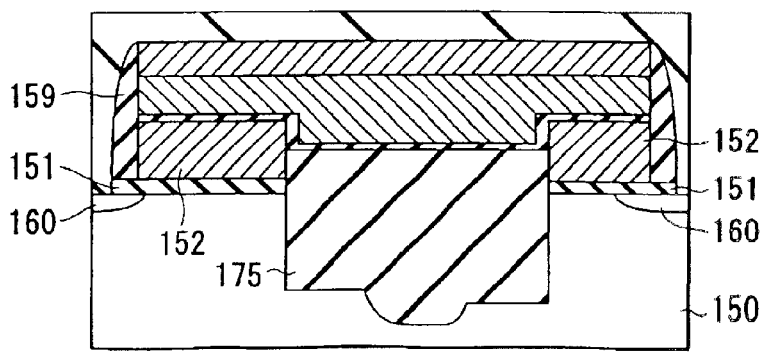

In the boundary area BS shown in FIG. 52D, a device isolation region 166 is formed in place of the device isolation region 175 shown in FIG. 52C in the structure shown in FIG. 52B. By the use of the structure of this boundary area BS, it is possible to improve the STI breakdown voltage and facilitate gate processing.

Figure 52E:
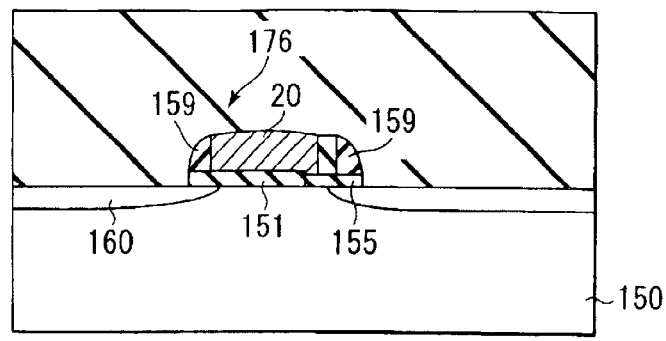

In the boundary area BS shown in FIG. 52E, a structure analogous to the structure shown in FIG. 2A is formed. On a substrate 150 in the center of this boundary area BS, a gate structure 176 is formed by the constituent materials of the gate structures in a memory cell region MC and an LV transistor region LV. On the substrate 150 in this gate structure 176, a tunnel insulating film 151 is formed on the side of the memory cell region MC, and an LV gate insulating film 155 is formed on the side of the LV transistor region LV. An electrode layer 20, a side-wall insulating film 159, and the like are formed on the tunnel insulating film 151 and the insulating film 155. On the two sides of the gate structure 176, source/drain diffusion layers 160 are formed in the substrate 150. By using the structure of this boundary area BS, it is possible to facilitate gate processing and avoid defects caused by STI.

Figure 52F:
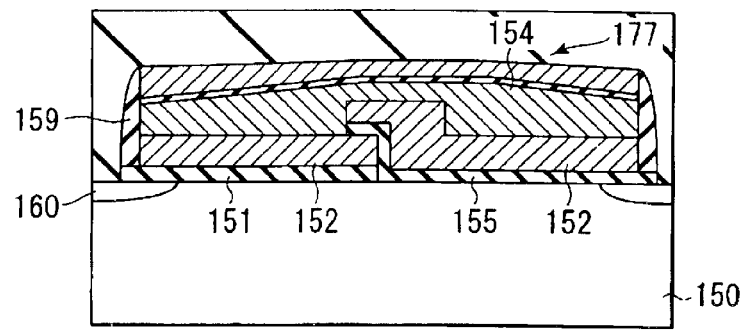

The boundary area BS shown in FIG. 52F has a structure similar to that shown in FIG. 2B. On a substrate 150 in the center of this boundary area BS, a gate structure 177 is formed by the constituent materials of gate structures in a memory cell region MC and an LV transistor region LV. On the substrate 150 in this gate structure 177, a tunnel insulating film 151 is formed on the side of the memory cell region MC, and an LV gate insulating film 155 is formed on the side of the LV transistor region LV. On the tunnel insulating film 151, the same stacked gate structure as the control gate 162 is formed. On the LV gate insulating film 155, a lower structure of the LV gate 156 is formed. An insulating film 159 is formed on the side surfaces of this gate structure 177. By the use of the structure of this boundary area BS, it is possible to reduce dust and avoid defects caused by STI.

Figure 52G:
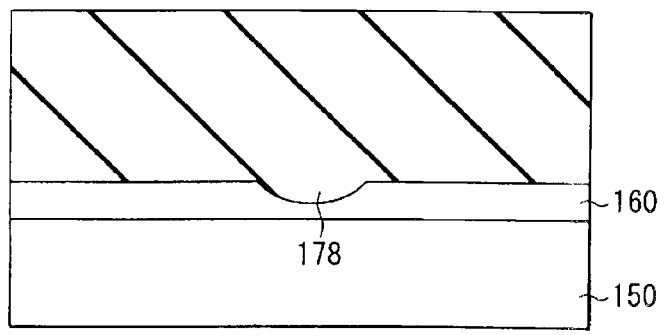

The boundary area BS shown in FIG. 52G has a structure similar to that shown in FIG. 15A. A recess 178 is formed in the surface of a substrate 150 in the center of this boundary area BS. By the use of the structure of this boundary area BS, it is possible to reduce dust and avoid defects caused by STI.

Figure 52H:
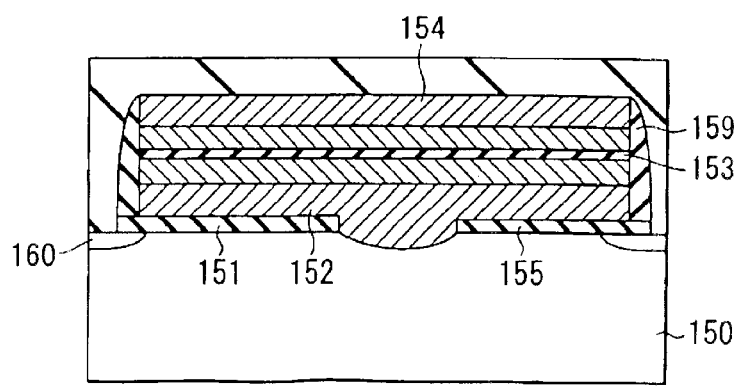

The boundary area BS shown in FIG. 52H has the same structure as the gate structure 162 shown in FIG. 15B. Although a recess is formed in the surface of a semiconductor substrate 150 at the center of the boundary area, the center can be flat as shown in FIG. 15B. In this gate structure, an electrode layer is in direct contact with the surface of a substrate 150 without any insulating film between them. By using the structure of this boundary area BS, it is possible to facilitate gate processing, reduce dust, avoid defects caused by STI, and match the aspect ratios.

Figure 53A:
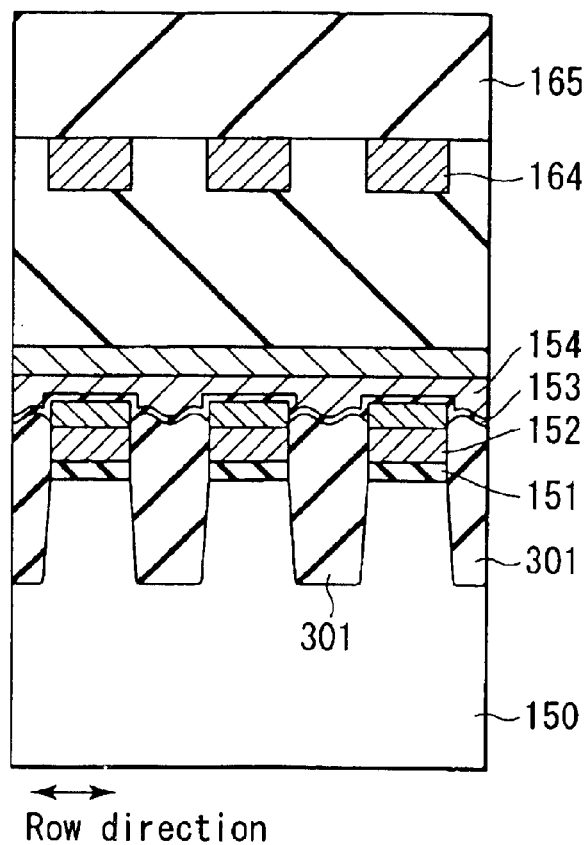
FIGS. 53A and 53B are sectional views showing a memory cell region and a peripheral transistor region, respectively, of a NAND floating gate type semiconductor device of the fifth embodiment.
Figure 53B:
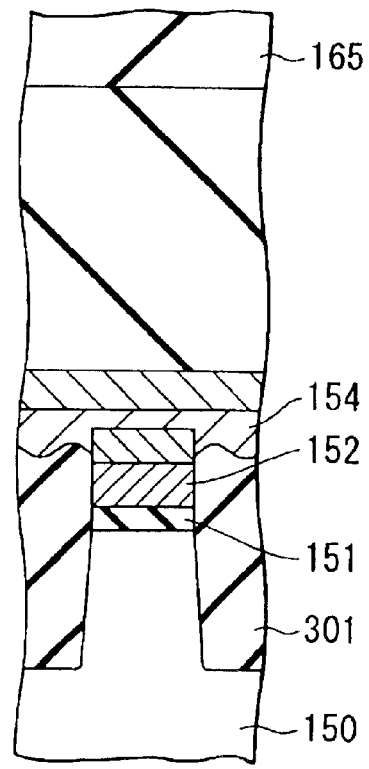

FIG. 53A shows a sectional view, on the gate of the memory cell, taken along a direction perpendicular to the data transfer line. FIG. 53B shows a sectional view, on the gate of the peripheral transistor, taken along a direction perpendicular to the data transfer line.

As shown in FIGS. 53A and 53B, the side surfaces of the substrate 150 and gate insulating films are covered with device isolation regions 301. Therefore, it is possible to prevent the gate electrode 154 from coming lower than the surface of the substrate 150, while the ends of the device isolation region are not exposed by etching before the formation of the gate insulating film 103, in both the memory cell and the peripheral transistor. This makes electric filed concentration or a parasitic transistor having a decreased threshold value difficult to form in the boundary between the device isolation region 301 the tunnel gate insulating film 151. In addition, a sidewalk phenomenon which is a lowering of the write threshold value resulting from a bird beak does not easily occur. Accordingly, a highly reliable transistor can be formed.

An example of a method of fabricating the nonvolatile semiconductor memory of this embodiment shown in FIG. 49 will be explained below with reference to FIGS. 54A to 57C. First, a sacrificial oxide film (not shown) is formed on the surface of a semiconductor substrate 150. After a well impurity and a channel impurity are implanted as needed, this sacrificial oxide film is removed.

Figure 54A:
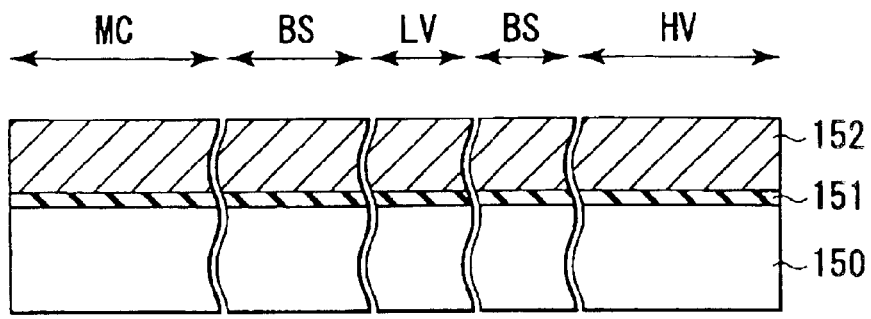
FIGS. 54A to 54C, 55A to 55C, 56A to 56C, and 57A to 57C are sectional views showing a method of fabricating the structure shown in FIG. 49.

Subsequently, as shown in FIG. 54A, a 3- to 15-nm thick tunnel gate insulating film 151 such as a silicon oxide film or oxynitride film is formed. Then, a 10- to 500-nm thick charge storage layer 152 made of, e.g., polysilicon is formed.

Figure 54B:
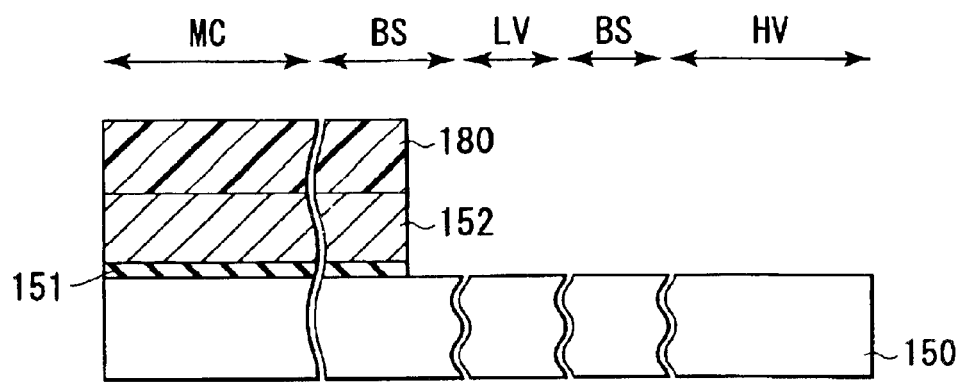
Figure 54C:
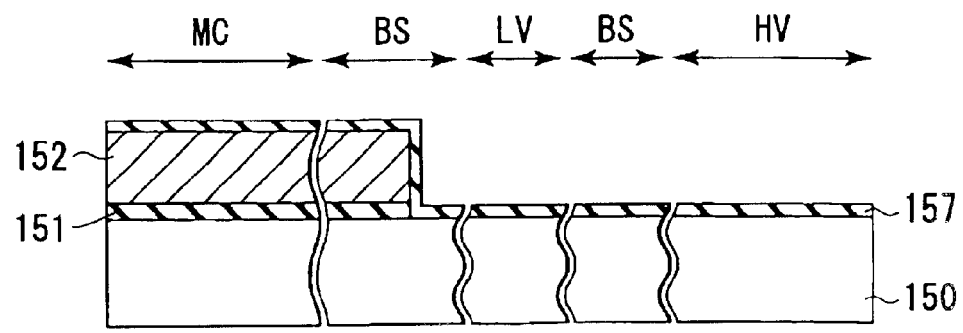

As shown in FIG. 54B, a region to be a memory cell region MC is covered with a photoresist layer 180, and the gate electrode and the gate insulating film in other regions are removed. The method of removal can be either isotropic etching such as wet etching or anisotropic etching such as RIE. Next, as shown in FIG. 54C, a 5- to 50-nm thick HV-transistor gate insulating film 157 such as a silicon oxide film or oxynitride film is formed on the entire surface of the semiconductor substrate 150.

Figure 55A:
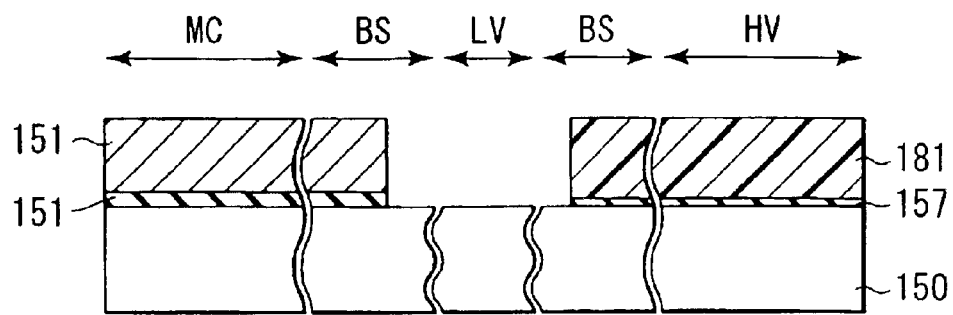
Figure 55B:
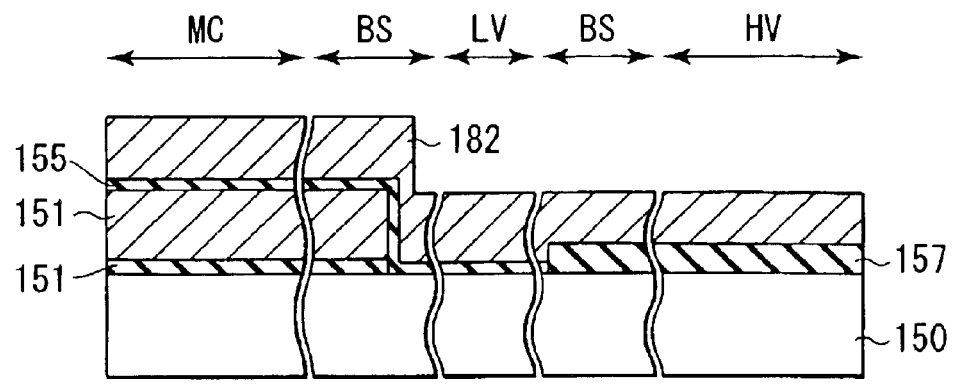

As shown in FIG. 55A, an HV transistor region HV is covered with a photoresist layer 181, and the gate insulating film of this HV transistor region HV is removed from other regions. As shown in FIG. 55B, a 1- to 10-nm thick LV gate insulating film 155 such as a silicon oxide film or oxynitride film is formed on the entire surface of the semiconductor substrate 150. 10- to 500-nm thick polysilicon is deposited on this gate insulating film 155.

In this state, the memory cell region MC has a stacked structure in which the LV-transistor gate insulating film 155 and a first gate electrode 182 are stacked on the gate electrode of the memory cell. Also, the film thickness of the HV-transistor gate insulating film 157 formed in advance increases. The gate electrodes of the memory cell and the LV transistor can be different in material and film thickness. However, if the materials and film thicknesses of these gate electrodes are the same, the gate electrodes are readily etched at the same time.

Figure 55C:
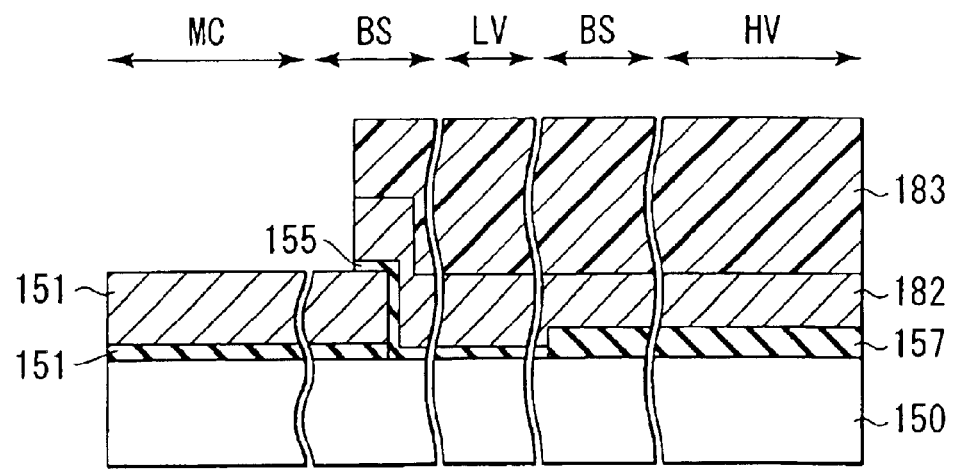

Next, as shown in FIG. 55C, the LV and HV transistor regions (peripheral circuit regions) are covered with a photoresist layer 183, and the gate electrode and the gate insulating film in other regions are removed. The method of removal can be either isotropic etching such as wet etching or anisotropic etching such as RIE. Etching is so performed that a portion of the photoresist layer 183 reaches the memory cell region MC. Accordingly, the gate electrode stacked structure remains as it is in a boundary area BS of separate formation between the memory cell region MC and the peripheral circuit region.

Figure 56A:
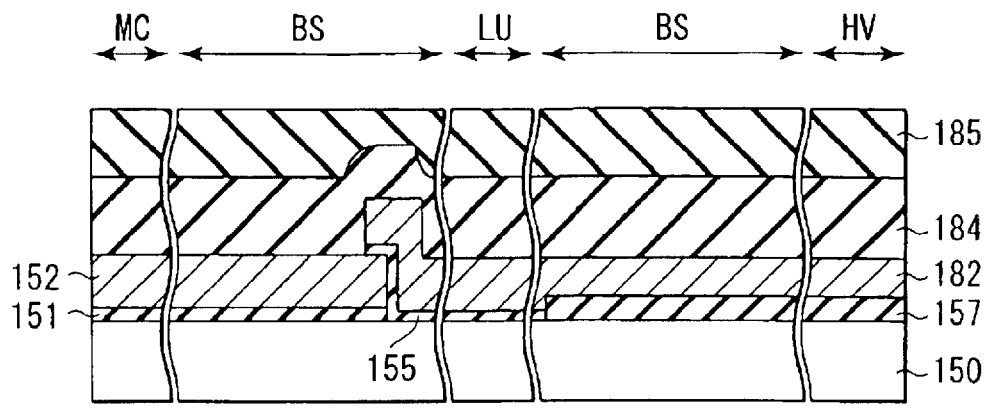
Figure 56B:
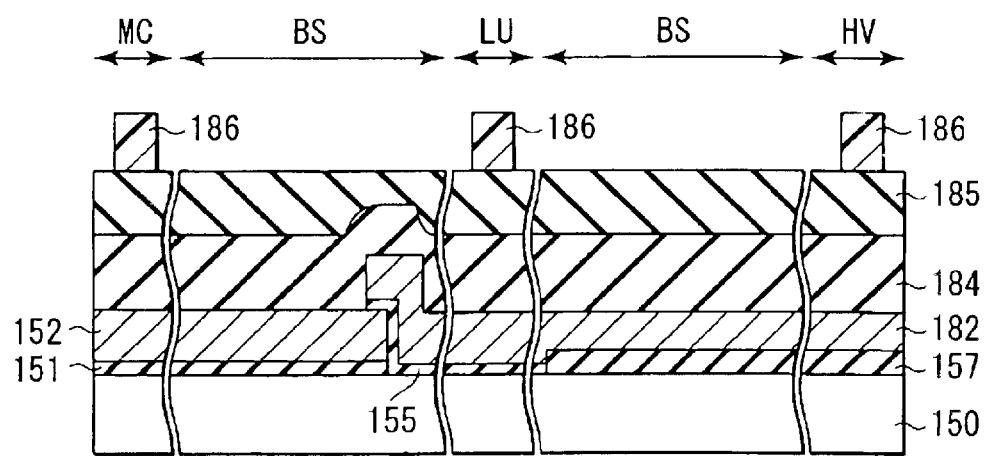

Subsequently, as shown in FIG. 56A, the photoresist layer 183 is removed, and first and second mask layers 184 and 185 are deposited. The first mask layer 184 is, e.g., a silicon nitride film, and the second mask layer 185 is, e.g., a silicon oxide film. As shown in FIG. 56B, a photoresist mask 186 for forming device isolation regions is deposited, and device isolation patterns are formed. In the following description, a method of forming device isolation regions in the boundary areas BS of separate formation without leaving resists in those portions will be explained.

Next, the photoresist mask 186 and the second mask layer 185 are removed by anisotropic etching, and then the first gate electrodes 152 and 182 are removed by anisotropic etching. Subsequently, to form device isolation regions, the semiconductor substrate 150 is etched to form first and second device isolation trenches. The depth of these device isolation trenches is, e.g., about 50 to 300 nm.

In the boundary area BS of separate formation, the step shown in FIG. 56B forms an upward projection on the bottom of the device isolation region. Although the height of this projection depends upon the step shown in FIG. 56B and the etching conditions, this height is about 10 to 300 nm, and desirably, about 30 to 100 nm. The depth of the device isolation trench also depends upon a region in contact with the trench. This depth reflects the differences between the tunnel insulating film thickness in the memory cell region MC, the gate insulating film thickness in the LV transistor region LV, and the gate insulating film thickness in the HV transistor region HV; the thinner the gate insulating film, the deeper the device isolation trench.

Figure 56C:
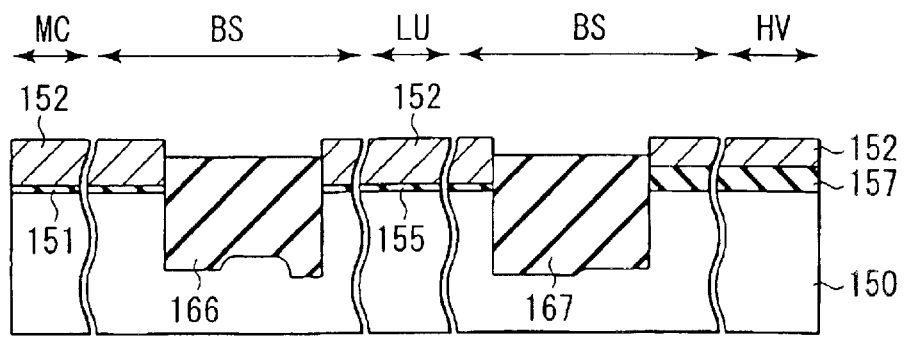

The device isolation trenches are filled with an insulating film such as a silicon oxide film, and this buried material is etched back by a method such as CMP by using the first mask layer 184 as a stopper. Since the device isolation regions in the boundary areas BS are shallow, the filling properties are excellent. After etch back, therefore, the upper portions of the device isolation insulating films are almost flat. The first mask layer 184 is removed, and the first gate electrode 182 in the LV transistor region LV and the HV transistor region HV is given the same film thickness as the charge storage layer 152. After that, the insulating films buried in the device isolation trenches are etched back. The structure at this time is shown in FIG. 56C.

Figure 57A:
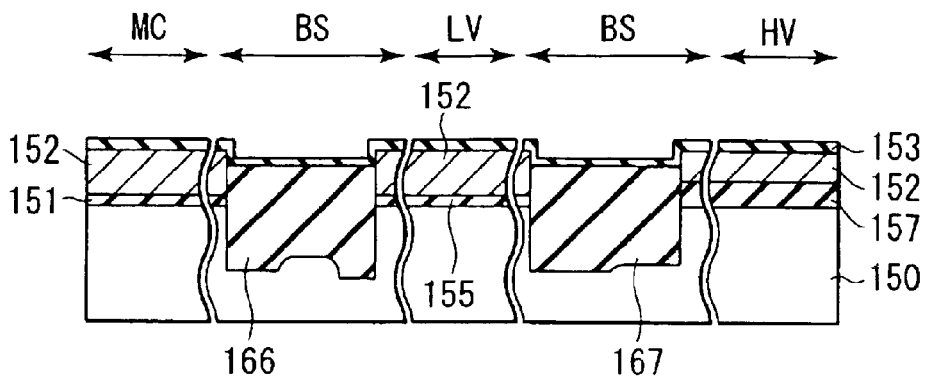
Figure 57B:
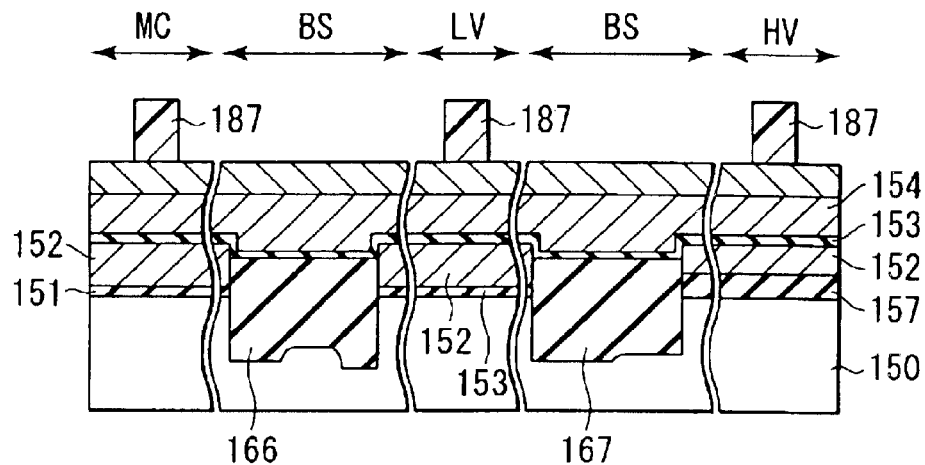

Next, as shown in FIG. 57A, a 5- to 30-nm thick inter-poly-insulting film 153 which is a silicon oxide film, oxynitride film, or silicon oxide film/silicon nitride film/silicon oxide film is formed. As shown in FIG. 57B, a gate electrode 154 is deposited on the entire surface of the semiconductor substrate 150. This gate electrode 154 is a polysilicon film, a stacked film of polysilicon and a metal or a silicon and metal compound, or a single-layered film of a metal or a silicon and metal compound. Subsequently, a mask insulating film which is a silicon oxide film or silicon nitride film having a thickness of about 10 to 300 nm is deposited. A photoresist layer 187 for processing the gate electrodes is then deposited and patterned. This photoresist layer 187 is used as a mask to anisotropically etch the gate electrodes. After that, damage by the processing is recovered by post-oxidation or the like.

Figure 57C:
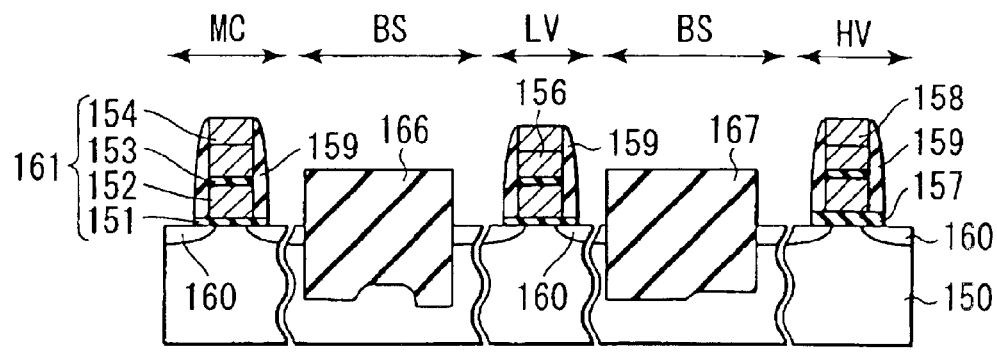

As shown in FIG. 57C, a gate side-wall insulating film 159 is formed as needed, and a diffusion layer impurity is implanted to form source/drain diffusion layers 160. In this case, no resist is left behind in the boundary areas BS, and the gate electrodes are removed from these boundary areas BS. After that, although not shown, interlayer dielectric films, contact plugs, interconnections, and the like are formed to complete the semiconductor device as shown in FIG. 47.

In the fabrication method of this embodiment, the effects of the first to third embodiments and the fabrication method according to the fourth embodiment can be similarly obtained in addition to the effects unique to MONOS.

(Sixth Embodiment)

Figure 58:
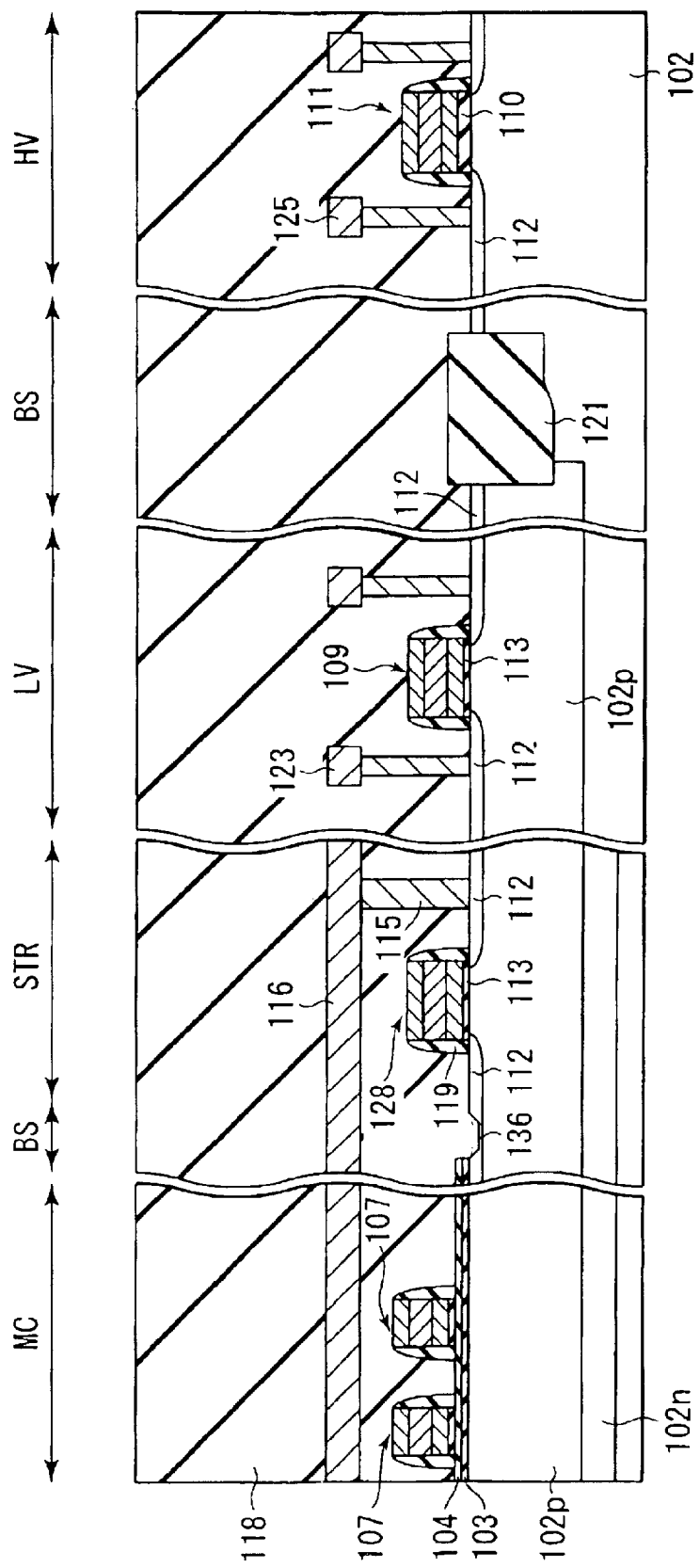
FIG. 58 is a sectional view showing boundary areas and their vicinities of a semiconductor device according to the sixth embodiment of the present invention.

This embodiment is applied to an AND EEPROM having a MONOS memory cell structure, as indicated by the sectional structure of a boundary area BS and its vicinity shown in FIG. 58. FIG. 58 is still another modification of the structure shown in FIG. 35. In this modification, the boundary area BS is formed between a memory cell region MC and a selection transistor region STR for a memory cell. In this boundary area BS, a recess 136 is formed in the surface of a substrate 102, as in the structures shown in FIGS. 40G and 15A. A tunnel gate insulating film 103 and a charge storage layer 104 are formed on the substrate 102 from the recess 136 toward the memory cell region MC. A gate insulating film of a selection transistor 128 can be desirably in common with an LV gate insulating film 113 to simplify the fabrication process. An equivalent circuit of a memory block is as shown in FIG. 43 or 44. The structure of the boundary area BS can be any of FIGS. 40A to 40H. That is, a preferred form can be selected from the viewpoints of the number of steps and the ease of processing.

Figure 59A:
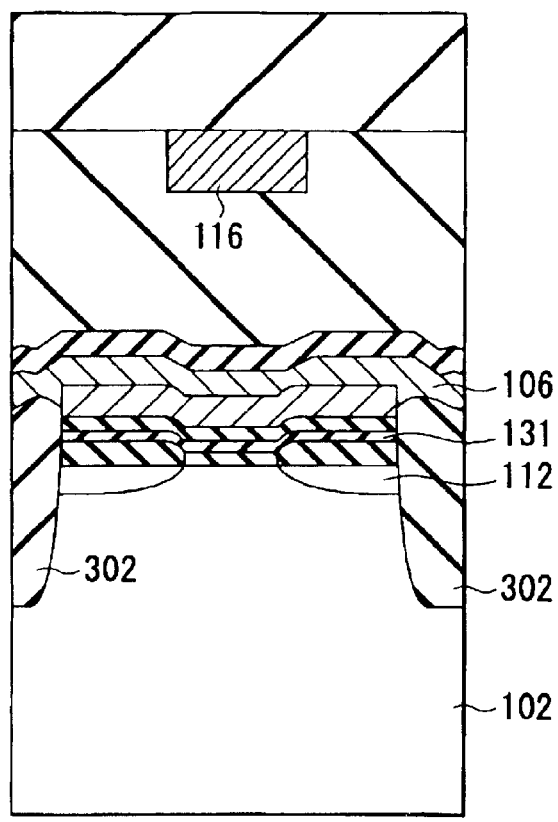
FIGS. 59A and 59B are sectional views showing a memory cell region and a peripheral transistor region, respectively, of an AND MONOS semiconductor device of the sixth embodiment.
Figure 59B:
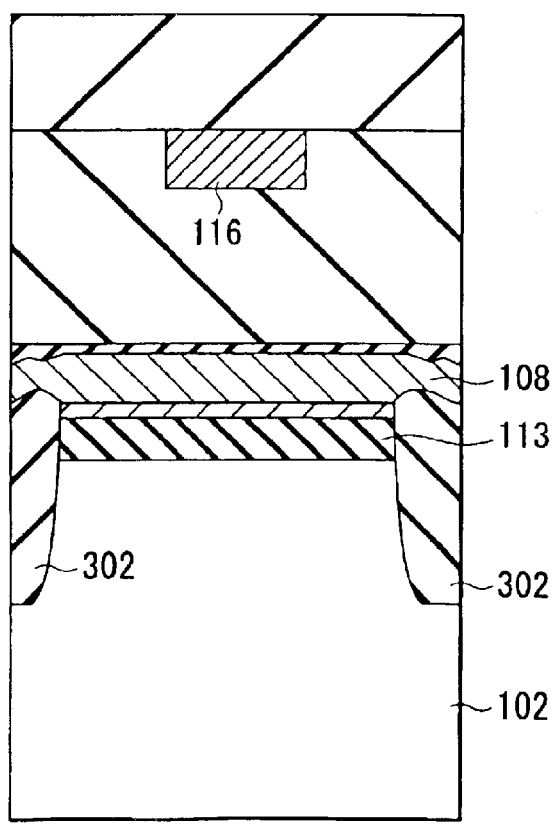
Figure 60A:
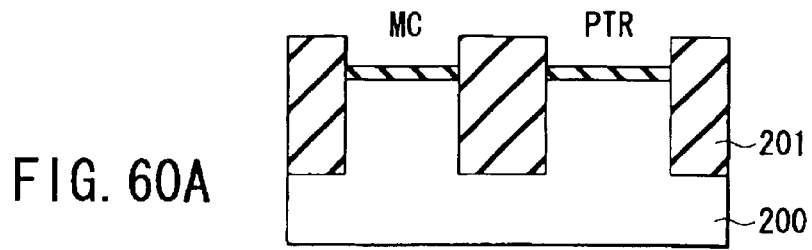
FIGS. 60A to 60D are sectional views showing a conventional trench device isolation method.
Figure 60B:
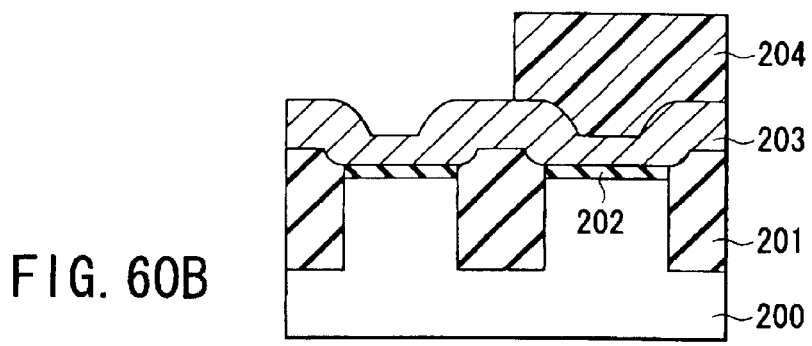
Figure 60C:
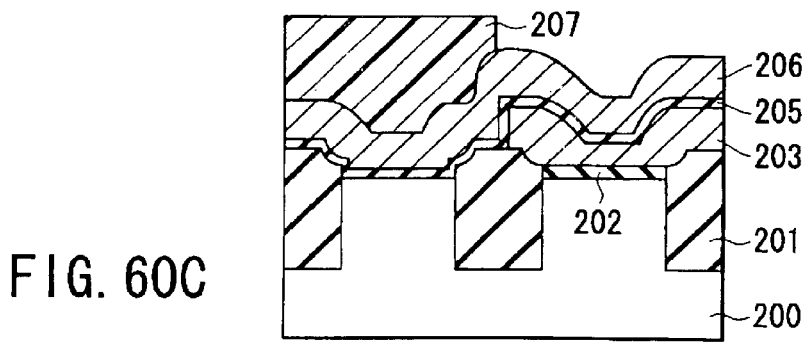
Figure 60D:
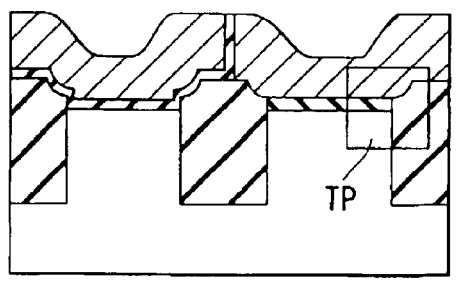
Figure 60E:
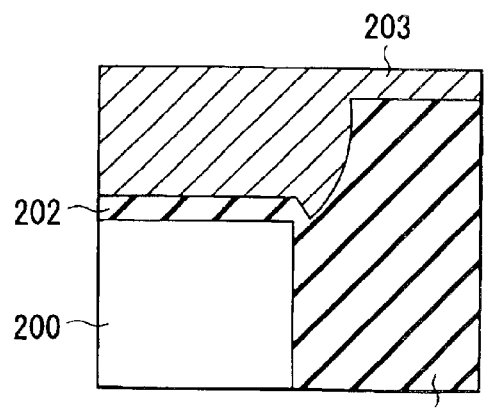
FIG. 60E is a sectional view showing a region TP in FIG. 60D in an enlarged scale.

FIG. 59A shows a sectional view, on the gate of the memory cell, taken along a direction perpendicular to the data transfer line. FIG. 59B shows a sectional view, on the gate of the selection transistor, taken along a direction perpendicular to the data transfer line.

As shown in FIGS. 59A and 59B, the side surfaces of the substrate 102 are covered with device isolation regions 302. Therefore, it is possible to prevent the gate electrodes 106 and 108 from coming lower than the surface of the substrate 102, while the ends of the device isolation region are not exposed by etching before the formation of the ONO film 131, in both the memory cell and the peripheral transistor. This makes gate concentration or a parasitic transistor having a decreased threshold value difficult to form in the boundary between the substrate 102 and the ONO film 131. In addition, a sidewalk phenomenon which is a lowering of the write threshold value resulting from a bird beak does not easily occur. Accordingly, a highly reliable transistor can be formed.

Since the selection transistor is a MOS transistor, the threshold value does not fluctuate owing to the voltage stress for operation. This realizes a highly reliable nonvolatile memory. This embodiment can also achieve the same effects as in the first to third embodiments and the fourth embodiment.

In each of the above embodiments, a memory cell transistor is formed before a peripheral circuit transistor. However, the order of separate formation is not limited to this one, so a peripheral circuit transistor can be formed first. Also, in the fourth to sixth embodiments, a memory cell region MC and an LV transistor region LV, and an HV transistor region HV and the LV transistor region are adjacent to each other via boundary areas. However, the arrangement of these adjacent regions is not restricted to these. For example, the memory cell region MC and the HV transistor region HV can be adjacent to each other via a boundary area.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a semiconductor substrate having a major surface including first and second regions and a boundary area formed between the first and second regions in contact therewith;
   a first gate insulating film formed on the major surface in the first region;
   a first gate electrode formed on the first gate insulating film;
   a pair of first diffusion layers formed in the major surface to sandwich the first gate electrode;
   a second gate insulating film formed on the major surface in the second region, the second gate insulating film having a film material or a film thickness different from that of the first gate insulating film;
   a second gate electrode formed on the second gate insulating film;
   a pair of second diffusion layers formed in the major surface to sandwich the second gate electrode; and
   a device isolation region formed in the boundary area, the device isolation region including a trench formed in the major surface and an insulating layer having a portion buried in the trench and a portion projecting upward from the major surface, and a bottom of the trench having depths different with portions,
   wherein said first and second gate insulating films each have a film thickness difference of 5 to 50 nm, and the bottom of the trench has a height difference of 5 to 50 nm between end portions on sides of the first and second regions.

2. A device according to claim 1, wherein the bottom of the trench has an upward projection, a length of the projection in the direction connecting the first and second regions is 100 to 10,000 nm, and a height of the projection from a deep portion of the bottom is 10 to 300 nm.

3. A device according to claim 1, wherein the bottom of the trench has a downward projection, a length of the projection in the direction connecting the first and second regions is 100 to 10,000 nm, and a height of the projection from a shallow portion of the bottom is 10 to 200 nm.

4. A device according to claim 1, further comprising a pair of third diffusion layers formed in the major surface to sandwich the device isolation region, the third diffusion layer on the side of the first region being formed in common with the first diffusion layer, and the third diffusion layer on the side of the second region being formed in common with the second diffusion layer.

5. A device according to claim 1, further comprising a gate structure formed to cover the device isolation region, the gate structure including, at an end portion on the side of the first region, a stacked structure having the same construction and height as a stacked structure of the first gate insulating film and the first gate electrode, and including, at an end portion on the side of the second region, a stacked structure having the same construction and height as a stacked structure of the second gate insulating film and the second gate electrode.

6. A device according to claim 1, wherein the first gate electrode comprises a first lower electrode layer and a first upper electrode layer, the second gate electrode comprises a second lower electrode layer and a second upper electrode layer, the first and second lower electrode layers derive from different conductive films, and the first and second upper electrode layers derive from a common conductive film.

7. A device according to claim 1, wherein the first gate electrode is a gate electrode of a nonvolatile memory cell transistor having a charge storage layer, and the second gate electrode is a gate electrode of a peripheral transistor.

8. A semiconductor device comprising:
- a semiconductor substrate having a major surface including first and second regions and a boundary area formed between the first and second regions in contact therewith;
- a first gate insulating film formed on the major surface in the first region;
- a first gate electrode formed on the first gate insulating film, the first gate electrode comprising a first lower electrode layer and a first upper electrode layer;
- a pair of first diffusion layers formed in the major surface to sandwich the first gate electrode; a second gate insulating film formed on the major surface in the second region, the second gate insulating film having a film material or a film thickness different from that of the first gate insulating film;
- a second gate electrode formed on the second gate insulating film, the second gate electrode comprising a second lower electrode layer and a second upper electrode layer, the first and second lower electrode layers deriving from different conductive films, and the first and second upper electrode layers deriving from a common conductive film;
- a pair of second diffusion layers formed in the major surface to sandwich the second gate electrode; and
- a gate structure formed on the major surface in the boundary area, the gate structure comprising first and second insulating films deriving from insulating films in common with the first and second gate insulating films, respectively, and a first lower conductive layer deriving from a conductive film in common with the first lower electrode layer and formed on the first insulating film.

9. A device according to claim 8, wherein in the gate structure, the first and second insulating films do not expose but cover the major surface.

10. A device according to claim 9, wherein the first lower conductive layer of the gate structure disposed in the boundary area is thinner than the first lower electrode layer disposed in the first region.

11. A device according to claim 8, wherein the gate structure further comprises a second lower conductive layer deriving from a conductive film in common with the second lower electrode layer and formed on the second insulating film, and an upper conductive layer deriving from a conductive film in common with the first and second upper electrode layers and formed on the first and second lower electrode layers.

12. A device according to claim 11, wherein in the gate structure, end portions of the second insulating film and the second lower conductive layer are stacked on an upper surface of an end portion of the first lower conductive layer.

13. A device according to claim 11, wherein in the gate structure, a gap is formed between the first and second insulating films, and the upper conductive layer is in contact with the substrate in a gap.

14. A device according to claim 8, further comprising a pair of third diffusion layers formed in the major surface to sandwich the gate structure, the third diffusion layer on the side of the first region being formed in common with the first diffusion layer, and the third diffusion layer on the side of the second region being formed in common with the second diffusion layer.

15. A device according to claim 8, wherein the first gate electrode is a gate electrode of a nonvolatile memory having a charge storage layer, and the second gate electrode is a gate electrode of a peripheral transistor.

16. A semiconductor device comprising:
- a semiconductor substrate having a major surface including first and second regions and a boundary area formed between the first and second regions in contact therewith;
- a first gate insulating film formed on the major surface in the first region;
- a first gate electrode formed on the first gate insulating film, the first gate electrode comprising a first lower electrode layer and a first upper electrode layer;
- a pair of first diffusion layers formed in the major surface to sandwich the first gate electrode; a second gate insulating film formed on the major surface in the second region, the second gate insulating film having a film material or a film thickness different from that of the first gate insulating film;
- a second gate electrode formed on the second gate insulating film, the second gate electrode comprising a second lower electrode layer and a second upper electrode layer, the first and second electrode layers deriving from different conductive films, and the first and second upper electrode layers deriving from a common conductive film;
- a pair of second diffusion layers formed in the major surface to sandwich the second gate electrode;
- first and second insulating films formed on the major surface in the boundary area and deriving from insulating films in common with the first and second gate insulating films, a gap being formed between the first and second insulating films in the boundary area; and
- a recess formed in the major surface and corresponding to the gap.

* * * * *